United States Patent
Cho et al.

(10) Patent No.: US 12,389,792 B2
(45) Date of Patent: Aug. 12, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Sooryun Cho, Yongin-si (KR); Jihye Kim, Yongin-si (KR); Hoilim Kim, Yongin-si (KR); Saerom Park, Yongin-si (KR); Yongsub Shim, Yongin-si (KR); Dongsun Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 17/933,748

(22) Filed: Sep. 20, 2022

(65) Prior Publication Data

US 2023/0225198 A1    Jul. 13, 2023

(30) Foreign Application Priority Data

Jan. 10, 2022    (KR) .................. 10-2022-0003633

(51) Int. Cl.
*H10K 85/60*    (2023.01)
*C09K 11/06*    (2006.01)
(Continued)

(52) U.S. Cl.
CPC ............ *H10K 85/636* (2023.02); *C09K 11/06* (2013.01); *H10K 50/844* (2023.02);
(Continued)

(58) Field of Classification Search
None
See application file for complete search history.

(56) References Cited

U.S. PATENT DOCUMENTS

| 10,144,867 B2 | 12/2018 | Ma et al. |
| 10,862,054 B2 | 12/2020 | Ji et al. |

(Continued)

FOREIGN PATENT DOCUMENTS

| EP | 3 929 193 A1 | 12/2021 |
| KR | 10-2046983 B1 | 11/2019 |

(Continued)

OTHER PUBLICATIONS

Wang, Bin et al.; "Strongly phosphorescent platinum(ii) complexes supported by tetradentate benzazole-containing ligands", Journal of Materials Chemistry C, vol. 3, No. 31, Jan. 1, 2015 (Jan. 1, 2015), pp. 8212-8218, XP055540969.

(Continued)

*Primary Examiner* — Jack S Chen
(74) *Attorney, Agent, or Firm* — Womble Bond Dickinson (US) LLP

(57) ABSTRACT

Provided is a light-emitting device and an electronic apparatus including the same. The light-emitting device includes: a first electrode; a second electrode facing the first electrode; an interlayer between the first electrode and the second electrode and including an emission layer; and a capping layer, wherein the emission layer includes a first emitter, the first emitter emits a first light having a first emission spectrum, the capping layer is in a path along which the first light travels, an emission peak wavelength of the first light is about 520 nm to about 550 nm, the first emitter includes platinum, the capping layer includes an amine-containing compound, and a value of a ratio of CIEy to reflective index (RCR value) of the first light extracted to the outside through the capping layer is 38 or less, and the RCR value is calculated according to Equation 1.

$$\text{CIE}y/R(\text{cap}) \times 100 \qquad \text{Equation 1}$$

20 Claims, 3 Drawing Sheets

10

| 170 |
|---|
| 150 |
| 130 |
| 110 |

(51) Int. Cl.
  H10K 50/844 (2023.01)
  H10K 50/858 (2023.01)
  H10K 85/30 (2023.01)
  H10K 50/125 (2023.01)
  H10K 59/12 (2023.01)

(52) U.S. Cl.
  CPC ......... H10K 50/858 (2023.02); H10K 85/346 (2023.02); *C09K 2211/1029* (2013.01); *C09K 2211/1044* (2013.01); *C09K 2211/185* (2013.01); *H10K 50/125* (2023.02); *H10K 59/12* (2023.02); *H10K 85/654* (2023.02); *H10K 85/657* (2023.02)

(56) References Cited

U.S. PATENT DOCUMENTS

| | | |
|---|---|---|
| 10,937,973 B2 | 3/2021 | Lee et al. |
| 12,048,238 B2 | 7/2024 | Shin et al. |
| 2021/0078989 A1 | 3/2021 | Du et al. |
| 2022/0017503 A1 | 1/2022 | Seok et al. |
| 2022/0119360 A1 | 4/2022 | Mochizuki et al. |
| 2023/0225145 A1* | 7/2023 | Kim .................. H10K 85/346 257/40 |

FOREIGN PATENT DOCUMENTS

| | | |
|---|---|---|
| KR | 10-2059550 B1 | 12/2019 |
| KR | 10-2021-0032274 A | 3/2021 |
| KR | 10-2021-0116839 A | 9/2021 |
| KR | 10-2021-0131321 A | 11/2021 |
| WO | 2021/140896 A1 | 7/2021 |

OTHER PUBLICATIONS

Extended European Search Report for corresponding EP Patent Application No. 22199476.7, dated Jun. 26, 2023, 8pp.

* cited by examiner

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2022-0003633, filed on Jan. 10, 2022, in the Korean Intellectual Property Office, the entire content of which is hereby incorporated by reference.

BACKGROUND

1. Field

One or more embodiments of the present disclosure relate to a light-emitting device and an electronic apparatus including the same.

2. Description of the Related Art

From among light-emitting devices, self-emissive devices (for example, organic light-emitting devices, etc.) have wide viewing angles, excellent contrast ratios, fast response time, and excellent characteristics in terms of luminance, driving voltage and response speed.

In a light-emitting device, a first electrode is on a substrate, and a hole transport region, an emission layer, an electron transport region, and a second electrode are sequentially on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

SUMMARY

One or more embodiments of the present disclosure include a light-emitting device having frontal luminescence efficiency and lateral luminescence efficiency at the same time, and an electronic apparatus including the light-emitting device.

Additional aspects of embodiments will be set forth in part in the description which follows and, in part, will be apparent from the description, or may be learned by practice of the presented embodiments of the present disclosure.

According to an aspect of embodiments, provided is a light emitting device, the light-emitting device including:
a first electrode;
a second electrode facing the first electrode;
an interlayer between the first electrode and the second electrode and including an emission layer; and
a capping layer,
wherein the emission layer includes a first emitter,
the first emitter emits a first light having a first emission spectrum,
the capping layer is in a path along which the first light travels,
an emission peak wavelength of the first light is about 520 nm to about 550 nm,
the first emitter includes platinum,
the capping layer includes an amine-containing compound,
the value of a ratio of CIEy to a reflective index (RCR value) of the first light extracted to the outside through the capping layer is 38 or less, and
the RCR value is calculated by Equation 1

$$\text{CIE}y/R(\text{cap})\times 100 \qquad \text{Equation 1}$$

wherein, in Equation 1,
CIEy is a y coordinate value of the CIE color coordinates of the first light extracted to the outside through the capping layer, and
R(cap) is a refractive index of the amine-containing compound with respect to a second light having a wavelength that is within ±20 nm of the emission peak wavelength of the first light.

According to another aspect of embodiments, provided is a light-emitting device, the light-emitting device including:
a first electrode;
a second electrode facing the first electrode;
an interlayer between the first electrode and the second electrode and comprising an emission layer; and
a capping layer,
wherein the emission layer includes a first emitter,
the first emitter emits a first light having a first emission spectrum,
the capping layer is in a path along which the first light travels,
the first emitter includes platinum and a first ligand bound to the platinum,
the first emitter satisfies at least one selected from Condition A to Condition C:
Condition A
The first ligand is a tetradentate ligand, and the number of cyclometallated rings formed by a chemical bond between the platinum and the first ligand is three.
Condition B
The platinum is chemically bonded to a carbon, a nitrogen, and an oxygen of the first ligand.
Condition C
The first ligand includes an imidazole group, a benzimidazole group, a naphthoimidazole group, or any combination thereof,
wherein the capping layer includes an amine-containing compound, and
the amine-containing compound includes a benzoxazole group, a benzothiazole group, a naphthooxazole group, a naphthothiazole group, or any combination thereof.

Another aspect of embodiments of the present disclosure provides an electronic apparatus including the light-emitting device.

Another aspect of embodiments of the present disclosure provides a consumer product including the light-emitting device.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
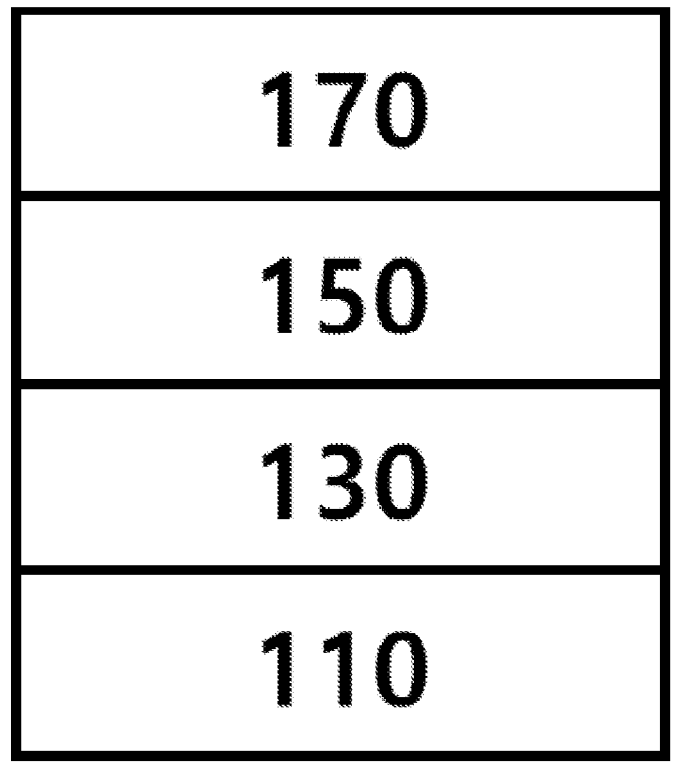
FIG. 1 shows a schematic view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

A light-emitting device according to an aspect of embodiments of the present disclosure may include: a first electrode; a second electrode facing the first electrode; an interlayer between the first electrode and the second electrode, including an emission layer; and a capping layer.

The emission layer may include a first emitter. The first emitter may emit a first light having a first emission spectrum, and the capping layer may be in a path along which the first light travels.

The emission peak wavelength (maximum emission wavelength, or maximum emission peak wavelength) of the first light is from about 520 nm to about 550 nm.

For example, the emission peak wavelength of the first light may be about 520 nm to about 545 nm, about 525 nm to about 550 nm, or about 525 nm to about 545 nm.

A full width at half maximum (FWHM) of the first light may be about 15 nm to about 60 nm.

For example, the FWHM of the first light may be about 20 nm to about 60 nm, or about 25 nm to about 60 nm.

The emission peak wavelength and FWHM of the first light described in the present specification may be evaluated from the emission spectrum of a film including the first emitter (for example, see Evaluation Example 2). The emission peak wavelength in the present specification refers to the peak wavelength having the maximum emission intensity in the emission spectrum or electroluminescence spectrum.

The first light having the emission peak wavelength and FWHM as described above may be green light.

The first emitter may include platinum.

In an embodiment, the first emitter may be an organometallic compound containing platinum. The first emitter may be neutral, may include one platinum atom, and may not include transition metals other than platinum. For example, the first emitter may be free of transition metals other than platinum.

In an embodiment, the first emitter may include, in addition to the platinum, a first ligand bound to the platinum.

In an embodiment, the first emitter may satisfy at least one selected from Condition A to Condition C:

Condition A

The first ligand is a tetradentate ligand, and the number of cyclometallated rings formed by a chemical bond between the platinum and the first ligand is three.

Condition B

The platinum is chemically bonded to a carbon, a nitrogen, and an oxygen of the first ligand.

Condition C

The first ligand includes an imidazole group, a benzimidazole group, a naphthoimidazole group, or any combination thereof.

In an embodiment, the first emitter may satisfy all of Condition A to Condition C.

More details for the first emitter are as described herein.

The capping layer is in a path along which the first light travels and is extracted to the outside of the light-emitting device, thereby increasing the external extraction rate of the first light.

The capping layer may include an amine-containing compound. The "amine" in the amine-containing compound refers to a group represented by

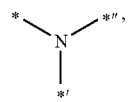

wherein *, *', and *'' respectively represent binding sites to neighboring atoms $A_1$, $A_2$ and $A_3$ respectively, and each of $A_1$, $A_2$ and $A_3$ is not linked via a single bond or an any atom group therebetween. Each of $A_1$, $A_2$ and $A_3$ may be any suitable atom, for example, carbon, hydrogen, and/or the like. For example, CBP does not belong to the amine-containing compound described in the present specification.

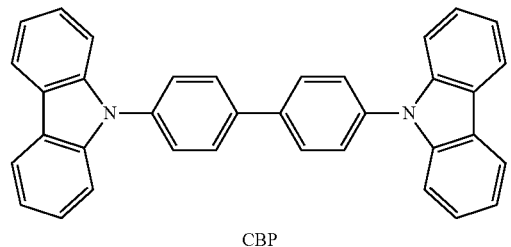 [SMILES: c1ccc2c(c1)c1ccccc1n2-c1ccc(-c2ccc(-n3c4ccccc4c4ccccc43)cc2)cc1 ; "CBP"]

CBP

In an embodiment, the capping layer may include a monoamine-containing compound. For example, the number of "amine" (or "amine groups") in the amine-containing compound included in the capping layer may be 1.

In an embodiment, the amine-containing compound included in the capping layer may include a benzoxazole group, a benzothiazole group, a naphthooxazole group, a naphthothiazole group, or any combination thereof.

The amine-containing compound is the same as described in the present specification.

A value of a ratio of CIEy to a reflective index (RCR value) of the first light extracted to the outside through the capping layer may be 38 or less. In this regard, the RCR value can be calculated by Equation 1:

$$\text{CIE}y/\text{R(cap)} \times 100 \qquad \text{Equation 1}$$

wherein, in Equation 1,

CIEy is a y coordinate value of CIE color coordinates of the first light extracted to the outside through the capping layer, and R(cap) is the refractive index of the amine-containing compound with respect to a second light having a wavelength within ±20 nm of the emission peak wavelength of the first light. For example, the R(cap) may be the refractive index of the amine-containing compound with respect to a second light having a wavelength within ±15 nm of the emission peak wavelength of the first light (for example, a wavelength within ±10 nm of the emission peak wavelength of the first light, or a wavelength within ±5 nm of the emission peak wavelength of the first light).

In an embodiment, the RCR value of the first light extracted through the capping layer may be 32.0 to 38.0, 32.5 to 38.0, 33.0 to 38.0, 33.5 to 38.0, 34.0 to 38.0, 34.5 to 38.0, 35.0 to 38.0, 35.5 to 38.0, 36.0 to 38.0, 32.0 to 37.5, 32.5 to 37.5, 33.0 to 37.5, 33.5 to 37.5, 34.0 to 37.5, 34.5 to 37.5, 35.0 to 37.5, 35.5 to 37.5, or 36.0 to 37.5.

When the emission peak wavelength of the first light is from about 520 nm to about 550 nm, and the RCR value of the first light extracted to the outside through the capping layer satisfies the ranges as described above, the light-emitting device has excellent frontal (0°) luminescence efficiency and lateral luminescence efficiency (for example, at a location moved 45° from the front)(0°) at the same time (e.g., excellent frontal luminescence efficiency at a viewing angle of 90° relative to a display surface of the light-emitting device and/or excellent lateral luminescence efficiency at a viewing angle of 45° relative to the display surface of the light-emitting device). By using such a light-emitting device, a high-quality electronic apparatus can be manufactured.

In an embodiment, the CIEy may be 0.70 to 0.74, 0.70 to 0.735, 0.70 to 0.73, 0.70 to 0.725, 0.705 to 0.74, 0.705 to 0.735, 0.705 to 0.73, 0.705 to 0.725, 0.71 to 0.74, 0.71 to 0.735, 0.71 to 0.73, 0.71 to 0.725, 0.715 to 0.74, 0.715 to 0.735, 0.715 to 0.73, or 0.715 to 0.725.

The R(cap) may be evaluated by actually measuring the refractive index of a film consisting of the amine-containing compound (see, for example, Evaluation Example 3).

In an embodiment, the R(cap) may be the refractive index of the amine-containing compound with respect to a second light having a wavelength of 530 nm.

In an embodiment, the R(cap) may be 1.85 or more.

In an embodiment, the R(cap) may be 1.85 to 2.5, 1.90 to 2.5, 1.95 to 2.5, 1.85 to 2.45, 1.90 to 2.45, 1.95 to 2.45, 1.85 to 2.4, 1.90 to 2.4, 1.95 to 2.4, 1.85 to 2.35, 1.90 to 2.35, 1.95 to 2.35, 1.85 to 2.3, 1.90 to 2.3, 1.95 to 2.3, 1.85 to 2.25, 1.90 to 2.25, 1.95 to 2.25, 1.85 to 2.2, 1.90 to 2.2, 1.95 to 2.2, 1.85 to 2.15, 1.90 to 2.15, 1.95 to 2.15, 1.85 to 2.1, 1.90 to 2.1, or 1.95 to 2.1.

According to another aspect of embodiments, the light-emitting device includes: a first electrode; a second electrode facing the first electrode; an interlayer between the first electrode and the second electrode, including an emission layer; and a capping layer, wherein the emission layer includes a first emitter, the first emitter emits a first light having a first emission spectrum, and the capping layer is in a path along which the first light travels, the first emitter includes platinum and a first ligand bound to the platinum, the first emitter satisfies at least one selected from Condition A to Condition C, the capping layer includes an amine-containing compound, and the amine-containing compound includes a benzoxazole group, a benzothiazole group, a naphthooxazole group, a naphthothiazole group, or any combination thereof.

The first light, the first emitter, and the amine-containing compound are the same as described above.

In an embodiment, the first emitter may satisfy all of Condition A to Condition C.

In an embodiment, the emission peak wavelength of the first light may be about 520 nm to about 550 nm.

In an embodiment, the emission peak wavelength of the first light may be about 520 nm to about 545 nm, about 525 nm to about 550 nm, or about 525 nm to about 545 nm.

In an embodiment, the full width at half maximum (FWHM) of the first light is 15 nm to 60 nm, 20 nm to 60 nm, or 25 nm to 60 nm.

The first light having the emission peak wavelength and FWHM as described above may be green light.

In an embodiment, the refractive index of the amine-containing compound with respect to the second light having a wavelength within ±20 nm of the emission peak wavelength of the first light (for example, a wavelength within ±15 nm of the emission peak wavelength of the first light, a wavelength within ±10 nm of the emission peak wavelength of the first light, or a wavelength within ±5 nm of the emission peak wavelength of the first light) may be 1.85 or more, 1.85 to 2.5, 1.90 to 2.5, 1.95 to 2.5, 1.85 to 2.45, 1.90 to 2.45, 1.95 to 2.45, 1.85 to 2.4, 1.90 to 2.4, 1.95 to 2.4, 1.85 to 2.35, 1.90 to 2.35, 1.95 to 2.35, 1.85 to 2.3, 1.90 to 2.3, 1.95 to 2.3, 1.85 to 2.25, 1.90 to 2.25, 1.95 to 2.25, 1.85 to 2.2, 1.90 to 2.2, 1.95 to 2.2, 1.85 to 2.15, 1.90 to 2.15, 1.95 to 2.15, 1.85 to 2.1, 1.90 to 2.1, or 1.95 to 2.1.

As described above, a light-emitting device concurrently (e.g., simultaneously) including i) an emission layer including a first emitter which includes platinum and a first ligand bound to the platinum, and satisfies at least one selected from Condition A to Condition C, and ii) a capping layer including an amine-containing compound, wherein the amine-containing compound includes a benzoxazole group, a benzothiazole group, a naphthooxazole group, a naphthothiazole group, or any combination thereof, may have excellent frontal luminescence efficiency and lateral luminescence efficiency at the same or substantially the same time, and accordingly, a high-quality electronic apparatus can be manufactured by using such a light-emitting device.

In an embodiment, the first emitter may include at least one deuterium.

In an embodiment, the highest occupied molecular orbital (HOMO) energy level of the first emitter may be −5.30 eV to −4.70 eV or −5.25 eV to −4.80 eV.

In an embodiment, the lowest unoccupied molecular orbital (LUMO) energy level of the first emitter may be −2.55 eV to −2.30 eV or −2.45 eV to −1.90 eV.

In an embodiment, the LUMO energy level of the first emitter may be −2.65 eV to −2.00 eV or −2.55 eV to −2.30 eV.

The HOMO and LUMO energy levels may be evaluated through cyclic voltammetry analysis (for example, Evaluation Example 1) of the organometallic compound.

In an embodiment, the triplet ($T_1$) energy of the first emitter may be 2.10 eV to 2.60 eV or 2.20 eV to 2.50 eV.

The evaluation method for the triplet energy of the first emitter may be understood by referring to, for example, Evaluation Example 2.

The emission layer may further include, in addition to the first emitter, a host, an auxiliary dopant, a sensitizer, a delayed fluorescence material, or any combination thereof. Each of the host, the auxiliary dopant, the sensitizer, the delayed fluorescence material, or any combination thereof may include at least one deuterium.

For example, the emission layer may include the first emitter and the host. The host may be different from the first emitter, and the host may include an electron-transporting compound, a hole-transporting compound, a bipolar compound, or any combination thereof. In some embodiments, the host may not include metal. The electron-transporting compound, the hole-transporting compound, and the bipolar compound are different from each other.

In an embodiment, the emission layer includes the first emitter and a host, and the host may include an electron-transporting compound and a hole-transporting compound. The electron-transporting compound and the hole-transporting compound may form an exciplex.

For example, the electron-transporting compound may include at least one n electron-deficient nitrogen-containing $C_1$-$C_{60}$ cyclic group. For example, the electron-transporting compound may include a pyridine group, a pyrimidine group, a pyrazine group, a pyridazine group, a triazine group, or any combination thereof.

In an embodiment, the hole-transporting compound may include at least one n electron-rich $C_3$-$C_{60}$ cyclic group, a pyridine group, or a combination thereof, and may not include an electron-transporting group (for example, a n electron-deficient nitrogen-containing $C_1$-$C_{60}$ cyclic group, a cyano group, a sulfoxide group, and a phosphine oxide group, not a pyridine group).

In an embodiment, the following compounds may be excluded from the hole-transporting compound.

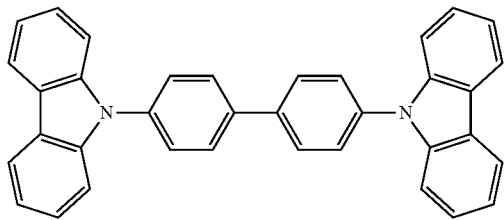

CBP

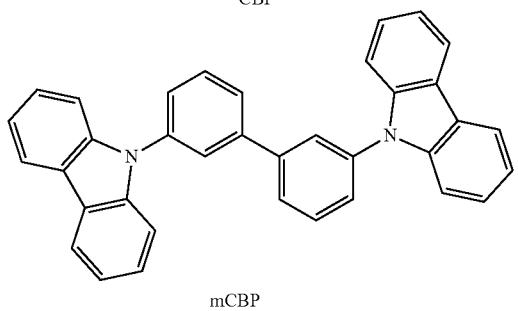

mCBP

In an embodiment, the electron-transporting compound may include a compound represented by Formula 2-1 or a compound represented by Formula 2-2:

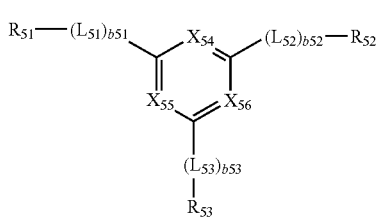

Formula 2-1

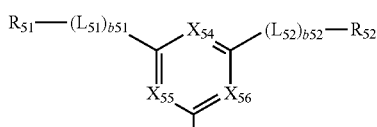

Formula 2-2

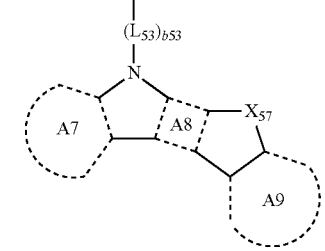

wherein, in Formulae 2-1 and 2-2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, A7 to A9 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$ (for example, a benzene group or a naphthalene group, each unsubstituted or substituted with at least one $R_{10a}$), $X_{54}$ is N or $C(R_{54})$, $X_{55}$ is N or $C(R_{55})$, $X_{56}$ is N or $C(R_{56})$, and at least one selected from $X_{54}$ to $X_{56}$ is N, $X_{57}$ may be O, S, $N(R_{57})$, $C(R_{57a})(R_{57b})$, or $Si(R_{57a})(R_{57b})$, and $R_{51}$ to $R_{57}$, $R_{57a}$, $R_{57b}$, and $R_{10a}$ are each the same as described herein.

In an embodiment, the hole-transporting compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

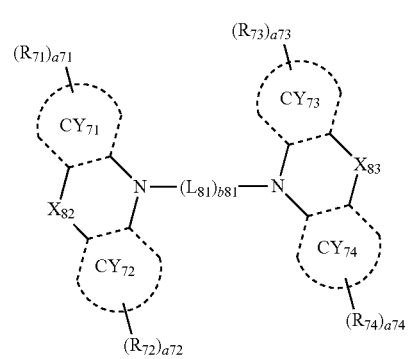

Formula 3-2

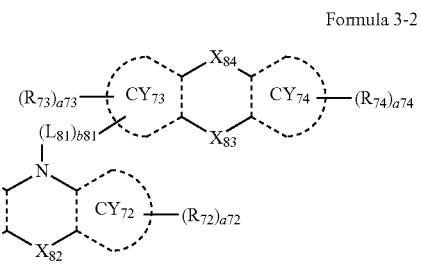

Formula 3-3

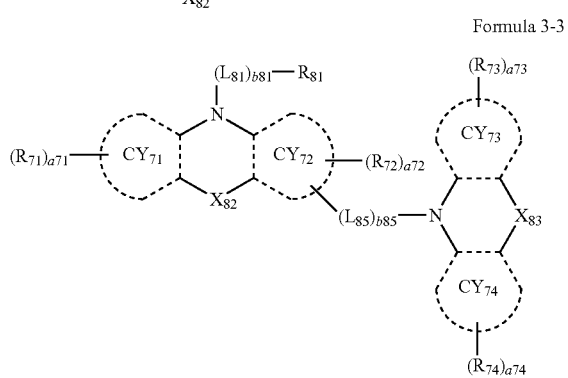

-continued

Formula 3-4

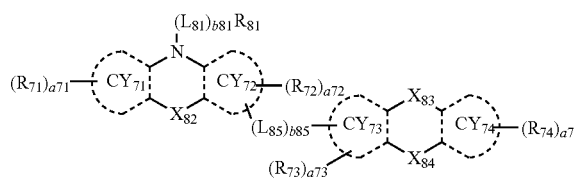

Formula 3-5

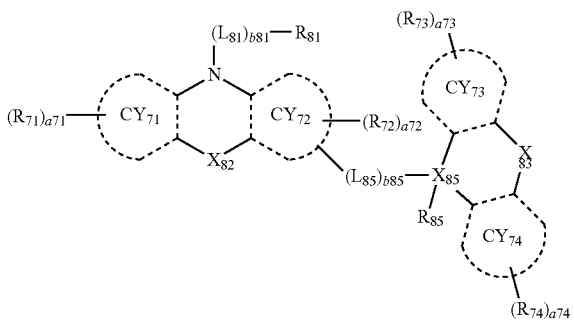

wherein, in Formulae 3-1 to 3-5, ring $CY_{71}$ to ring $CY_{74}$ may each independently be a n electron-rich $C_3$-$C_{60}$ cyclic group (for example, a benzene group, a naphthalene group, a fluorene group, a anthracene group, a carbazole group, a dibenzofuran group, or a dibenzothiophene group), or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$ (for example, a benzene group, a naphthalene group, a fluorene group, a anthracene group, a carbazole group, a dibenzofuran group, or a dibenzothiophene group, each unsubstituted or substituted with at least one $R_{10a}$), or a pyridine group unsubstituted or substituted with at least one $R_{10a}$, wherein $Q_4$ and $Q_5$ are the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each be the same as described herein, a71 to a74 may each independently be an integer from 0 to 20, and $R_{10a}$ may be understood by referring to the description of $R_{10a}$ provided herein.

The capping layer of the light-emitting device may be outside the first electrode and/or outside the second electrode.

In an embodiment, the light-emitting device may include at least one selected from a first capping layer outside of the first electrode and a second capping layer outside of the second electrode, wherein at least one selected from the first capping layer and the second capping layer may include the amine-containing compound described in the present specification.

In an embodiment, the light-emitting device may include:

a first capping layer outside the first electrode and including the amine-containing compound described in the present specification;

a second capping layer outside the second electrode and including the amine-containing compound described in the present specification; or the first capping layer and the second capping layer.

In an embodiment, the light-emitting device may further include a third capping layer, and the third capping layer may include a compound which is different from the amine-containing compound described in the present specification. The third capping layer may be in a path along which the first light emitted from the first emitter travels.

In an embodiment, the third capping layer may include a material having a refractive index (at a wavelength 589 nm) of 1.6 or more.

In an embodiment, the third capping layer may be an organic capping layer including an organic material, an inorganic capping layer including an inorganic material, or an organic-inorganic composite capping layer including an organic material and an inorganic material.

For example, the third capping layer may include a carbocyclic compound, a heterocyclic compound, an amine group-containing compound, a porphine derivative, a phthalocyanine derivative, a naphthalocyanine derivative, an alkali metal complex, an alkaline earth-metal complex, or any combination thereof. Optionally, the carbocyclic compound, the heterocyclic compound, and the amine group-containing compound may each be substituted with a substituent including O, N, S, Se, Si, F, Cl, Br, I, or any combination thereof.

For example, the third capping layer may include a compound represented by Formula 201, a compound represented by Formula 202, or any combination thereof.

In an embodiment, the third capping layer may include one selected from Compounds HT28 to HT33, one selected from Compounds CP1 to CP6 (Compound CP3 is identical to Compound B02 and Compounds CP1 to CP6 are distinguishable from Compounds CP01 to CP06 described in the present specification, respectively), β-NPB, or any compound thereof:

CP1

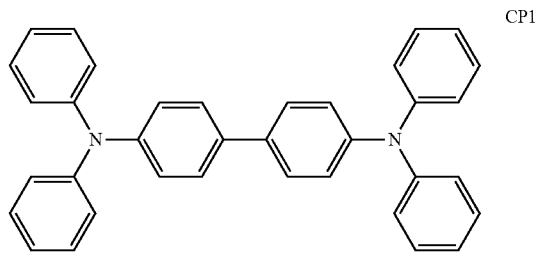

CP2

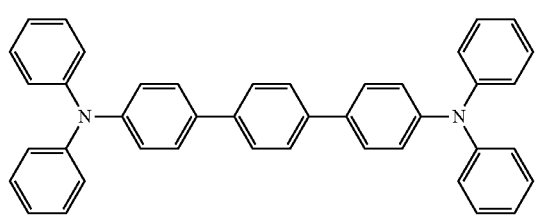

-continued

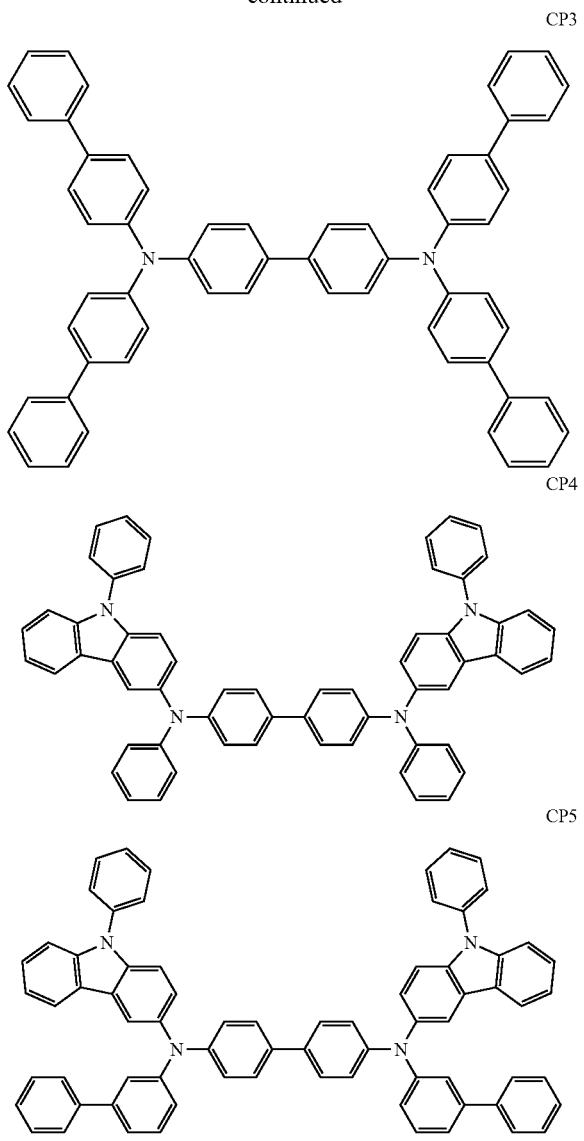

CP3

CP4

CP5

In one or more embodiments, the light-emitting device may further include:

i) a structure in which the first electrode, the interlayer, the second electrode, and the second capping layer (including the amine-containing compound described in the present specification) are sequentially stacked;

ii) a structure in which the first electrode, the interlayer, the second electrode, the third capping layer (containing a compound different from the amine-containing compound described in the present specification), and the second capping layer (including the amine-containing compound described in the present specification) are sequentially stacked, or iii) a structure in which the first electrode, the interlayer, the second electrode, the second capping layer (including the amine-containing compound described in the present specification), and the third capping layer (containing a compound different from the amine-containing compound described in the present specification) are sequentially stacked.

In this regard, the first light emitted from the first emitter of the emission layer included in the interlayer may be extracted to the outside of the light-emitting device through the second electrode and then the second capping layer (or the second capping layer and the third capping layer), and the second electrode may be a semi-transmissive electrode or a transmissive electrode.

The wording "the interlayer (or, a capping layer) includes a first emitter (or an amine-containing compound)" refers to "the interlayer (or a capping layer) may include one type (or kind) of a compound belonging to the category of the first emitter or two or more types (or kinds) of different compounds belonging to the first emitter (or one type (or kind) of compound belonging to an amine-containing compound or two or more different compounds belonging to an amine-containing compound).

The term "interlayer," as used herein, refers to a single layer and/or all of a plurality of layers between the first electrode and the second electrode of the light-emitting device.

Another aspect of embodiments provides an electronic apparatus including the light-emitting device. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. For more details on the electronic apparatus, related descriptions provided herein may be referred to.

Another aspect of embodiments of the present disclosure provides a consumer product including the light-emitting device.

For example, the consumer product may be one selected from a flat panel display, a curved display, a computer monitor, a medical monitor, a TV, a billboard, indoor or outdoor illuminations and/or signal light, a head-up display, a fully or partially transparent display, a flexible display, a rollable display, a foldable display, a stretchable display, a laser printer, a phone, a cell phone, a tablet, a phablet, a personal digital assistant (PDA), a wearable device, laptop computers, digital cameras, camcorders, viewfinders, micro displays, 3D displays, virtual and/or augmented reality displays, vehicles, a video wall including multiple displays tiled together, a theater and/or stadium screen, a phototherapy device, and a signage.

DESCRIPTION OF FORMULAE

The first emitter may be, for example, an organometallic compound represented by Formula 1. In addition, the amine-containing compound may be, for example, a compound represented by Formula 8:

Formula 1

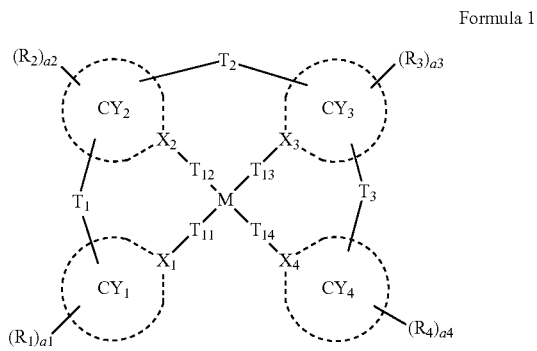

-continued

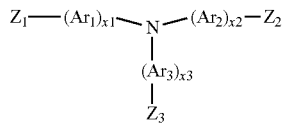

Formula 8 wherein, in Formulae 1 and 8,

M may be Pt, $X_1$ to $X_4$ may each independently be N or C, $T_{11}$ to $T_{14}$ may each independently be a chemical bond (e.g., a single bond or a coordinate covalent bond, which may also be referred to as a dative bond), O, S, B(R'), N(R'), P(R'), C(R')(R''), Si(R')(R''), Ge(R')(R''), C(=O), B(R')(R''), N(R')(R''), or P(R')(R''), When $T_{11}$ is a chemical bond, $X_1$ and M may be directly bonded to each other, when $T_{12}$ is a chemical bond, $X_2$ and M may be directly bonded to each other, when $T_{13}$ is a chemical bond, $X_3$ and M may be directly bonded to each other, when $T_{14}$ is a chemical bond, $X_4$ and M may be directly bonded to each other, Two of the bonds selected from a bond between $X_1$ or $T_{11}$ and M, a bond between $X_2$ or $T_{12}$ and M, a bond between $X_3$ or $T_{13}$ and M, and a bond between $X_4$ or $T_{14}$ and M may be coordinate bonds (e.g., coordinate covalent bonds, which may also be referred to as dative bonds), and the other two bonds may be covalent bonds, $T_1$ may be a single bond, a double bond, *—N($R_5$)—*', *—B($R_5$)—*', *—P($R_5$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(=O)—*', *—S(=O)—*', *—S(=O)$_2$—*', *—C($R_5$)=*', *=C($R_5$)—*', *—C($R_{5a}$)=C($R_{5b}$)—*', *—C(=S)—*', or *—C≡C—*', $T_2$ may be a single bond, a double bond, *—N($R_6$)—*', *—B($R_6$)—*', *—P($R_6$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(=O)—*', *—S(=O)—*', *—S(=O)$_2$—*', *—C($R_6$)=*', *=C($R_6$)—*', *—C($R_{6a}$)=C($R_{6b}$)—*', *—C(=S)—*', or *—C≡C—*', $T_3$ may be a single bond, a double bond, *—N($R_7$)—*', *—B($R_7$)—*', *—P($R_7$)—*', *—C($R_{7a}$)($R_{7b}$)—*', *—Si($R_{7a}$)($R_{7b}$)—*', *—Ge($R_{7a}$)($R_{7b}$)—*', *—S—*', *—Se—*', *—O—*', *—C(=O)—*', *—S(=O)—*', *—S(=O)$_2$—*', *—C($R_7$)=*', *=C($R_7$)—*', *—C($R_{7a}$)=C($R_{7b}$)—*', *—C(=S)—*', or *—C≡C—*', ring $CY_1$ to ring $CY_4$ may each independently be a $C_3$-$C_{60}$ carbocyclic group or a $C_1$-$C_{60}$ heterocyclic group, $Ar_1$ to $Ar_3$ and $Z_1$ to $Z_3$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, x1 to x3 may each independently be one selected from an integer from 0 to 10, i) when x1 is 0, *—$(Ar_1)_{x1}$—*' may be a single bond, ii) when x2 is 0, *—$(Ar_2)_{x2}$—*' may be a single bond, and iii) when x3 is 0, *—$(Ar_3)_{x3}$—*' may be a single bond, $R_1$ to $R_7$, $R_{5a}$, $R_{5b}$, $R_{6a}$, $R_{6b}$, $R_{7a}$, $R_{7b}$, R', and R'' may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a4 may each independently be one selected from an integer from 0 to 20,

* and *' each indicate a binding site to an adjacent atom,

Each of i) two groups of $R_1$(s) in the number of a1, ii) two groups of $R_2$(s) in the number of a2, iii) two groups of $R_3$(s) in the number of a3, iv) two groups of $R_4$(s) in the number of a4, v) $R_{5a}$ and $R_{5b}$, vi) $R_{6a}$ and $R_{6b}$, and vii) Ria and Rib, may optionally be bonded to each other via a single bond, a double bond, or a first linking group to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, in Formula 1, i) $X_1$ and $X_3$ may be C, and $X_2$ and $X_4$ may be N, ii) $X_1$ and $X_4$ may be C, and $X_2$ and $X_3$ may be N, or iii) $X_1$, $X_2$, and $X_3$ may be C, and $X_4$ may be N.

In one or more embodiments, in Formula 1, $T_{11}$ may be O or S, and $T_{12}$ to $T_{14}$ may each be a chemical bond (e.g., a single bond, or a coordinate covalent bond, which may also be referred to as a dative bond).

In one or more embodiments, regarding Formula 1, $T_{11}$ may be O or S, and $T_{12}$ to $T_{14}$ may each be a chemical bond (e.g., a single bond, or a coordinate covalent bond, which may also be referred to as a dative bond), and i) a bond between $T_{11}$ and M and a bond between $X_3$ and M may each be a covalent bond, and a bond between $X_2$ and M and a bond between $X_4$ and M may each be a coordinate bond (e.g., a coordinate covalent bond, which may also be referred to as a dative bond), or ii) a bond between $T_{11}$ and M and a bond between $X_4$ and M may each be a covalent bond, and a bond between $X_2$ and M and a bond between $X_3$ and M may each be a coordinate bond (e.g., a coordinate covalent bond, which may also be referred to as a dative bond).

In an embodiment, each of $T_1$ to $T_3$ in Formula 1 may be a single bond.

In an embodiment, a ring $CY_1$ in Formula 1 may be a benzene group, a naphthalene group, a dibenzofuran group, a dibenzothiophene group, a carbazole group, a fluorene group, or a dibenzosilole group.

In an embodiment, a ring $CY_2$ in Formula 1 may be an imidazole group, a benzimidazole group, a naphthoimidazole group, a pyridine group, a pyrimidine group, a pyrazine group, a pyridazine group, a quinoline group, an isoquinoline group, or a quinoxaline group.

In an embodiment, a ring $CY_3$ in Formula 1 may be a benzene group, a naphthalene group, a dibenzofuran group, a dibenzothiophene group, a carbazole group, a fluorene group, a dibenzosilole group, a pyridine group, a pyrimidine group, a pyrazine group, a pyridazine group, a quinoline group, an isoquinoline group, a quinoxaline group, an azadibenzofuran group, an azadibenzothiophene group, an azacarbazole group, an azafluorene group, or an azadibenzosilole group.

In an embodiment, a ring $CY_4$ in Formula 1 may be a benzene group, a naphthalene group, a dibenzofuran group, a dibenzothiophene group, a carbazole group, a fluorene group, a dibenzosilole group, a pyridine group, a pyrimidine group, a pyrazine group, a pyridazine group, a quinoline group, an isoquinoline group, a quinoxaline group, an azadibenzofuran group, an azadibenzothiophene group, an azacarbazole group, an azafluorene group, an azadibenzosilole group, an imidazole group, a benzimidazole group, or a naphthoimidazole group.

In an embodiment, at least one of ring $CY_2$ and ring $CY_4$ of Formula 1 may be an imidazole group, a benzimidazole group, or a naphthoimidazole group.

In an embodiment, $Ar_1$ to $Ar_3$ and $Z_1$ to $Z_3$ in Formula 8 may each independently be a benzene group, a pyridine group, a pyrimidine group, a pyrazine group, a pyridazine group, a triazine group, a benzoxazole group, a benzothiazole group, a naphthooxazole group, or a naphthothiazole group, each unsubstituted or substituted with at least one $R_{10a}$. For example, at least one selected from $Z_1$ to $Z_3$ in Formula 8 may each independently be a benzoxazole group, a benzothiazole group, a naphthooxazole group, or a naphthothiazole group, each unsubstituted or substituted with at least one $R_{10a}$. In this regard, $R_{10a}$ may be: deuterium; a $C_1$-$C_{20}$ alkyl group substituted or unsubstituted with at least one deuterium; a $C_3$-$C_{20}$ carbocyclic group, or a $C_1$-$C_{20}$ heterocyclic group, each unsubstituted or substituted with deuterium, a $C_1$-$C_{20}$ alkyl group, a $C_3$-$C_{20}$ carbocyclic group, a $C_1$-$C_{20}$ heterocyclic group, or any combination thereof.

x1, x2, and x3 in Formula 8 respectively indicate the number of $Ar_1$(s), the number of $Ar_2$(s), and the number of $Ar_3$(s), and, for example, each independently 0, 1, 2, or 3.

In an embodiment, $R_1$ to $R_7$, $R_{5a}$, $R_{5b}$, $R_{6a}$, $R_{6b}$, $R_{7a}$, $R_{7b}$, R', and R" in Formula 1 may each independently be:

hydrogen, deuterium, —F, or a cyano group;

a $C_1$-$C_{20}$ alkyl group or a $C_3$-$C_{10}$ cycloalkyl group, each unsubstituted or substituted with deuterium, —F, a cyano group, or any combination thereof; or a phenyl group, a biphenyl group, a naphthyl group, a dibenzofuranyl group, or a dibenzothiophenyl group (or a thienyl group), each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or any combination thereof.

The term "biphenyl group," as used herein, refers to a monovalent substituent having a structure in which two benzene groups are connected to each other through a single bond.

a1 to a4 in Formula 1 respectively indicates the numbers of $R_1$(s) to $R_4$(s), and for example, may each independently be 0, 1, 2, 3, 4, 5, or 6.

In one or more embodiments, a group represented by

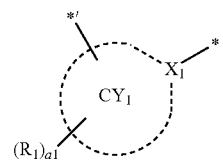

in Formula 1 may be a group represented by one selected from CY1(1) to CY1(16):

CY1(1)

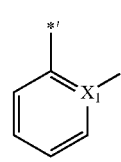

CY1(2)

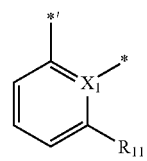

CY1(3)

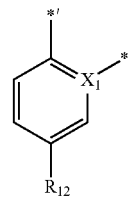

CY1(4)
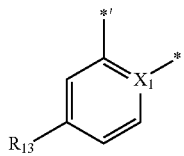

CY1(5)
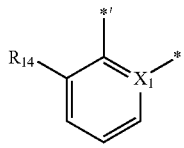

CY1(6)
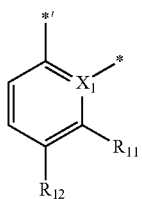

CY1(7)
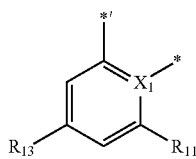

CY1(8)
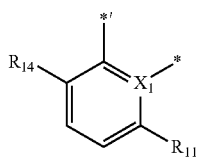

CY1(9)
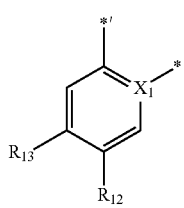

CY1(10)
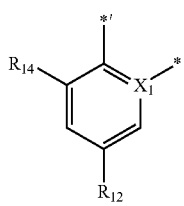

CY1(11)
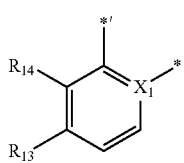

CY1(12)
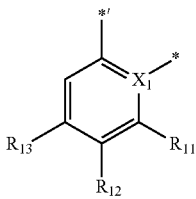

CY1(13)
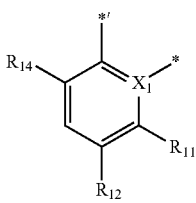

CY1(14)
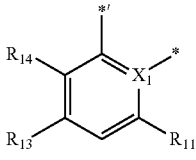

CY1(15)
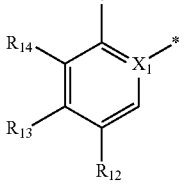

CY1(16)
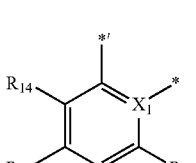

wherein, in Formulae CY1(1) to CY1(16), $X_1$ is the same as described herein, $R_{11}$ to $R_{14}$ are each the same as described in connection with $R_1$ in the present specification, wherein $R_{11}$ to $R_{14}$ are each not hydrogen,

* indicates a binding site to $T_{11}$ in Formula 1, and

*' indicates a binding site to $T_1$ in Formula 1.

In one or more embodiments, a group represented by

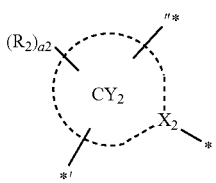

in Formula 1 may be a group represented by one selected from CY2(1) to CY2(21):
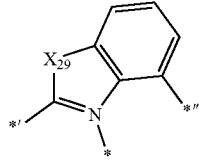
CY2(1)
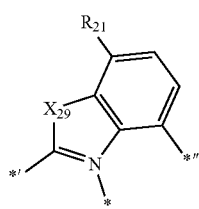
CY2(2)
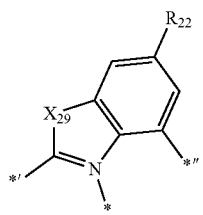
CY2(3)
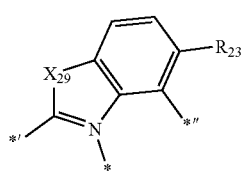
CY2(4)
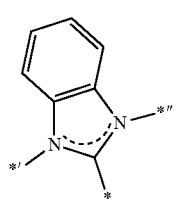
CY2(5)
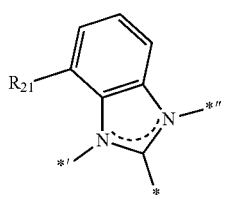
CY2(6)
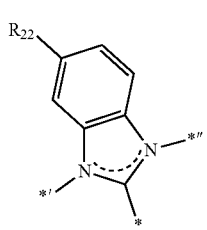
CY2(7)
-continued
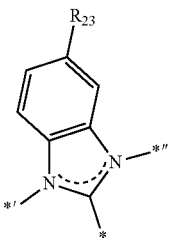
CY2(8)
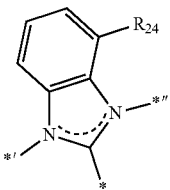
CY2(9)
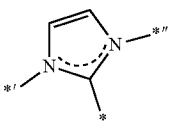
CY2(10)
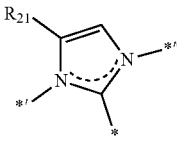
CY2(11)
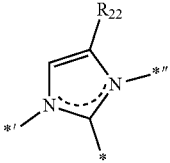
CY2(12)
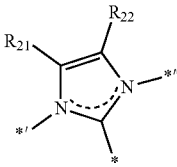
CY2(13)
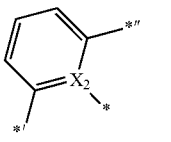
CY2(14)
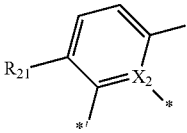
CY2(15)
CY2(16)

-continued

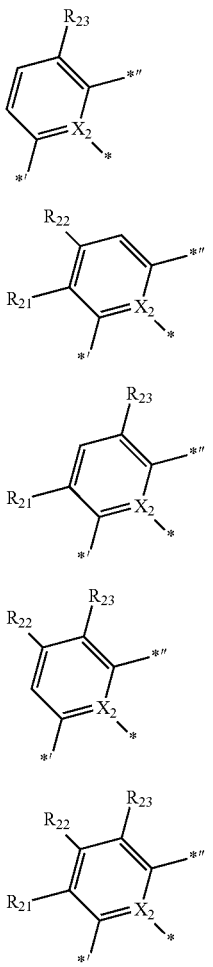

CY2(17)

CY2(18)

CY2(19)

CY2(20)

CY2(21)

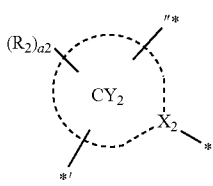

wherein, in Formulae CY2(1) to CY2(21), $X_2$ is the same as described in the present specification, $X_{29}$ may be O, S, $N(R_{29})$, $C(R_{29a})(R_{29b})$, or $Si(R_{29a})(R_{29b})$, $R_{21}$ to $R_{24}$, $R_{29}$, $R_{29a}$, and $R_{29b}$ are each the same as described in connection with $R_2$ in the present specification, wherein $R_{21}$ to $R_{24}$ are each not hydrogen, \* indicates a binding site to $T_{12}$ in Formula 1, \*' indicates a binding site to $T_1$ in Formula 1, and \*'' indicates a binding site to $T_2$ in Formula 1.

Formulae CY2(1) to CY2(4) belong to a group represented by

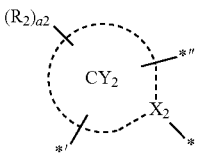

where $X_2$ is nitrogen, and Formulae CY2(5) to CY2(13) belong to a group represented by

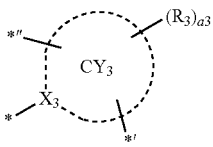

where $X_2$ is carbon (for example, carbon of a carbene moiety).

In one or more embodiments, a group represented by

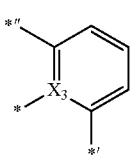

in Formula 1 may be a group represented by one selected from CY3(1) to CY3(12):

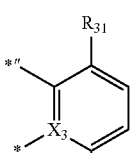

CY3(1)

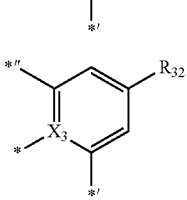

CY3(2)

CY3(3)

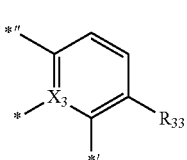

CY3(4)

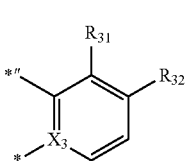

CY3(5)

CY3(6)

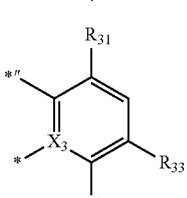

-continued

CY3(7)
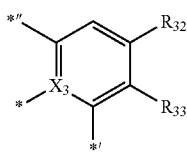

CY3(8)
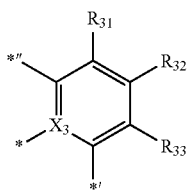

CY3(9)
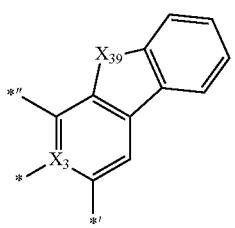

CY3(10)
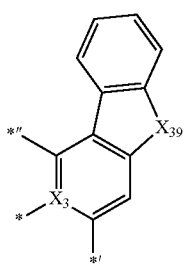

CY3(11)
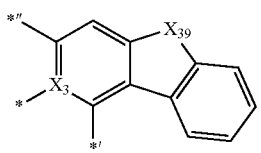

CY3(12)
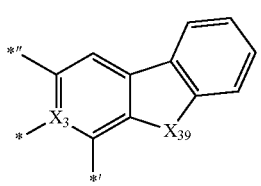

wherein, in Formulae CY3(1) to CY3(12), $X_3$ is the same as described in the present specification, $X_{39}$ may be O, S, N($R_{39}$), C($R_{39a}$)($R_{39b}$), or Si($R_{39a}$)($R_{39b}$), $R_{31}$ to $R_{33}$, $R_{39}$, $R_{39a}$, and $R_{39b}$ are each the same as described in connection with $R_3$ in the present specification, wherein $R_{31}$ to $R_{33}$ are each not hydrogen, \* indicates a binding site to $T_{13}$ in Formula 1, \*' indicates a binding site to $T_3$ in Formula 1, and \*'' indicates a binding site to $T_2$ in Formula 1.

In one or more embodiments, a group represented by

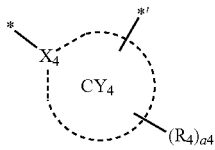

in Formula 1 may be a group represented by one selected from CY4(1) to CY4(27):

CY4(1)
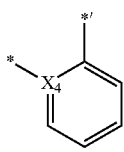

CY4(2)
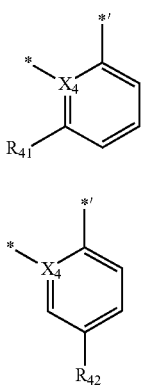

CY4(3)
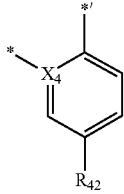

CY4(4)
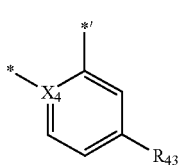

CY4(5)
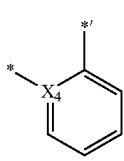

CY4(6)
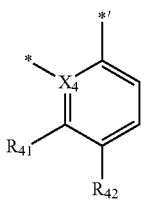

CY4(7)
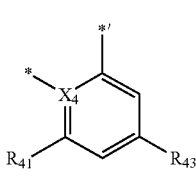

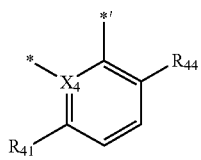
CY4(8)
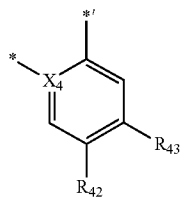
CY4(9)
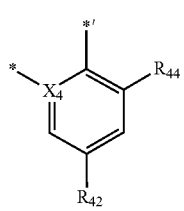
CY4(10)
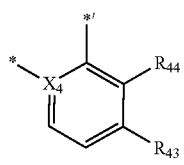
CY4(11)
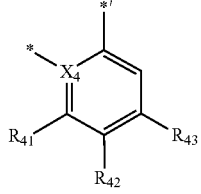
CY4(12)
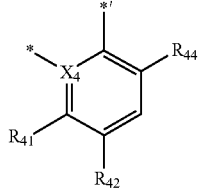
CY4(13)
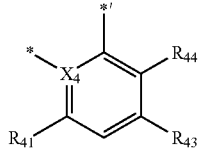
CY4(14)
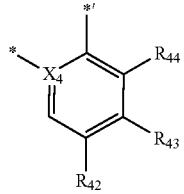
CY4(15)
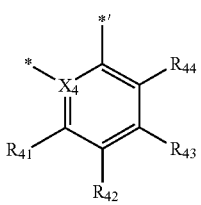
CY4(16)
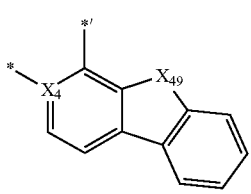
CY4(17)
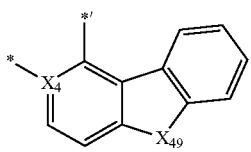
CY4(18)
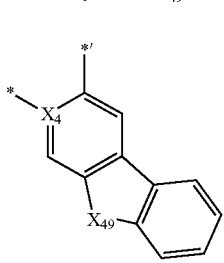
CY4(19)
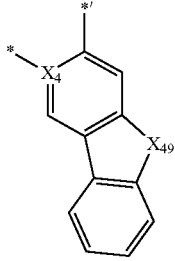
CY4(20)
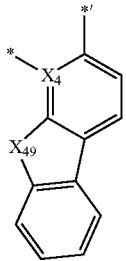
CY4(21)
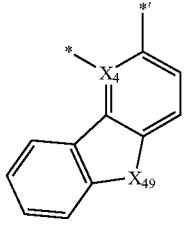
CY4(22)

-continued

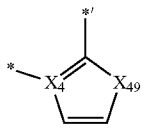
CY4(23)

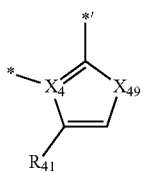
CY4(24)

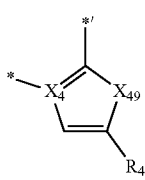
CY4(25)

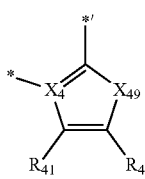
CY4(26)

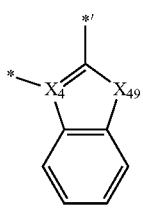
CY4(27)

wherein, in Formulae CY4(1) to CY4(27), $X_4$ is the same as described in the present specification, $X_{49}$ may be O, S, N($R_{49}$), C($R_{49a}$)($R_{49b}$), or Si($R_{49a}$)($R_{49b}$), $R_{41}$ to $R_{44}$, $R_{49}$, $R_{49a}$ and $R_{49b}$ are each the same as described in connection with $R_4$, and $R_{41}$ to $R_{44}$ are each not hydrogen,

* indicates a binding site to $T_{14}$ in Formula 1, and

*' indicates a binding site to $T_3$ in Formula 1.

In an embodiment, the amine-containing compound may be represented by a compound as Formula 8-1:

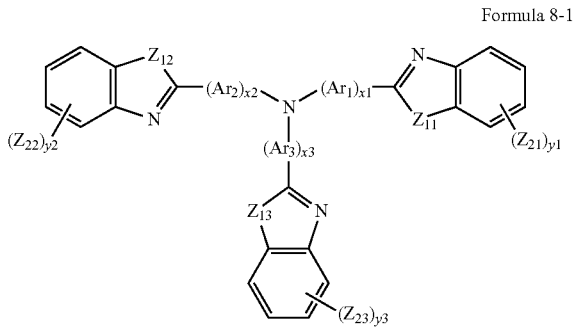

Formula 8-1 wherein, in Formula 8-1, $Ar_1$ to $Ar_3$ and x1 to x3 are each the same as described herein, $Z_{11}$ to $Z_{13}$ may each independently be O or S, $Z_{21}$ to $Z_{23}$ are each the same as described in connection with $R_{10a}$, y1 to y3 may each independently be an integer from 0 to 4.

b51 to b53 in Formulae 2-1 and 2-2 indicate numbers of $L_{51}$ to $L_{53}$, respectively, and may each be an integer from 1 to 5. When b51 is 2 or more, two or more of $L_{51}$(s) may be identical to or different from each other, when b52 is 2 or more, two or more of $L_{52}$(s) may be identical to or different from each other, and when b53 is 2 or more, two or more of $L_{53}$(s) may be identical to or different from each other. In an embodiment, b51 to b53 may each independently be 1 or 2.

$L_{51}$ to $L_{53}$ in Formulae 2-1 and 2-2 may each independently be a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a oxazole group, a isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, a dibenzodihydropyrazine group, an indolocarbazole group, an indolodibenzofuran group, or an indolodibenzothiophene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In Formulae 2-1 and 2-2, $X_{54}$ may be N or C($R_{54}$), $X_{55}$ may be N or C($R_{55}$), $X_{56}$ may be N or C($R_{56}$), and at least one selected from $X_{54}$ to $X_{56}$ may be N. $R_{54}$ to $R_{56}$ are the same as described above. In an embodiment, two or three of $X_{54}$ to $X_{56}$ may be N.

$R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$). $Q_1$ to $Q_3$ are the same as described in the present specification.

For example, i) $R_1$ to $R_7$, $R_{5a}$, $R_{5b}$, $R_{6a}$, $R_{6b}$, $R_{7a}$, $R_{7b}$, R', and R" in Formula 1, ii) $R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ in Formulae 2-1, 2-2 and 3-1 to 3-5, and iii) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzisoxazolyl group, a benzisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof; or —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $Q_1$ to $Q_3$ and $Q_{31}$ to $Q_{33}$ may each independently be:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

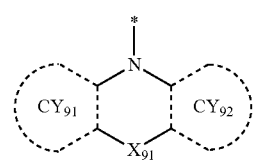

Formula 91 wherein, in Formula 91,
ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, N($R_{91}$), B($R_{91}$), C($R_{91a}$)($R_{91b}$), or Si($R_{91a}$)($R_{91b}$), $R_{91}$, $R_{91a}$, and $R_{91b}$ may respectively be understood by referring to the descriptions of $R_{82}$, $R_{82a}$, and $R_{82b}$ provided herein, $R_{10a}$ may be understood by referring to the description of $R_{10a}$ provided herein, and

* indicates a binding site to an adjacent atom.

For example, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In an embodiment, i) $R_1$ to $R_7$, $R_{5a}$, $R_{5b}$, $R_{6a}$, $R_{6b}$, $R_{7a}$, $R_{7b}$, R', and R" in Formula 1 ii) $R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ in Formulae 2-1, 2-2, 3-1 to 3-5, 502, and 503, and iii) $R_{10a}$ may each independently be hydrogen, deuterium, —F, a cyano group, a nitro group, —$CH_3$, —$CD_3$, —$CD_2H$, —$CDH_2$, —$CF_3$, —$CF_2H$, —$CFH_2$, a group represented by one selected from Formulae 9-1 to 9-19, a group represented by one selected from Formulae 10-1 to 10-246, —$C(Q_1)(Q_2)(Q_3)$, —$Si(Q_1)(Q_2)(Q_3)$, or —$P(=O)(Q_1)(Q_2)$ (where $Q_1$ to $Q_3$ are the same as described above) (provided that $R_{10a}$ is not hydrogen):

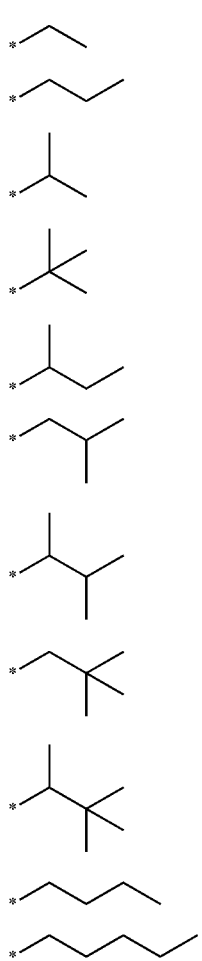
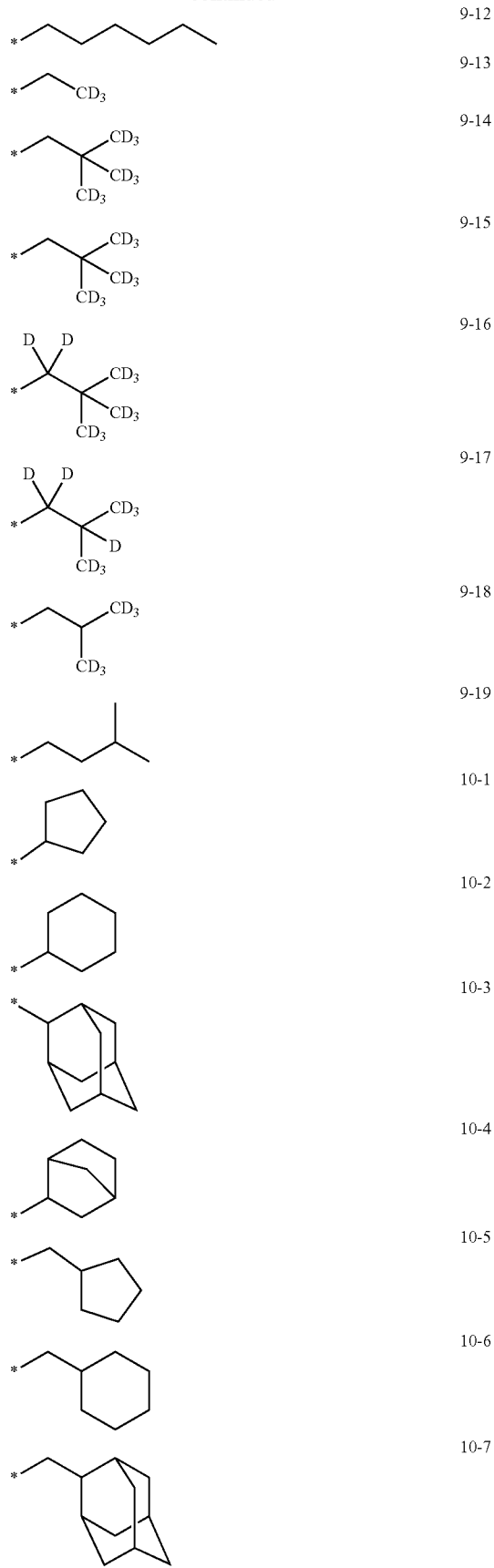

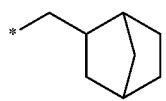
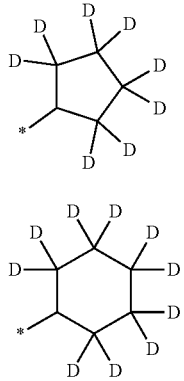
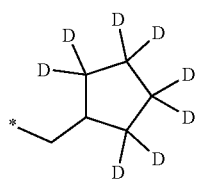
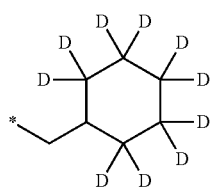
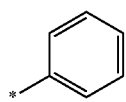
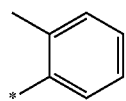
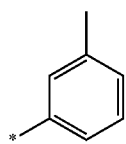
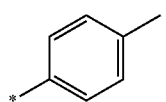
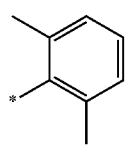
10-8
10-9
10-10
10-11
10-12
10-13
10-14
10-15
10-16
10-17
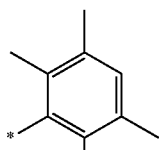
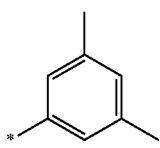
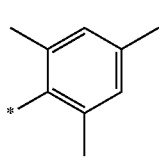
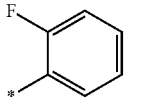
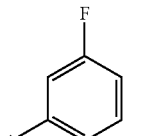
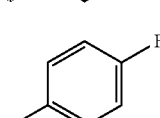
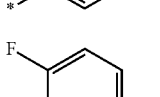
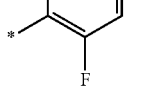
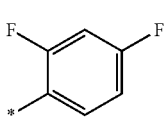
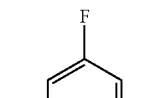
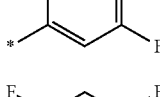
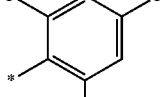
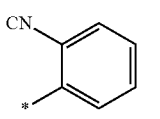
10-18
10-19
10-20
10-21
10-22
10-23
10-24
10-25
10-26
10-27
10-28

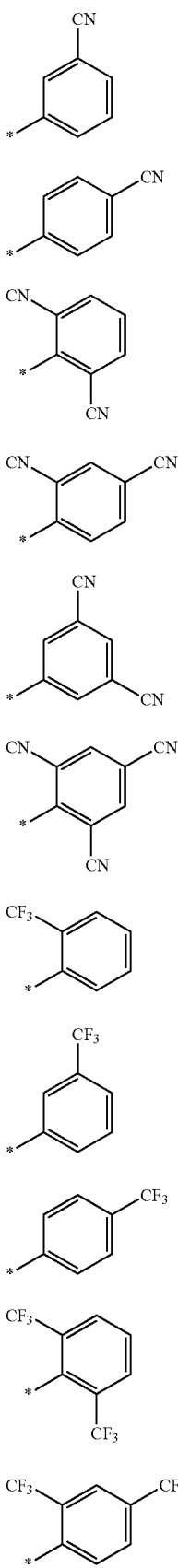
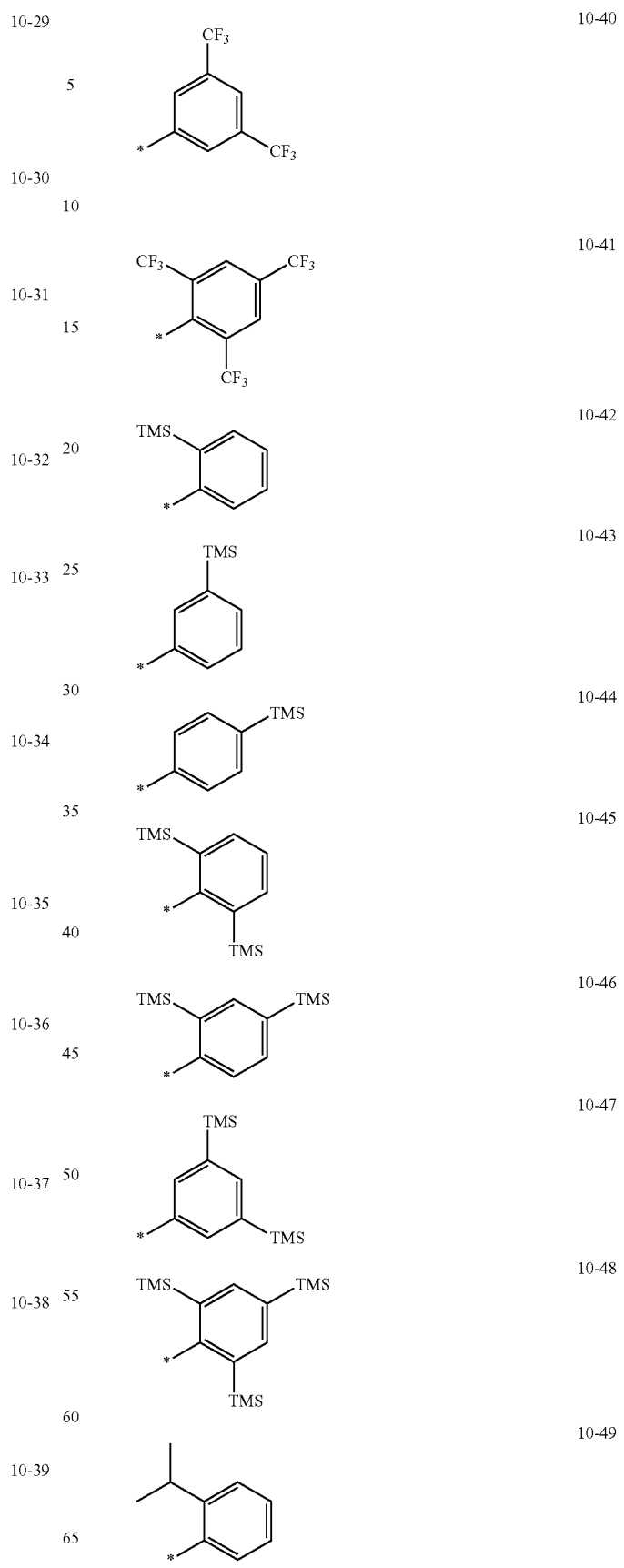

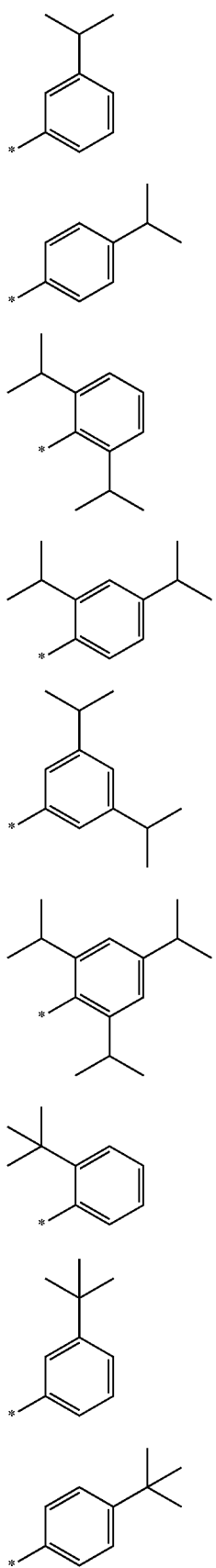
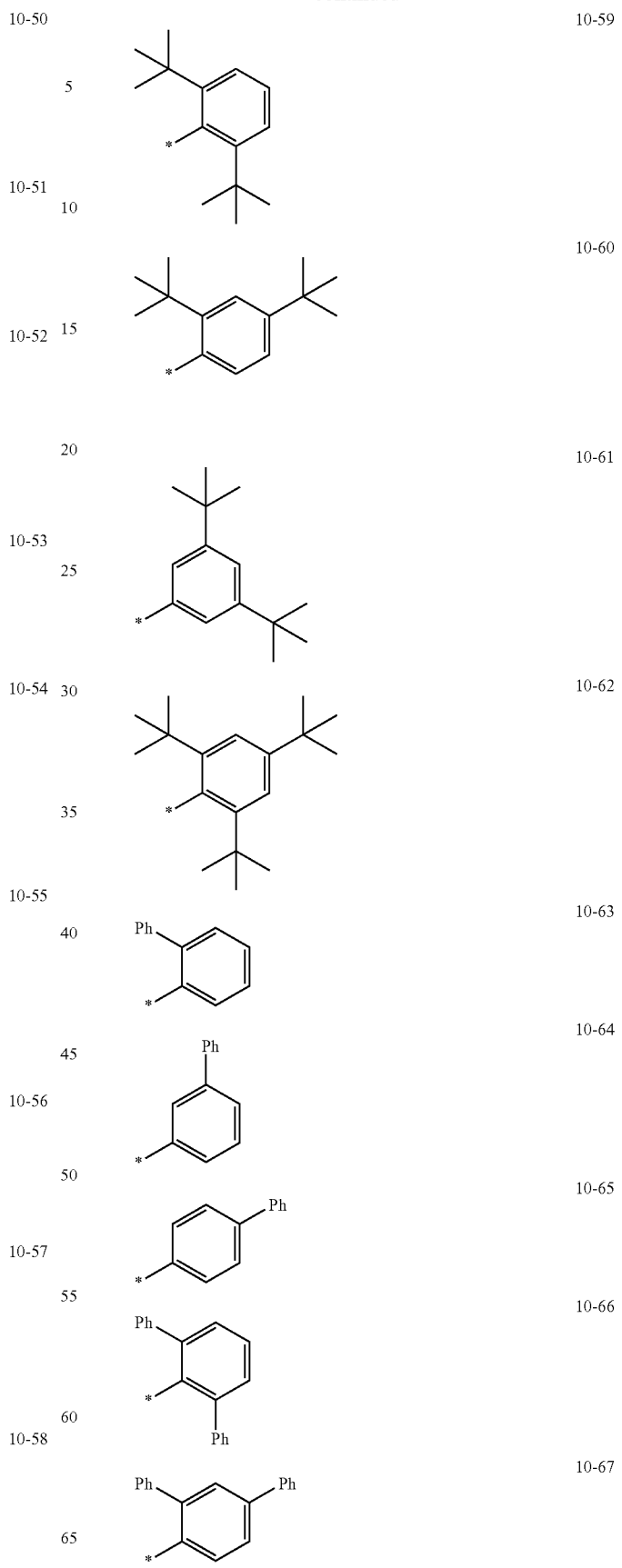

10-68 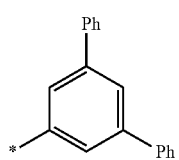
10-69 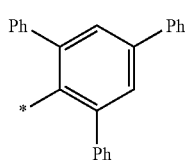
10-70 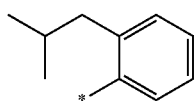
10-71 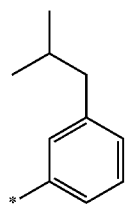
10-72 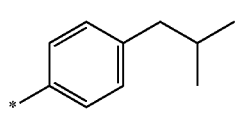
10-73 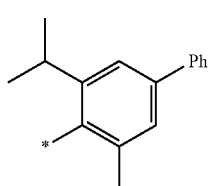
10-74 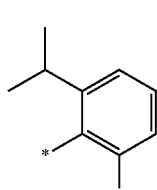
10-75 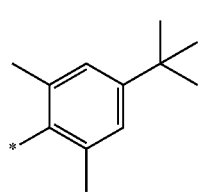
10-76 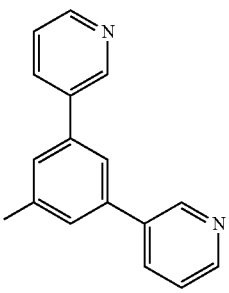
10-77 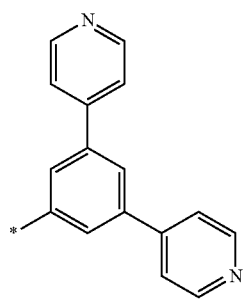
10-78 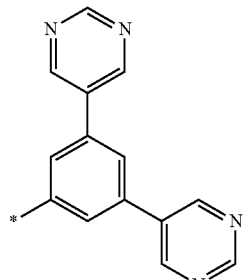
10-79 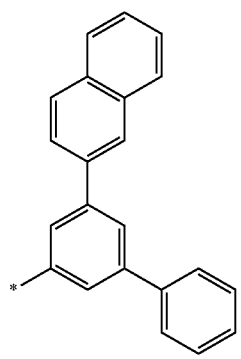
10-80 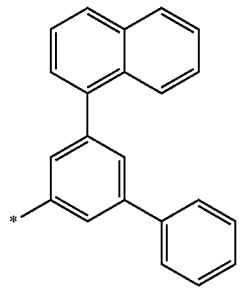

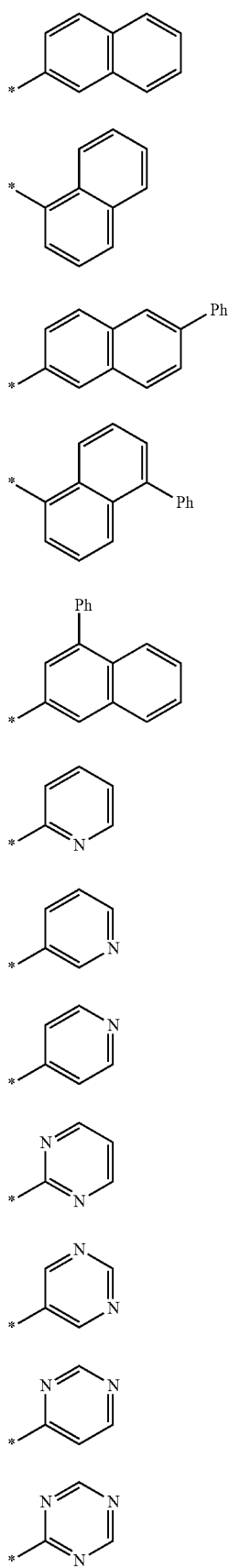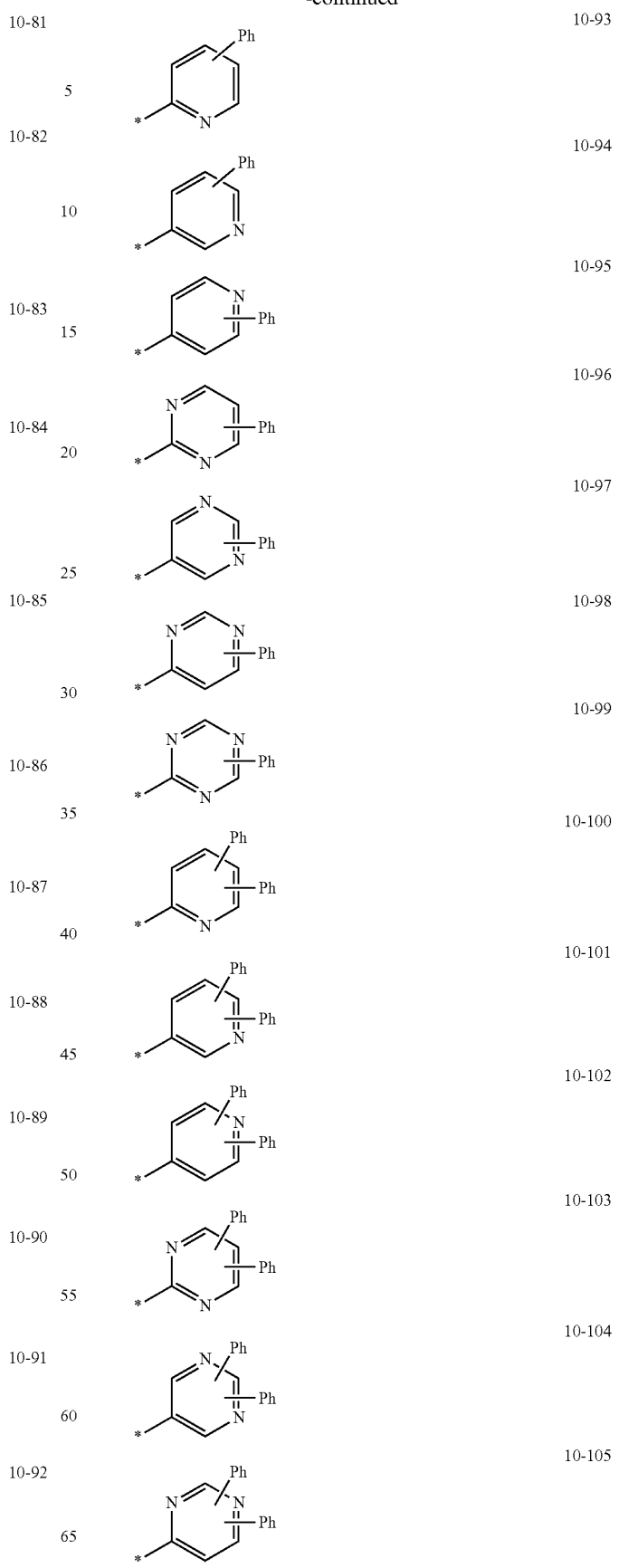

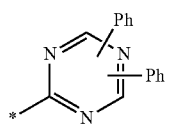
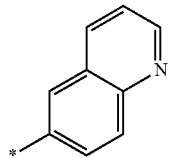
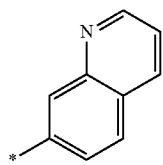
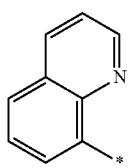
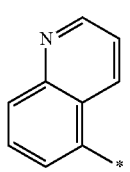
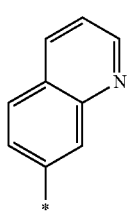
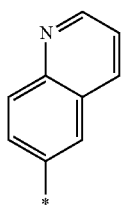
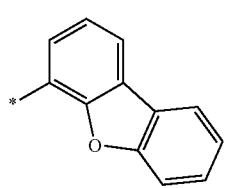
10-106
10-107
10-108
10-109
10-110
10-111
10-112
10-113
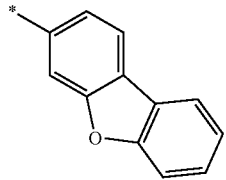
10-114
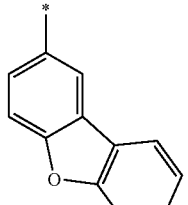
10-115
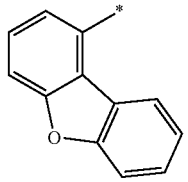
10-116
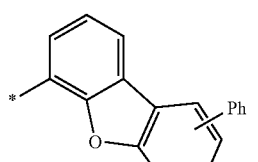
10-117
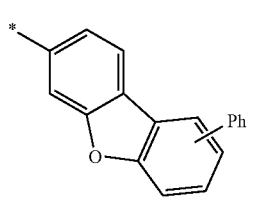
10-118
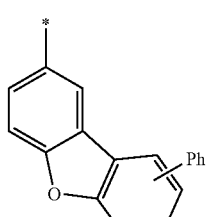
10-119
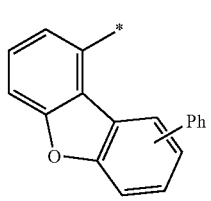
10-120
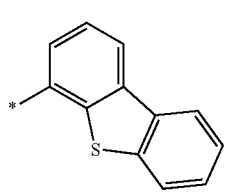
10-121

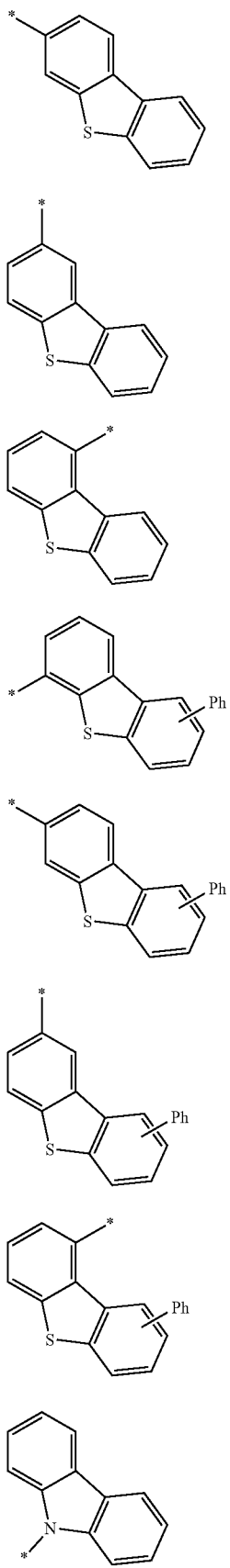
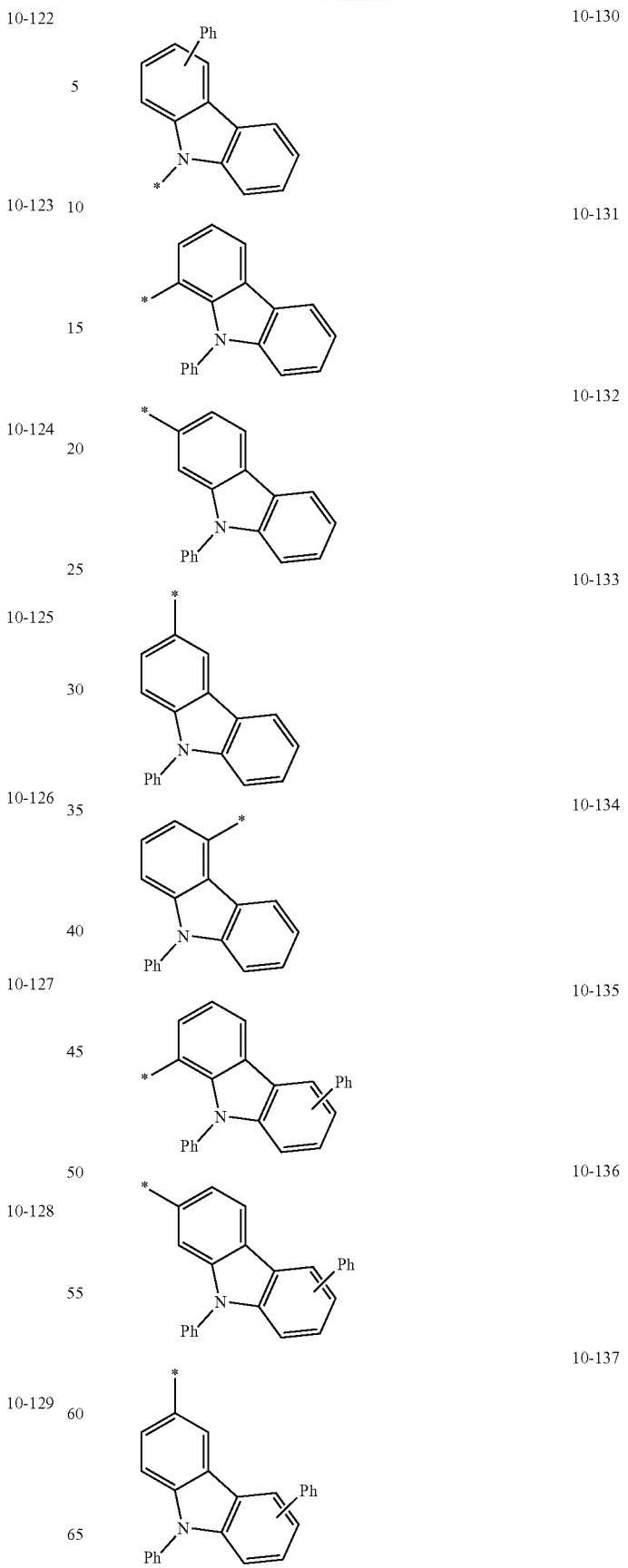

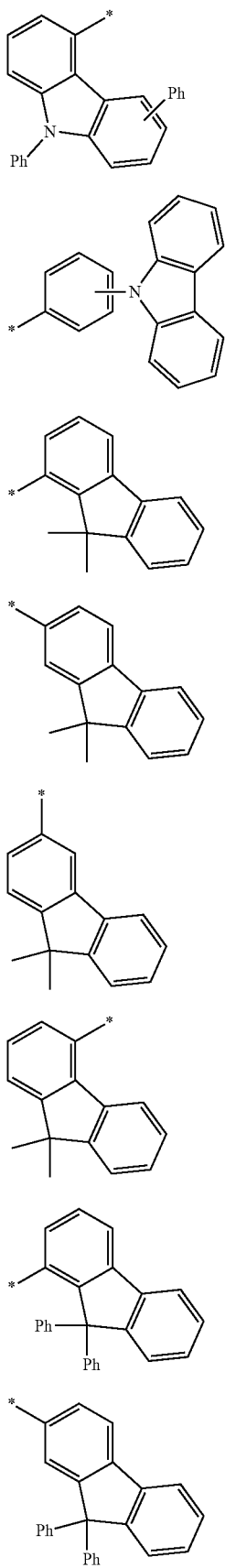
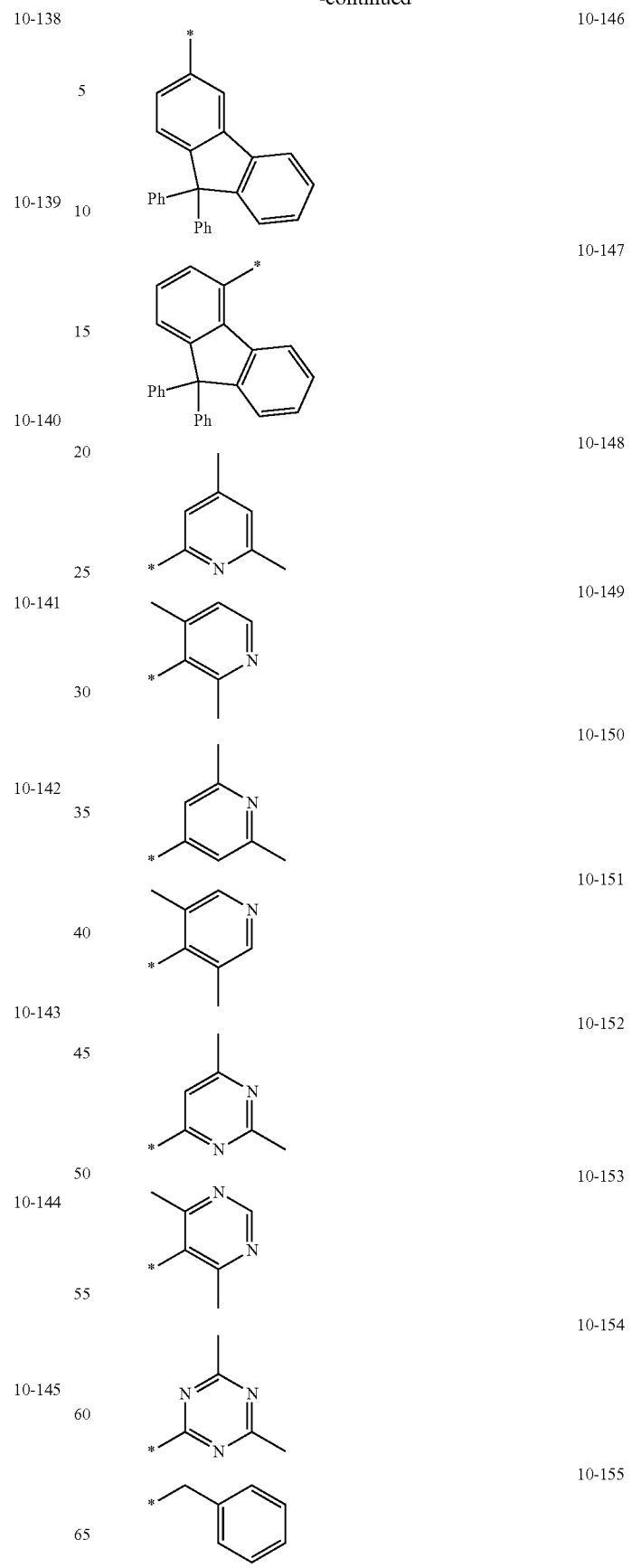

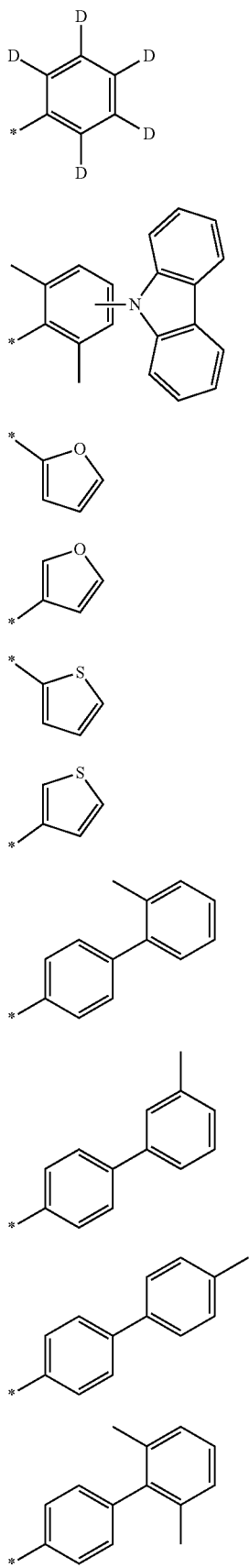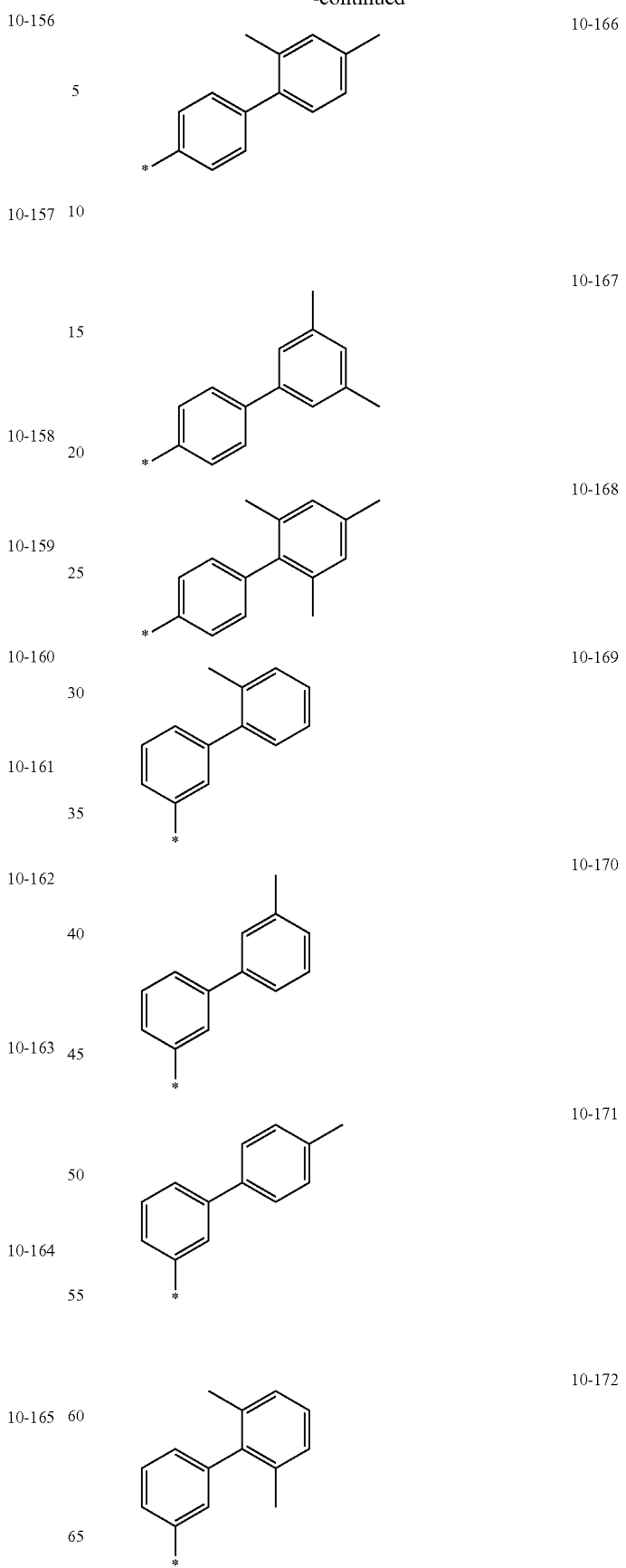

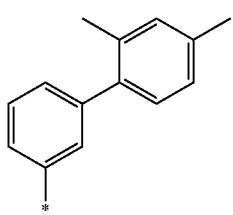
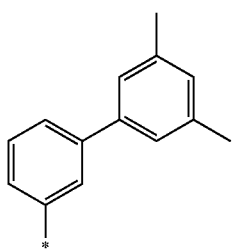
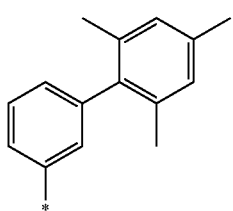
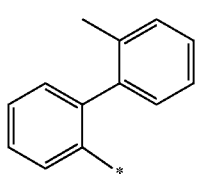
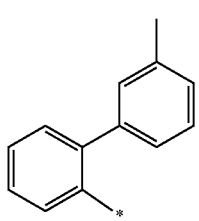
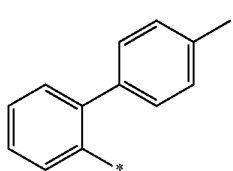
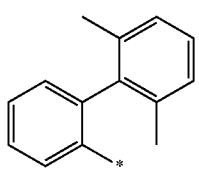
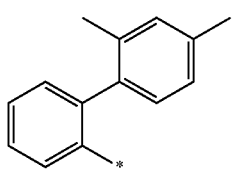
10-173
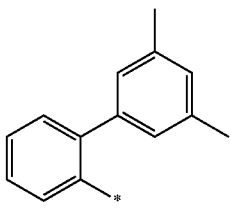
10-174
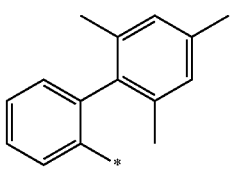
10-175
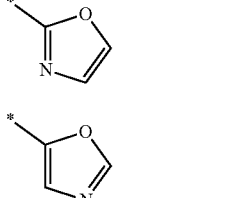
10-176
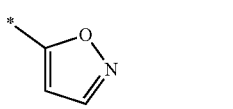
10-177
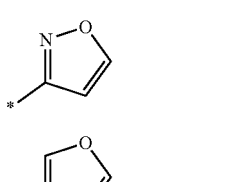
10-178
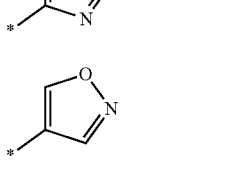
10-179
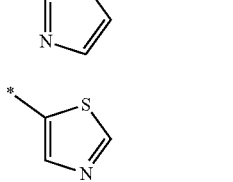
10-180
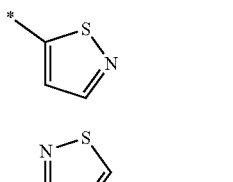
10-181
10-182
10-183
10-184
10-185
10-186
10-187
10-188
10-189
10-190
10-191
10-192
10-193
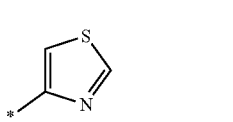

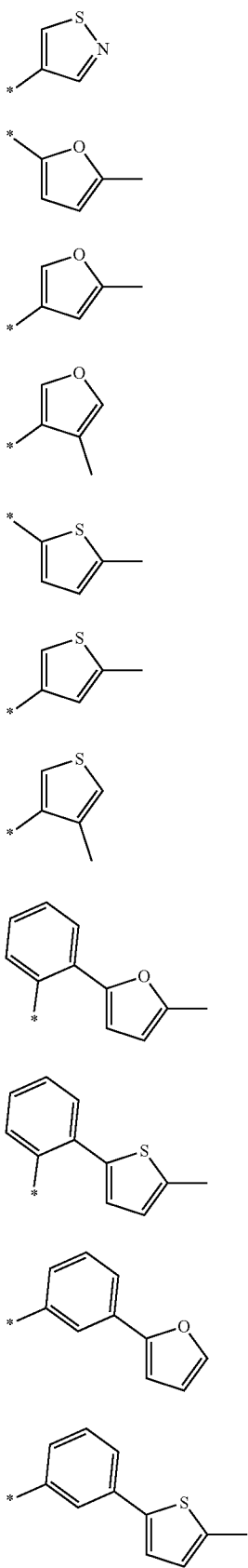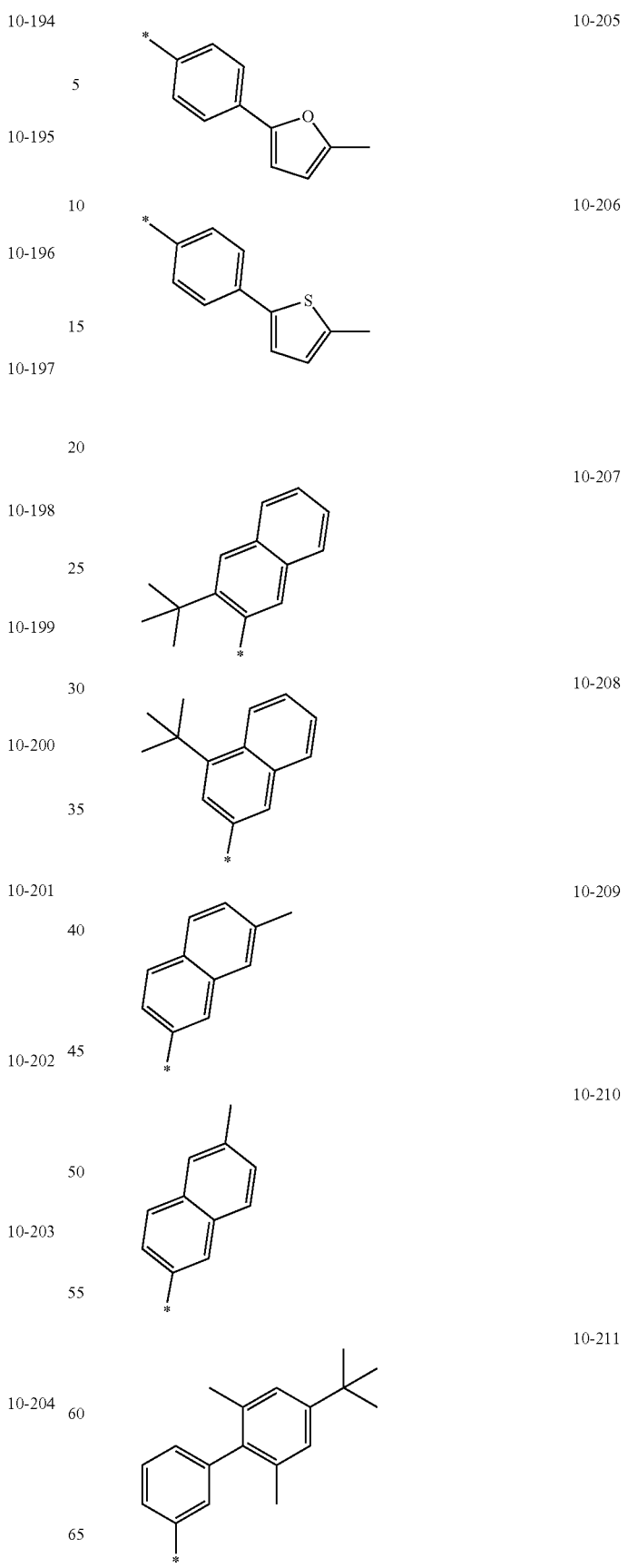

-continued
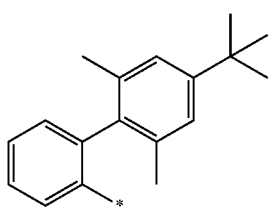
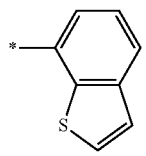
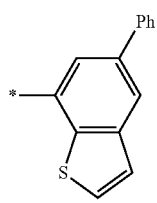
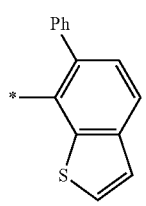
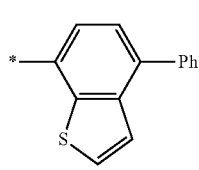
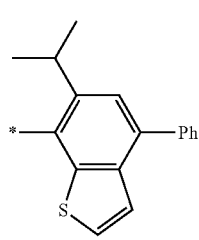
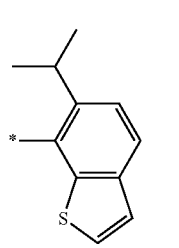
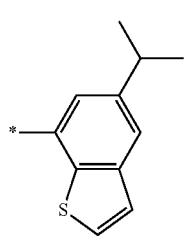
-continued
10-212
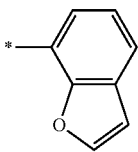
10-213
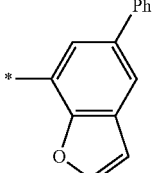
10-214
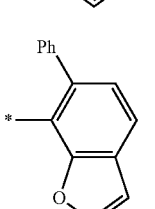
10-215
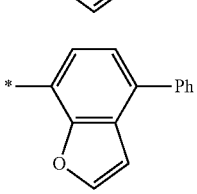
10-216
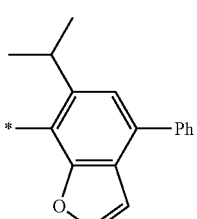
10-217
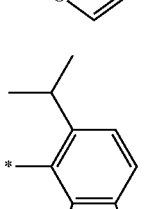
10-218
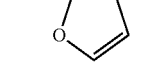
10-219
10-220
10-221
10-222
10-223
10-224
10-225
10-226
10-227
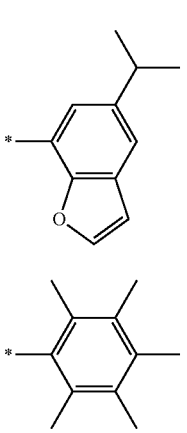

-continued
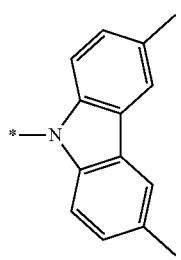
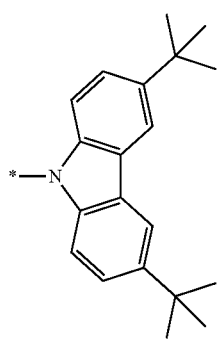
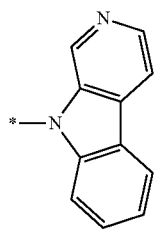
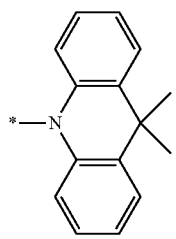
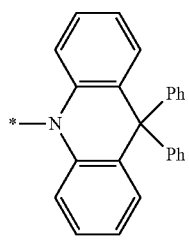
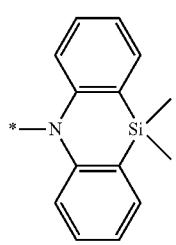
-continued
10-228
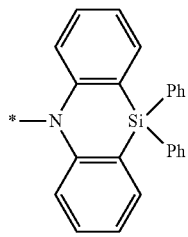
10-229
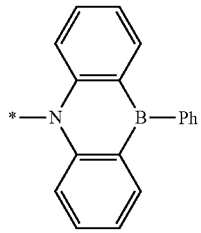
10-230
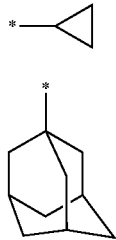
10-231
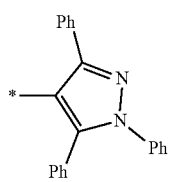
10-232
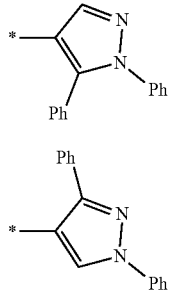
10-233
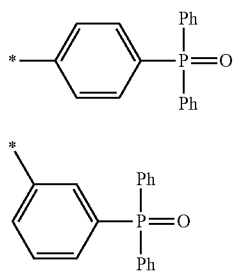
10-234
10-235
10-236
10-237
10-238
10-239
10-240
10-241
10-242
10-243
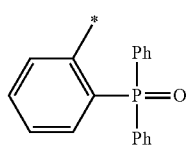

-continued

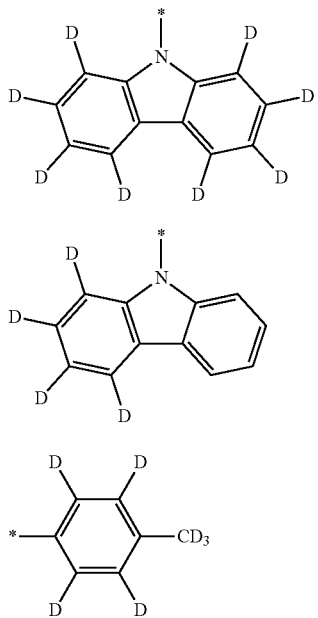

10-244

10-245

10-246 wherein, in Formulae 9-1 to 9-19 and 10-1 to 10-246, * indicates a binding site to an adjacent atom, "Ph" represents a phenyl group, and "TMS" represents a trimethylsilyl group.

a71 to a74 in Formulae 3-1 to 3-5 respectively indicate numbers of $R_{71}$ to $R_{74}$, and may each independently be an integer from 0 to 20. When a71 is 2 or more, two or more of $R_{71}$ (S) may be identical to or different from each other, when a72 is 2 or more, two or more of $R_{72}(5)$ may be identical to or different from each other, when a73 is 2 or more, two or more of $R_{73}(5)$ may be identical to or different from each other, and when a74 is 2 or more, two or more of $R_{74}(5)$ may be identical to or different from each other. a71 to a74 may each independently be an integer from 0 to 8.

In Formula 1, i) two or more of $R_1$(s) in the number of a1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) two or more of $R_2$(s) in the number of a2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) two or more of $R_3$(s) in the number of a3 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iv) two or more of $R_4$(s) in the number of a4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, v) $R_{5a}$ and $R_{5b}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vi) $R_{6a}$ and $R_{6b}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vii) $R_{7a}$ and $R_{7b}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formulae 3-1 to 3-5, $L_{81}$ to $L_{85}$ may each independently be:

a single bond; or

*—$C(Q_4)(Q_5)$-*' or *—$Si(Q_4)(Q_5)$-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formulae 3-1 and 3-2, a group represented by

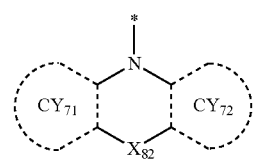

may be represented by one selected from Formulae CY71-1(1) to CY71-1(8) and/or, in Formulae 3-1 and 3-3, a group represented by

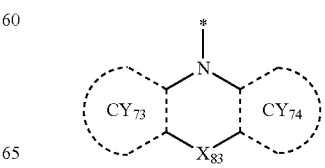

may be represented by one selected from Formulae CY71-2(1) to CY71-2(8) and/or, in Formulae 3-2 and 3-4, a group represented by

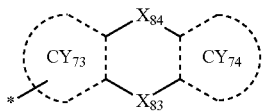

may be represented by one selected from Formulae CY71-3(1) to CY71-3(32) and/or, in Formulae 3-3 to 3-5, a group represented by

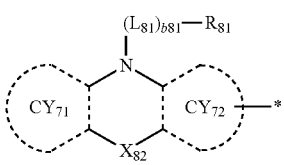

may be represented by one selected from Formulae CY71-4(1) to CY71-4(32), and/or in Formula 3-5, a group represented by

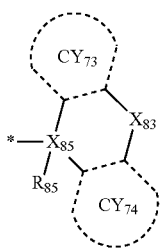

may be represented by one selected from Formulae CY71-5(1) to CY71-5(8):

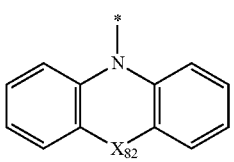

CY71-1(1)

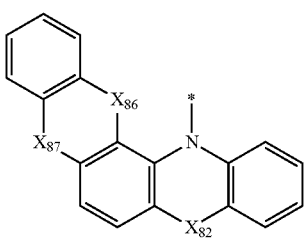

CY71-1(2)

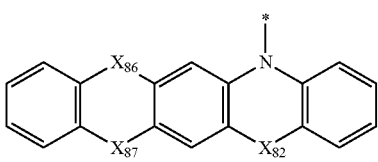

CY71-1(3)

-continued

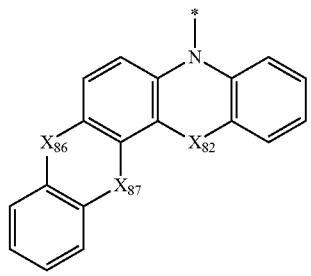

CY71-1(4)

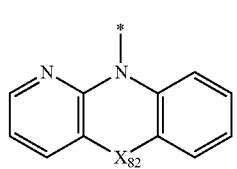

CY71-1(5)

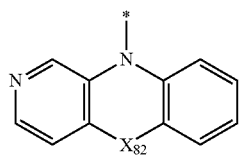

CY71-1(6)

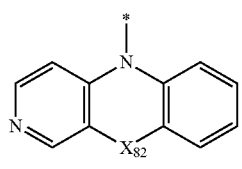

CY71-1(7)

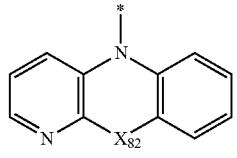

CY71-1(8)

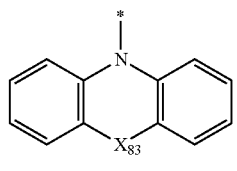

CY71-2(1)

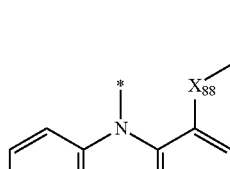

CY71-2(2)

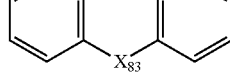

CY71-2(3)

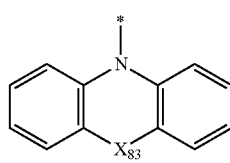

CY71-2(4)
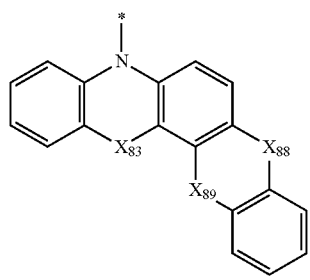
CY71-2(5)
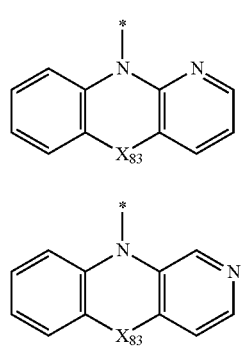
CY71-2(6)
CY71-2(7)
CY71-2(8)
CY71-3(1)
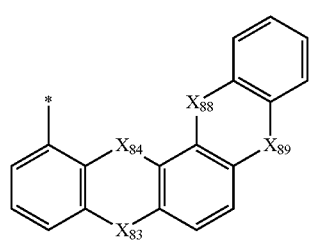
CY71-3(2)
CY71-3(3)
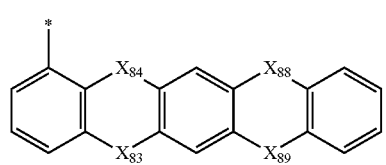
CY71-3(4)
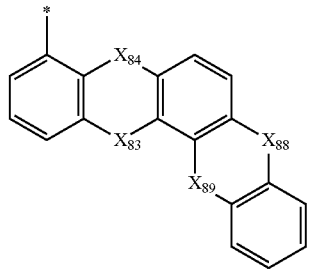
CY71-3(5)
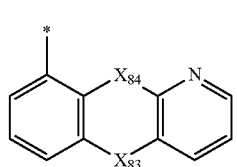
CY71-3(6)
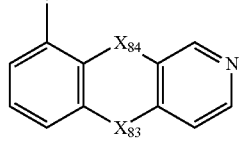
CY71-3(7)
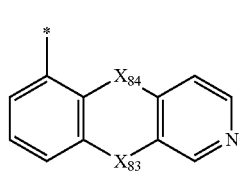
CY71-3(8)
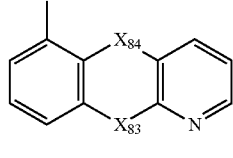
CY71-3(9)
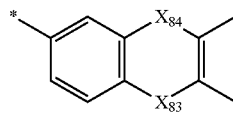
CY71-3(10)
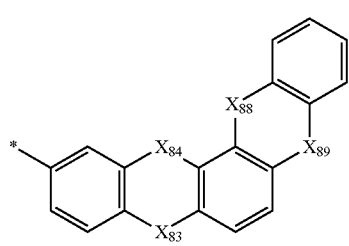
CY71-3(11)
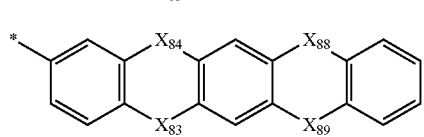

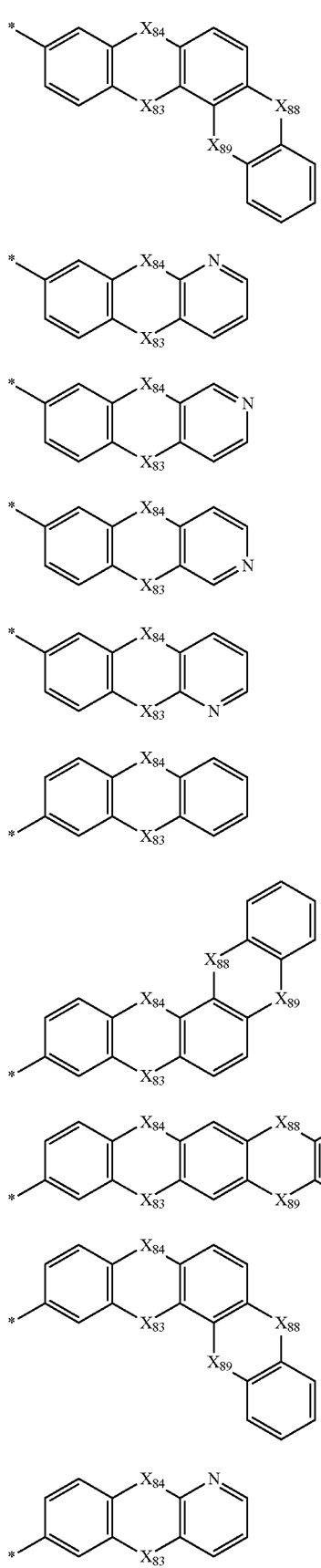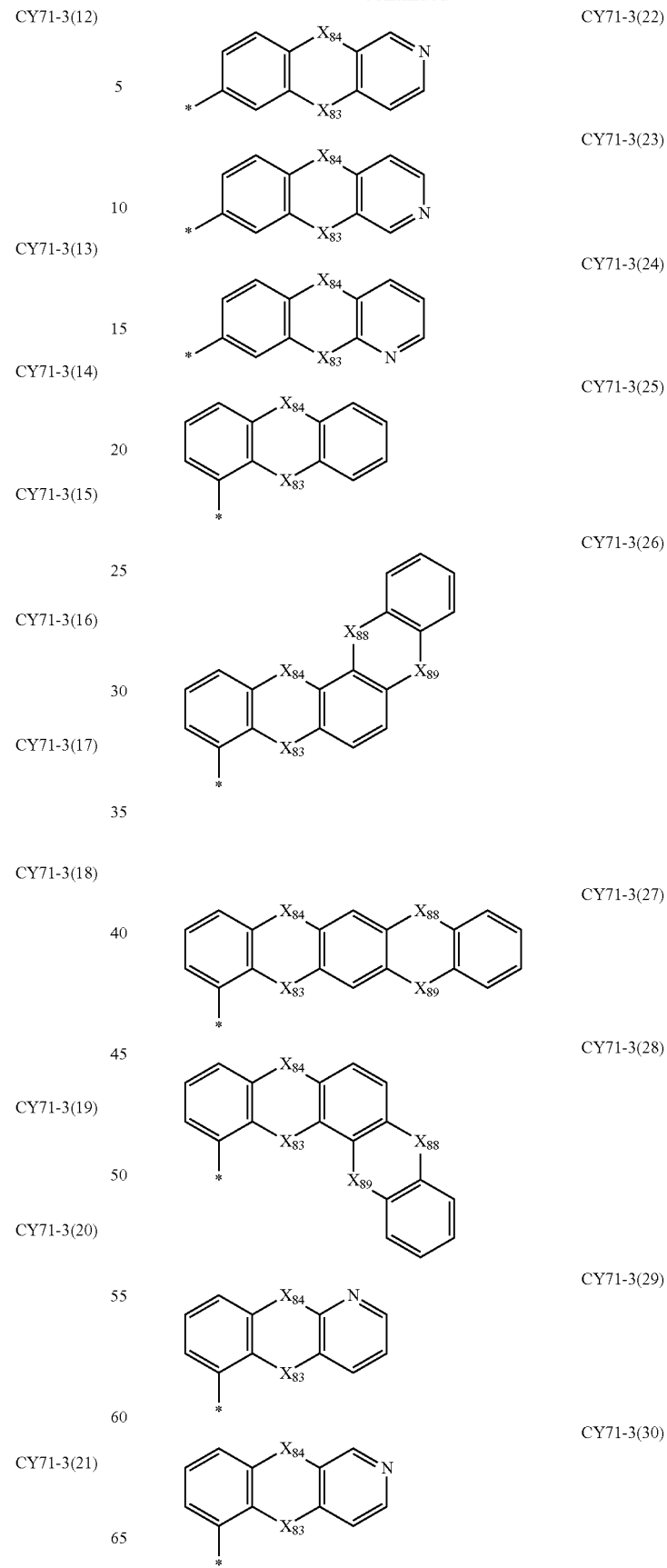

-continued
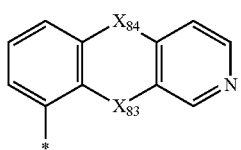
CY71-3(31)
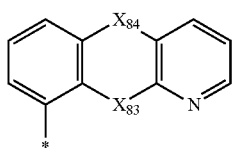
CY71-3(32)
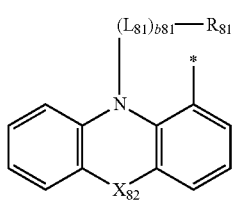
CY71-4(1)
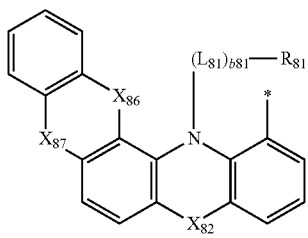
CY71-4(2)
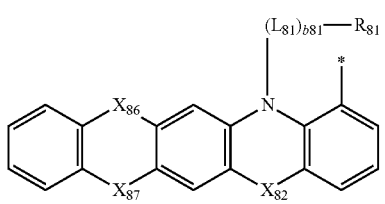
CY71-4(3)
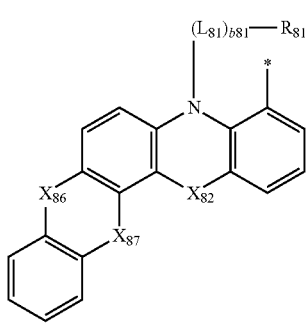
CY71-4(4)
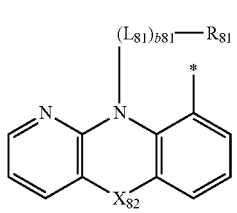
CY71-4(5)
-continued
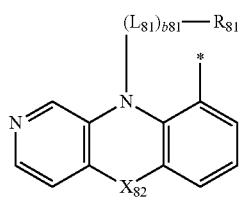
CY71-4(6)
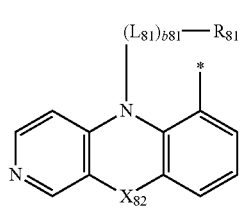
CY71-4(7)
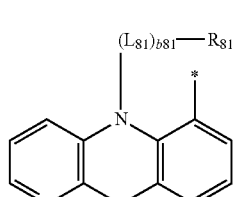
CY71-4(8)
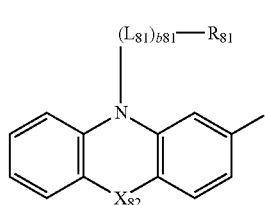
CY71-4(9)
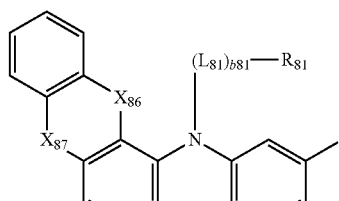
CY71-4(10)
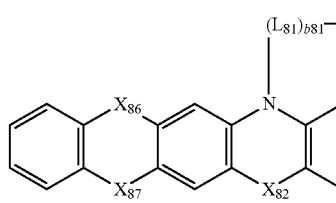
CY71-4(11)
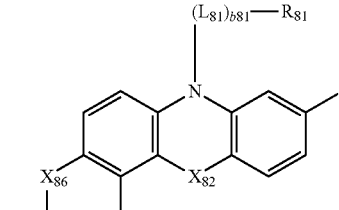
CY71-4(12)

CY71-4(13)
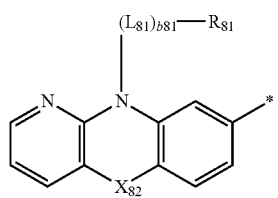
CY71-4(14)
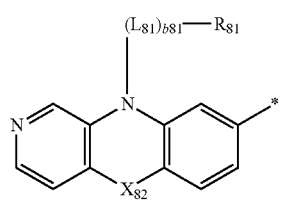
CY71-4(15)
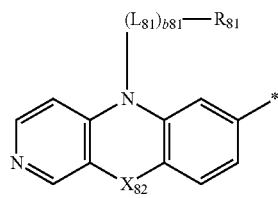
CY71-4(16)
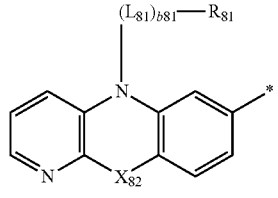
CY71-4(17)
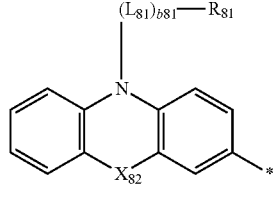
CY71-4(18)
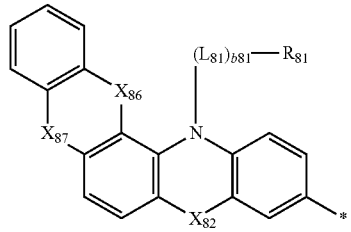
CY71-4(19)
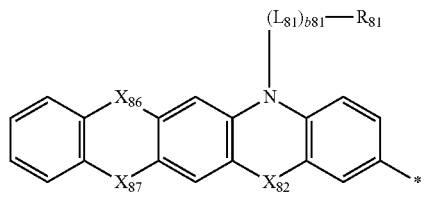
CY71-4(20)
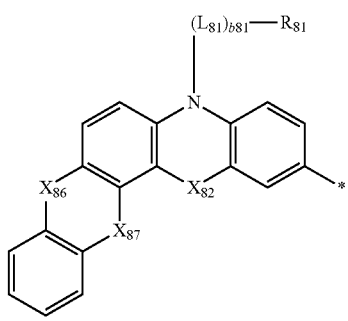
CY71-4(21)
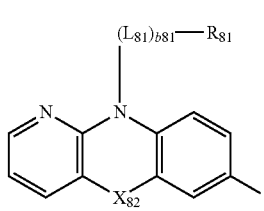
CY71-4(22)
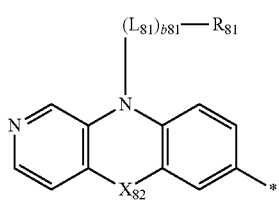
CY71-4(23)
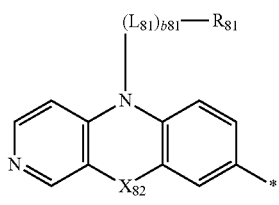
CY71-4(24)
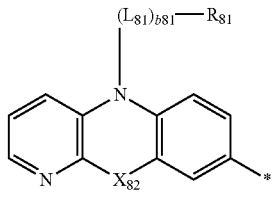
CY71-4(25)
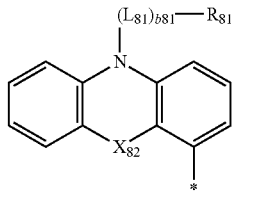
CY71-4(26)
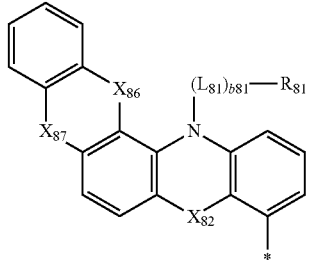

CY71-4(27)

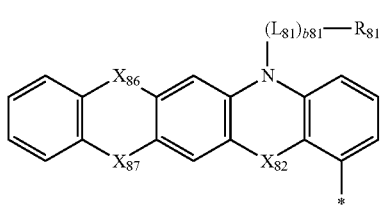

CY71-4(28)

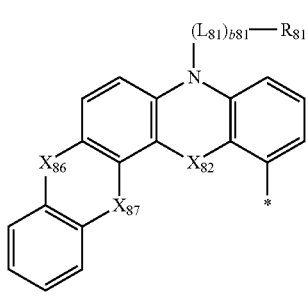

CY71-4(29)

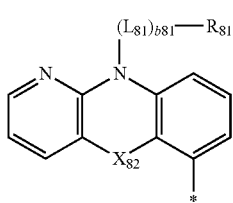

CY71-4(30)

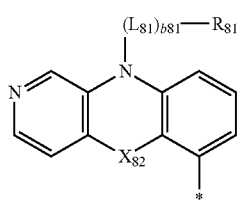

CY71-4(31)

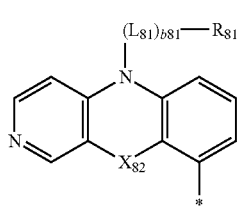

CY71-4(32)

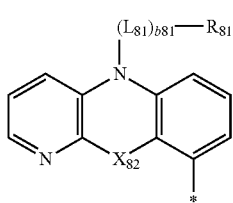

CY71-5(1)

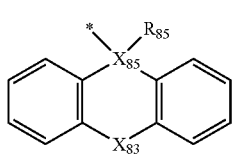

CY71-5(2)

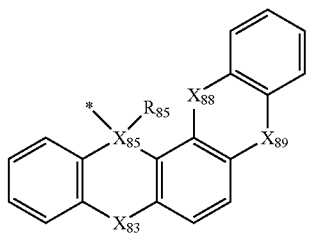

CY71-5(3)

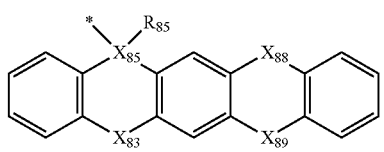

CY71-5(4)

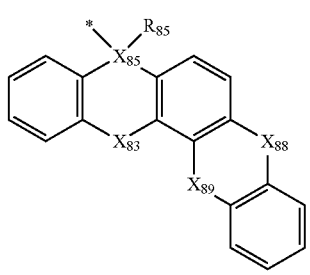

CY71-5(5)

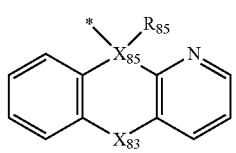

CY71-5(6)

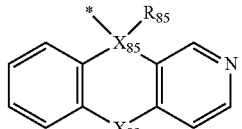

CY71-5(7)

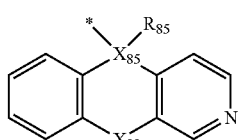

CY71-5(8)

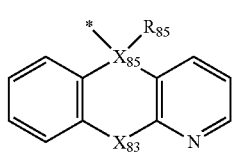

wherein, in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ may respectively be understood by referring to the descriptions of $X_{81}$ to $X_{85}$, $L_{81}$, b81, $R_{81}$, and $R_{85}$ provided herein, $X_{86}$ may be a single bond, O, S, N($R_{86}$), B($R_{86}$), C($R_{86a}$)($R_{86b}$), or Si($R_{86a}$)($R_{86b}$), $X_{87}$ may be a single bond, O, S, N($R_{87}$), B($R_{87}$), C($R_{87a}$)($R_{87b}$), or Si($R_{87a}$)($R_{87b}$), in Formulae CY71-1(1) to CY71-1(8) and CY71-4(1) to CY71-4(32), $X_{86}$ and $X_{87}$ may not be a single bond at the same time, $X_{88}$ may be a single bond, O, S, N($R_{88}$), B($R_{88}$), C($R_{88a}$)($R_{88b}$), or Si($R_{88a}$)($R_{88b}$), $X_{89}$ may be a single bond, O, S, N($R_{89}$), B($R_{89}$), C($R_{89a}$)($R_{89b}$), or Si($R_{89a}$)($R_{89b}$), in Formulae CY71-2(1) to CY71-2(8), CY71-3(1) to CY71-3(32), and CY71-5(1) to CY71-5(8), $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each be understood by referring to the description of $R_{81}$ provided herein.

COMPOUND EXAMPLE

In an embodiment, the first emitter or the organometallic compound represented by Formula 1 may be one selected from Compounds PD01 to PD12:

PD01

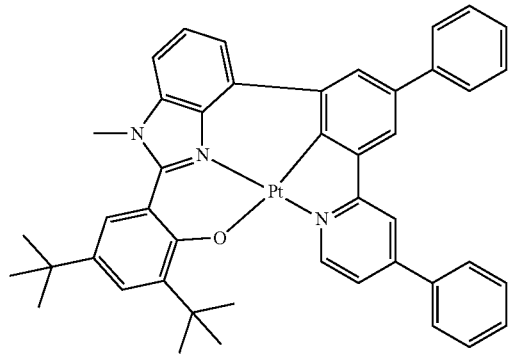

PD02

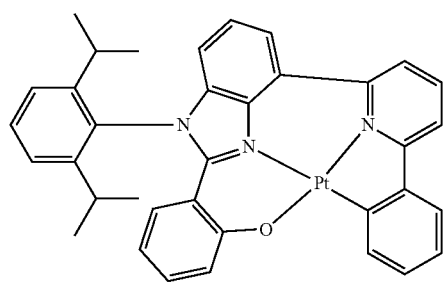

PD03

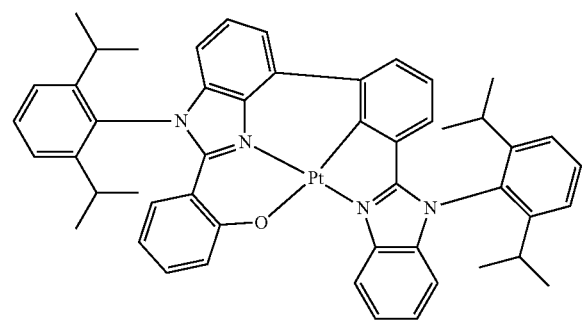

PD04

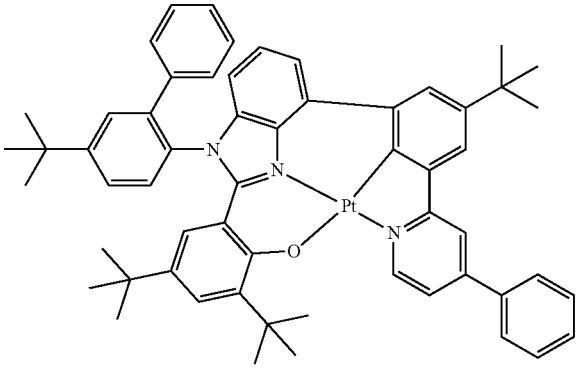

PD05

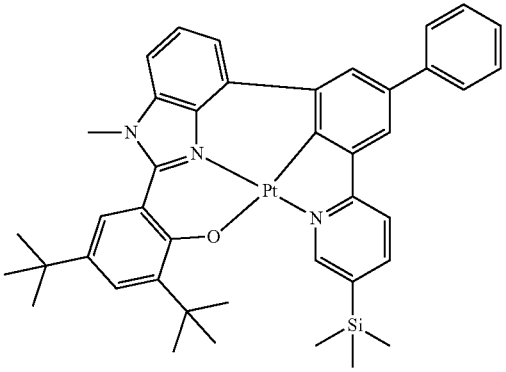

PD06

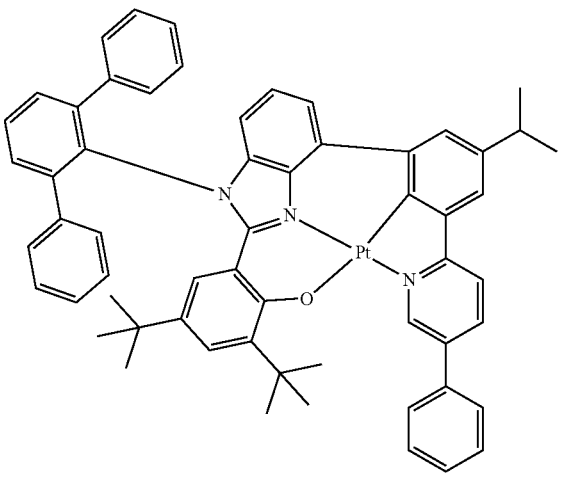

-continued
PD07
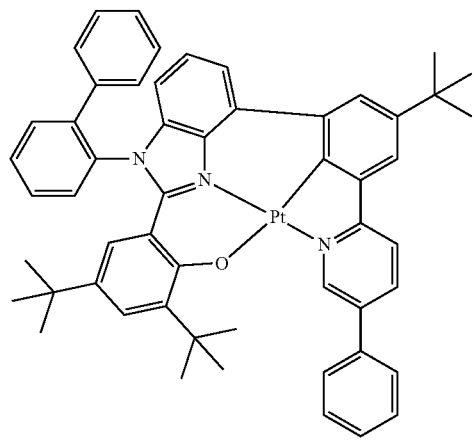
PD08
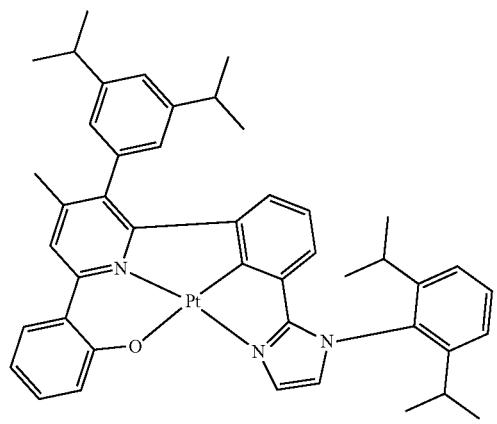
PD09
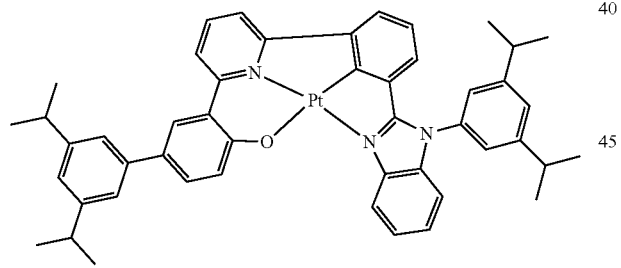
PD10
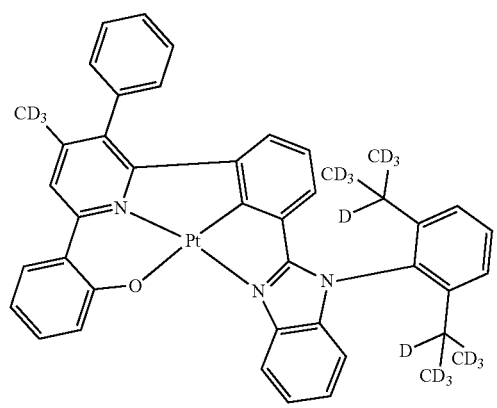
-continued
PD11
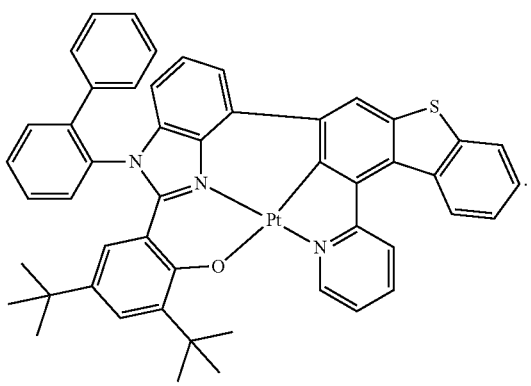
PD12
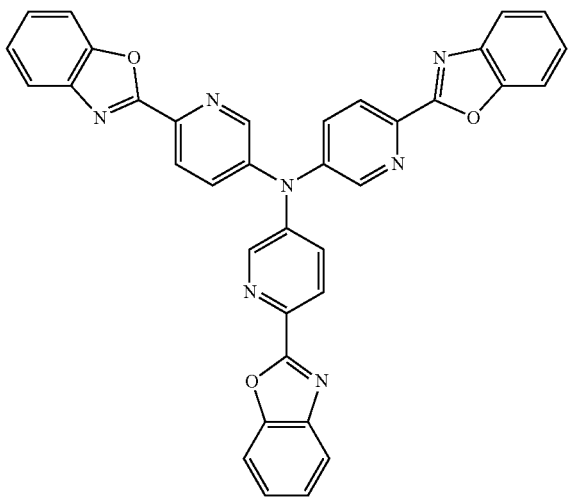
In an embodiment, the amine-containing compound may be one selected from Compounds CP01 to CP12:
CP01

-continued
CP02
CP03
CP04
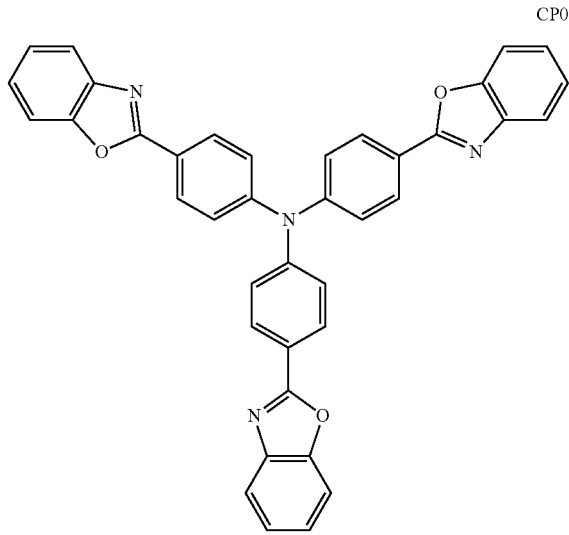
CP05
CP06
CP07
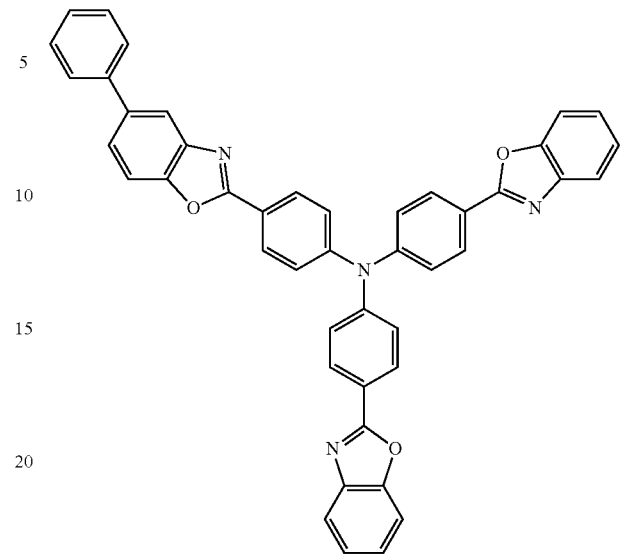

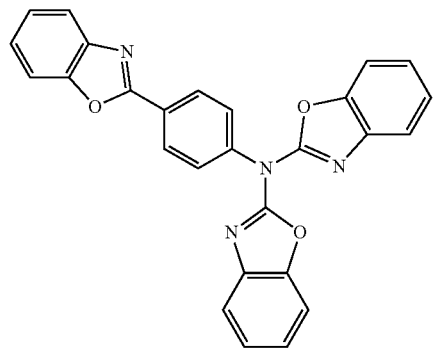

CP08

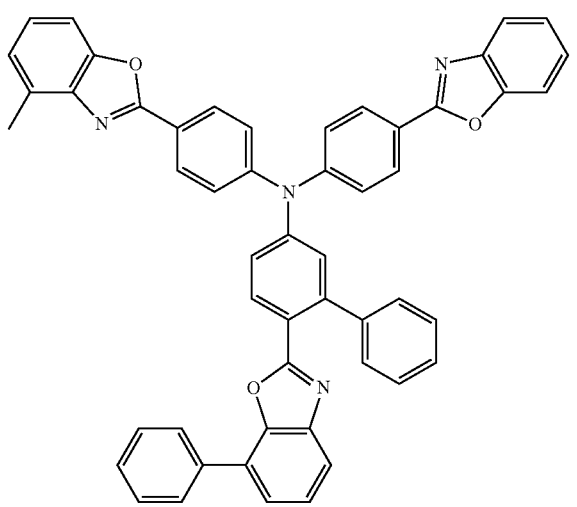

CP09

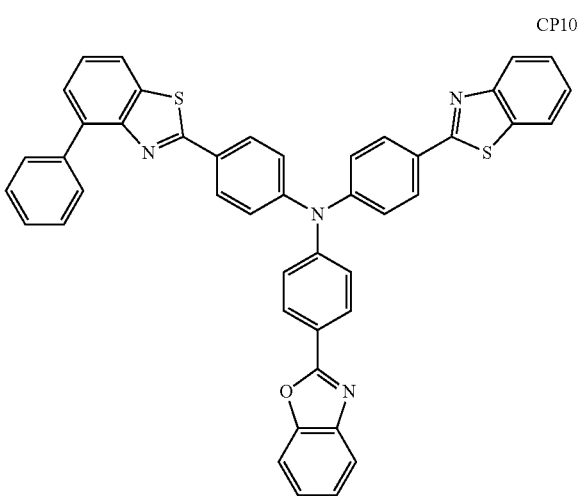

CP10

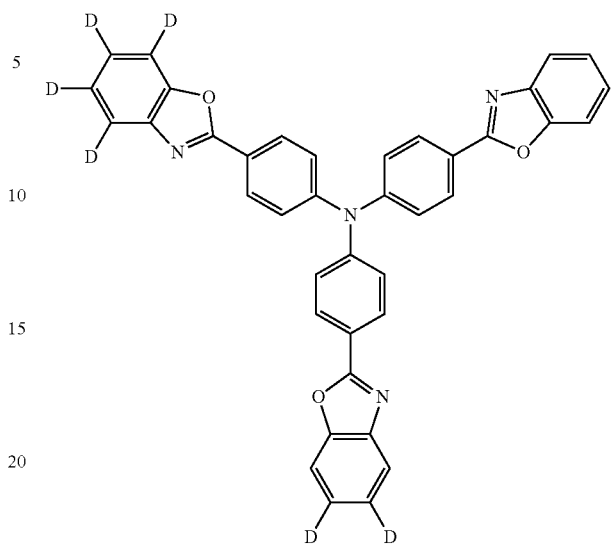

CP11

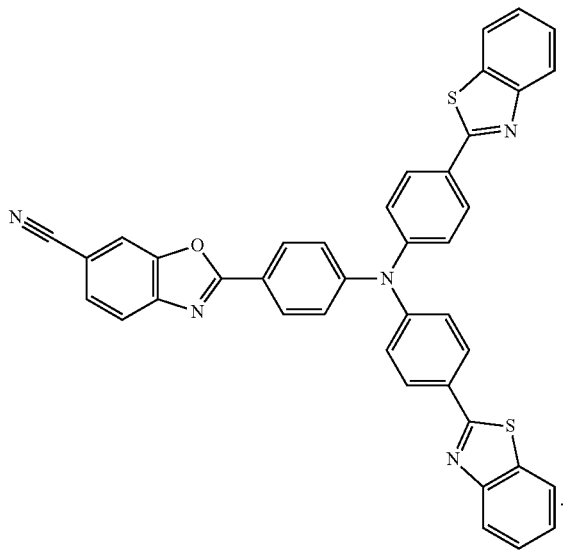

CP12

Description of FIG. 1

FIG. 1 is a schematic cross-sectional view of a light-emitting device 10 according to an embodiment. The light-emitting device 10 includes a first electrode 110, an interlayer 130, a second electrode 150, and a second capping layer 170.

Hereinafter, the structure of the light-emitting device 10 according to an embodiment and a method of manufacturing the light-emitting device 10 will be described with reference to FIG. 1.

First Electrode 110

Referring to FIG. 1, a substrate may be additionally under the first electrode 110 and/or above the second capping layer 170. As the substrate, a glass substrate and/or a plastic substrate may be used. In one or more embodiments, the substrate may be a flexible substrate, and may include plastics having excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide (SnO$_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include, in addition to various suitable organic materials, a metal-containing compound such as an organometallic compound, an inorganic material such as quantum dots, and/or the like.

In some embodiments, the interlayer 130 may include i) two or more emitting units sequentially stacked between the first electrode 110 and the second electrode 150 and ii) a charge generation layer between neighboring two emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, the layers of each structure being stacked sequentially from the first electrode 110.

The hole transport region may include a compound represented by Formula 201, a compound represented by Formula 202, or any combination thereof:

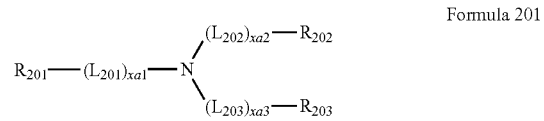

Formula 201

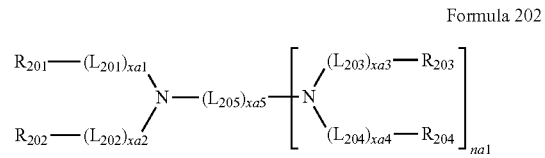

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N(Q$_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, see Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from groups represented by Formulae CY201 to CY217.

CY201

CY202

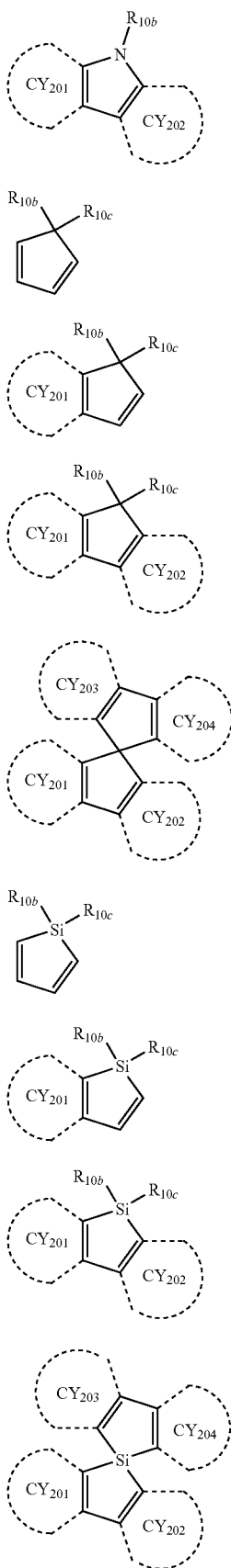

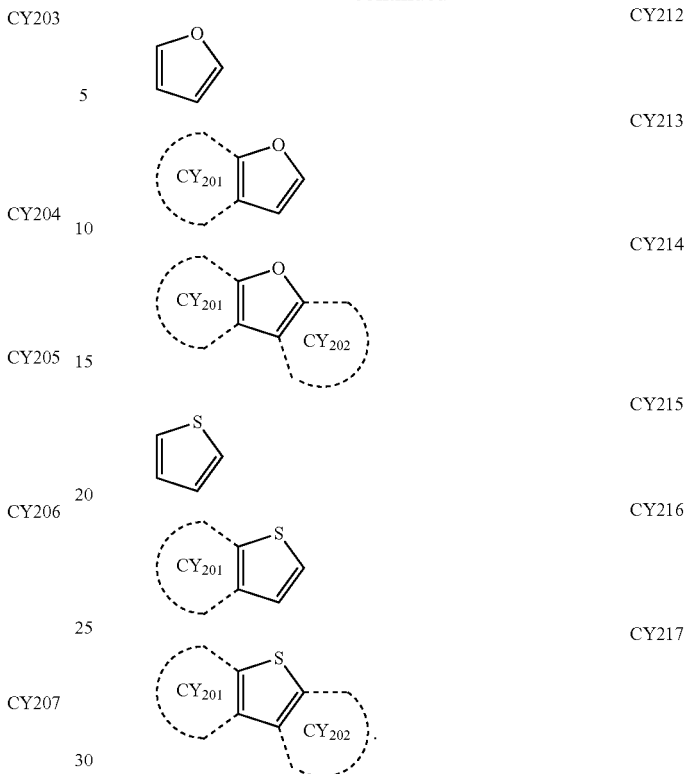

$R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one selected from groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{201}$ may be a group represented by one selected from Formulae CY201 to CY203, xa2 may be 0, and $R_{202}$ may be a group represented by one selected from Formulae CY204 to CY207.

In one or more embodiments, each of Formulae 201 and 202 may not include a group represented by one selected from Formulae CY201 to CY203.

In one or more embodiments, each of Formulae 201 and 202 may not include a group represented by one selected from Formulae CY201 to CY203, and may include at least one selected from the groups represented by Formulae CY204 to CY217.

In one or more embodiments, each of Formulae 201 and 202 may not include a group represented by one selected from Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:
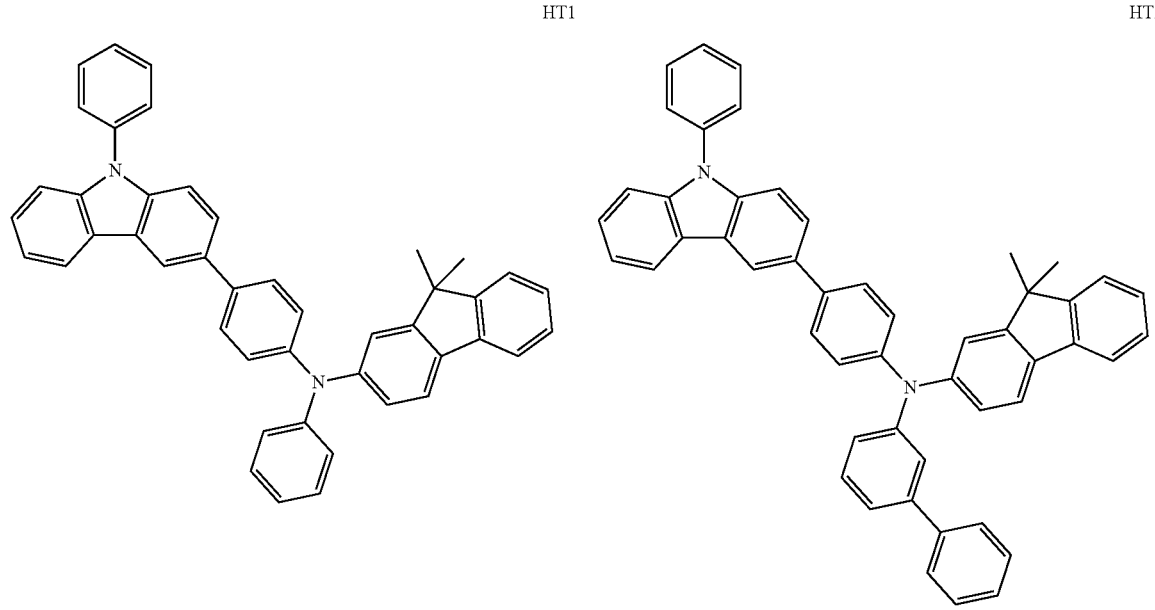
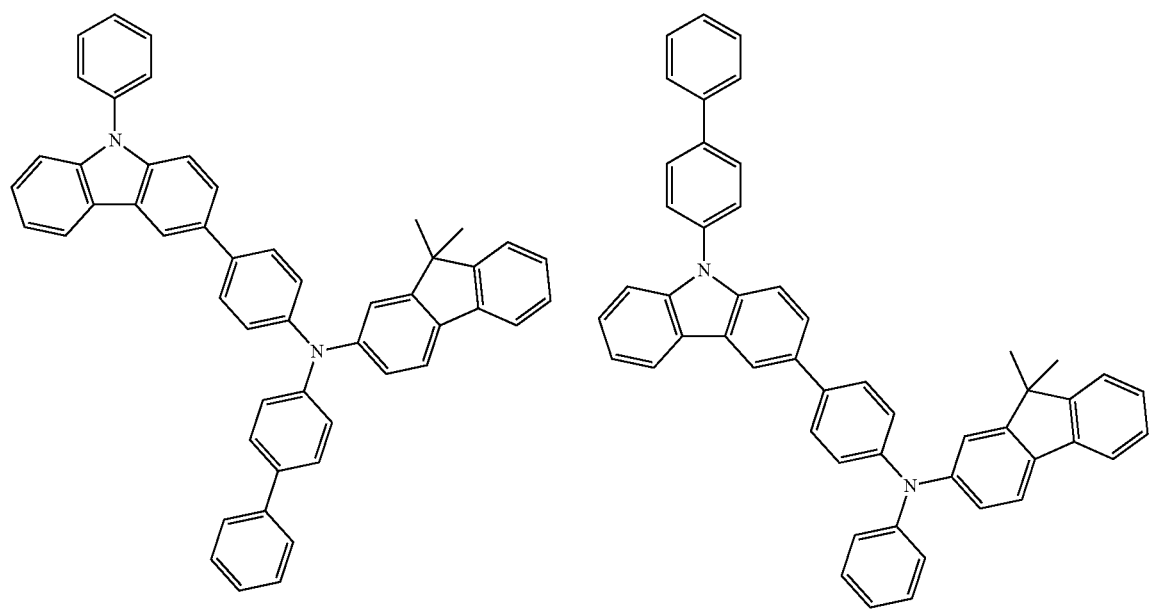

-continued
HT5
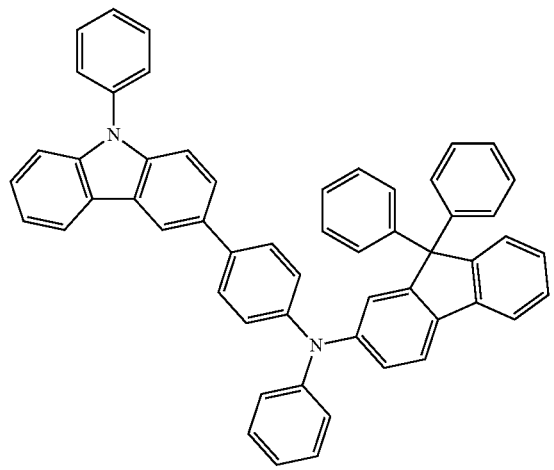
HT6
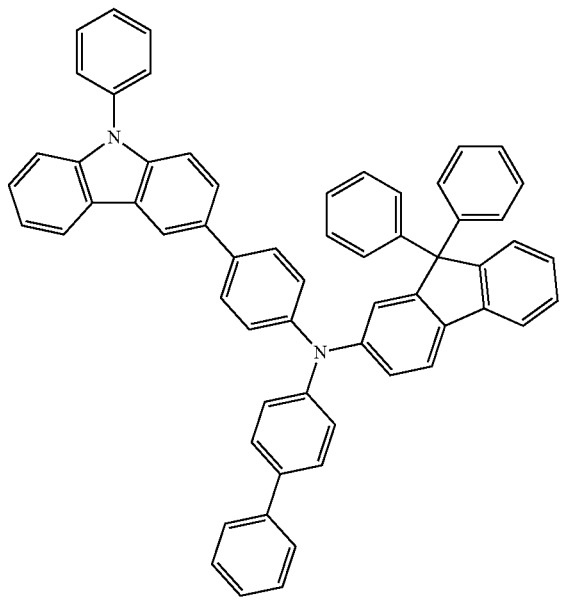
HT7
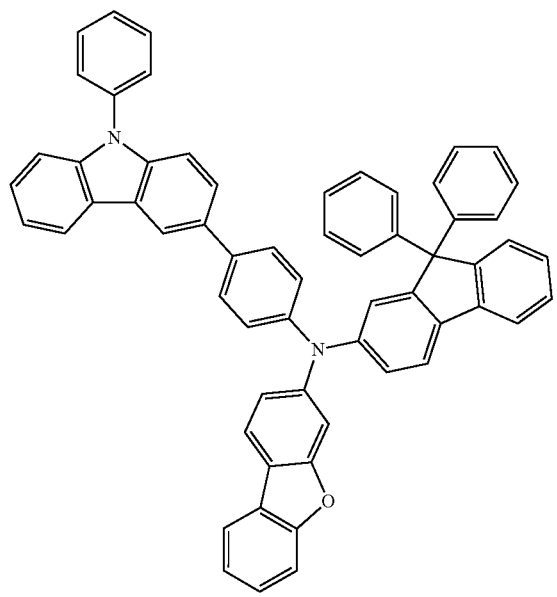
HT8
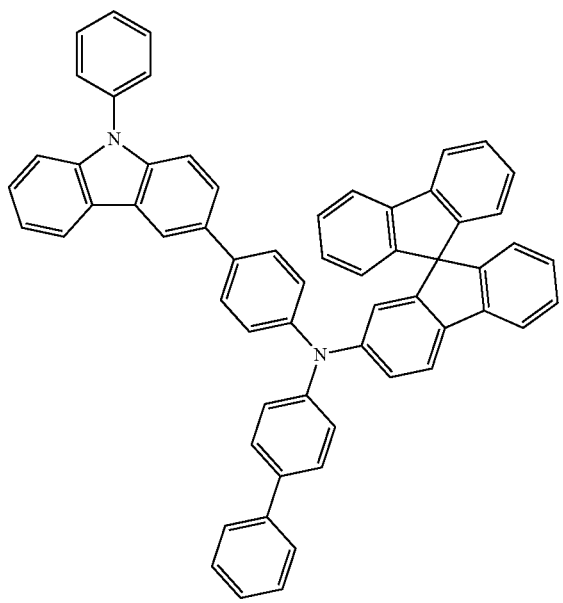

-continued
HT9
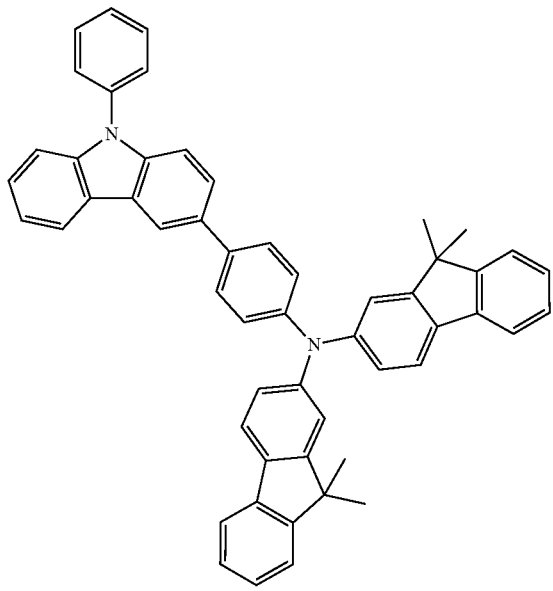
HT10
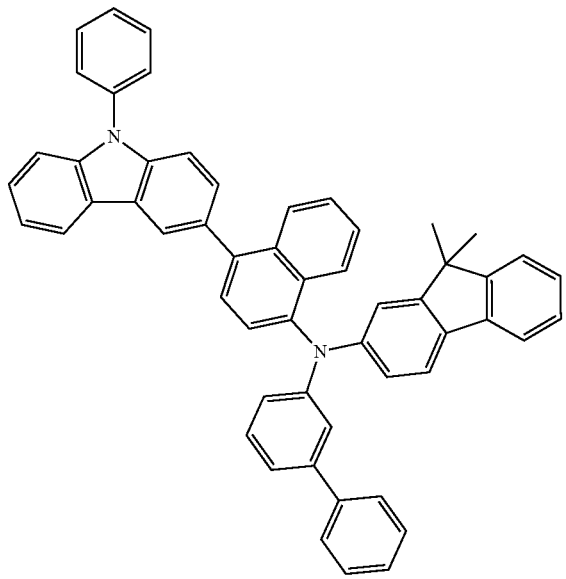
HT11
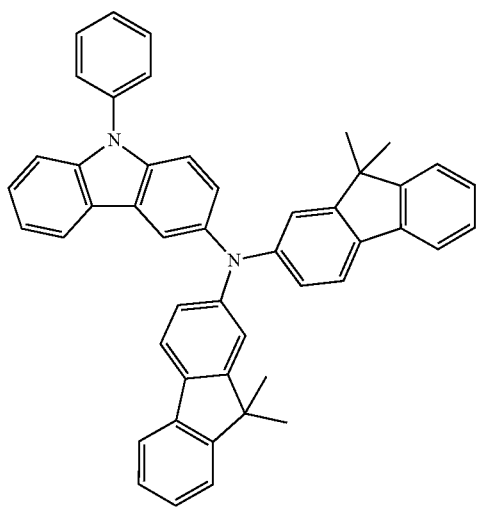
HT12
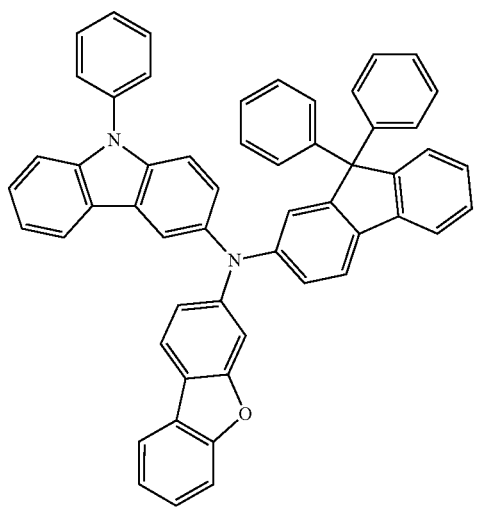

-continued
HT13
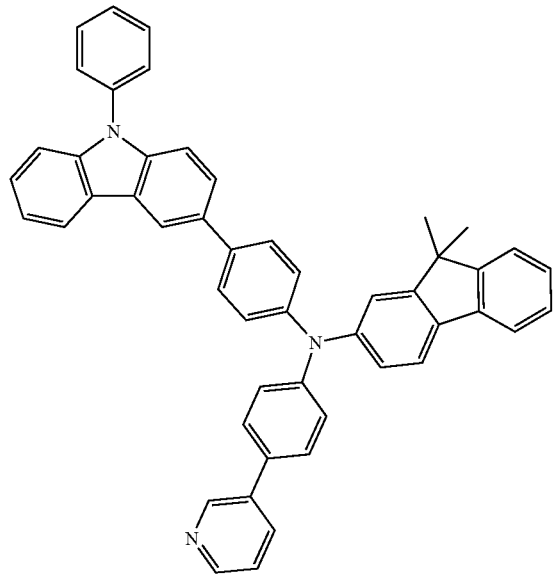
HT14
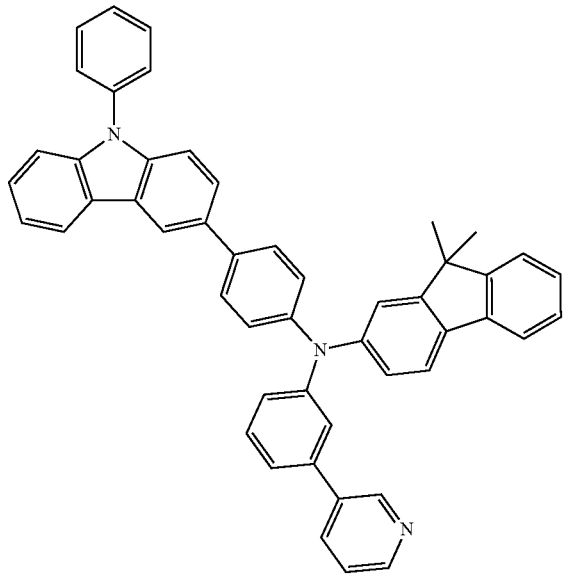
HT15
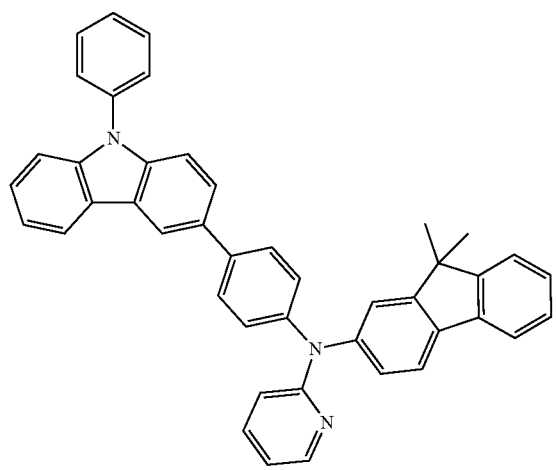
HT16
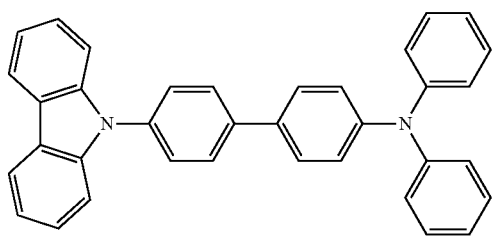
HT17
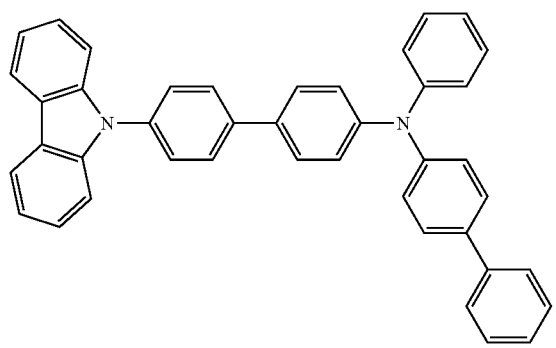
HT18
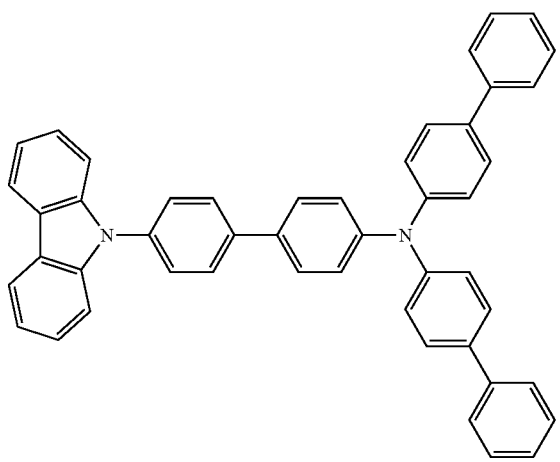

-continued
HT19
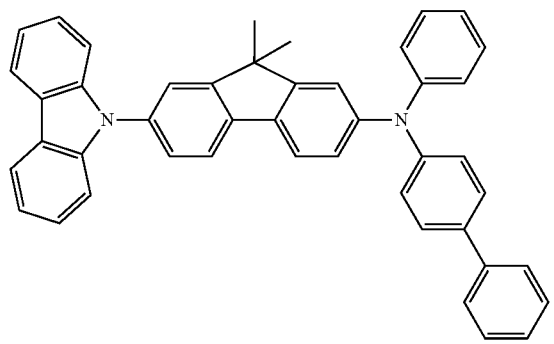
HT20
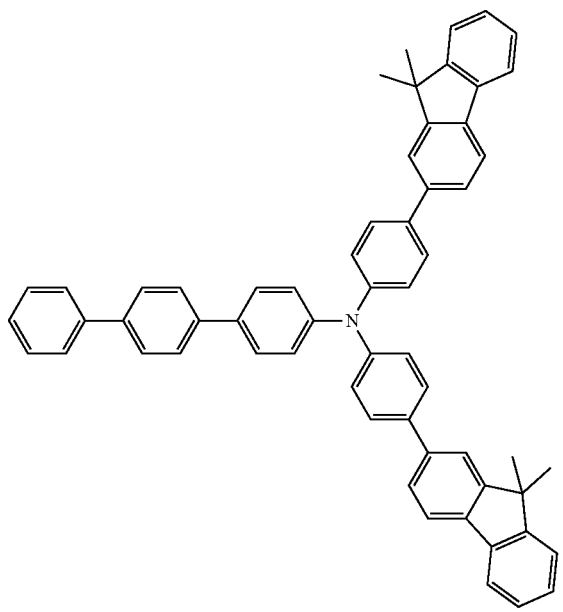
HT21
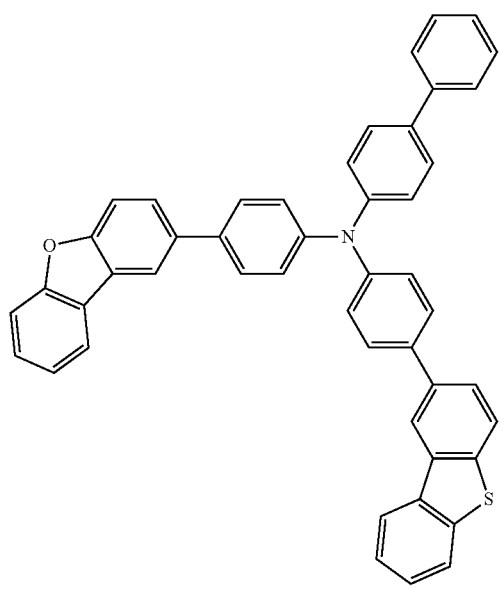
HT22
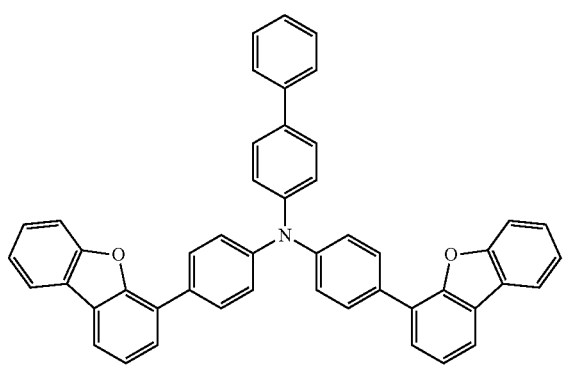

-continued
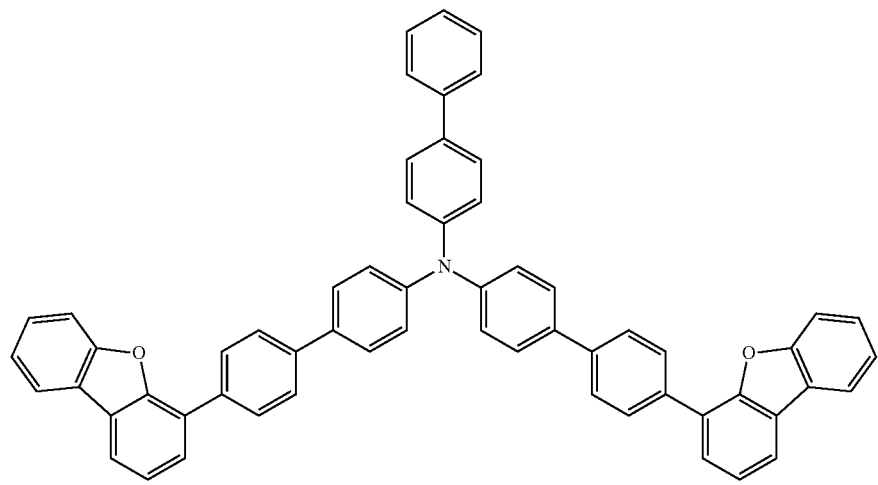
HT23
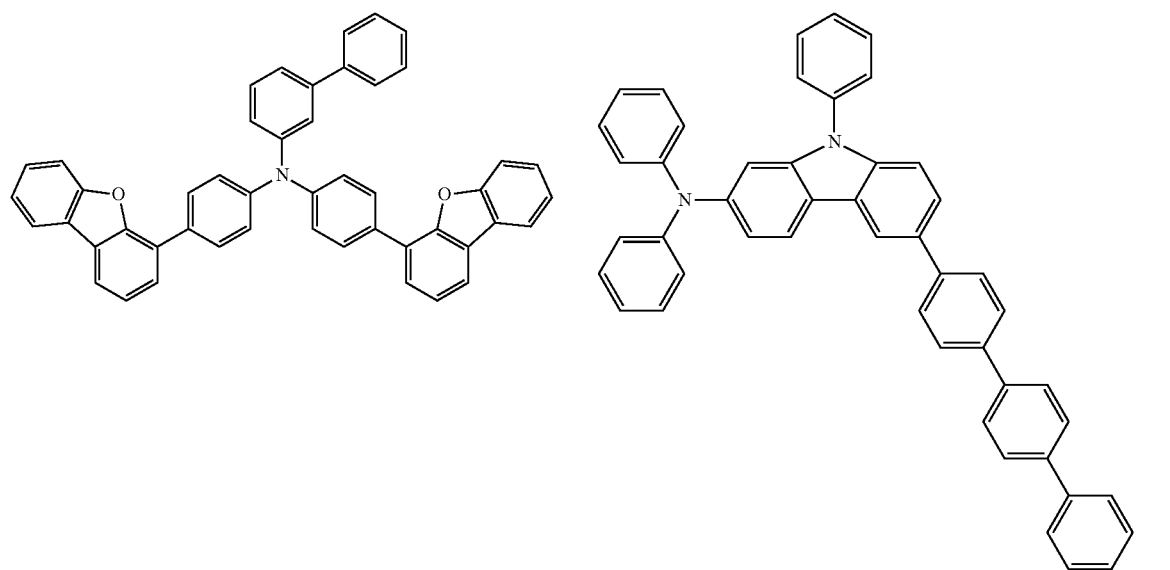
HT24  HT25
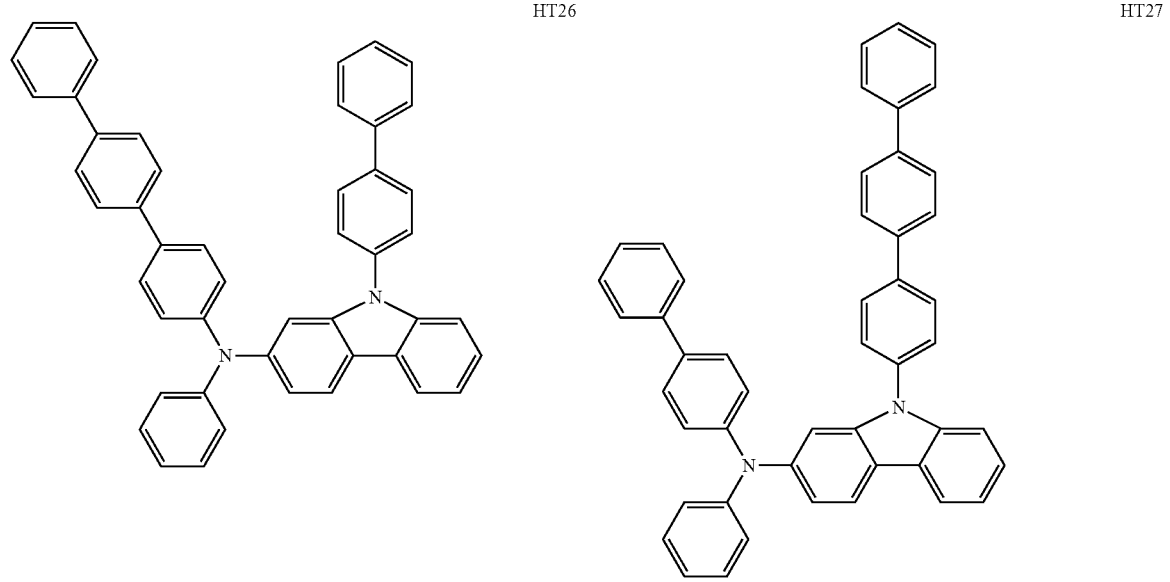
HT26  HT27

-continued
HT28
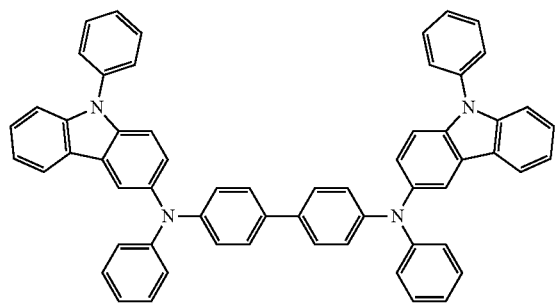
HT29
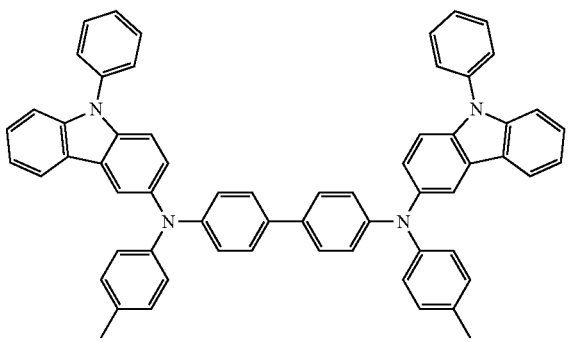
HT30
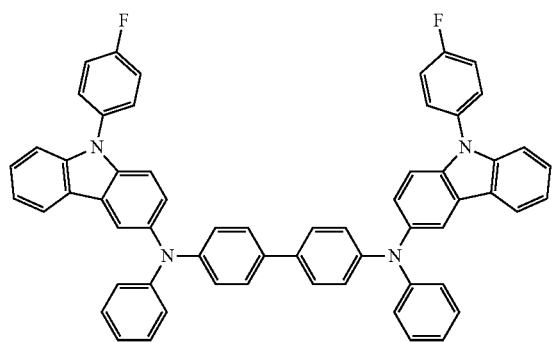
HT31
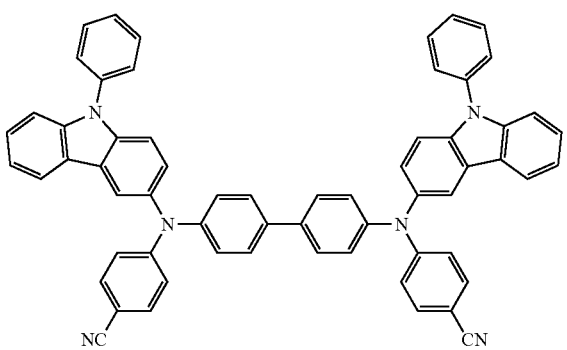
HT32
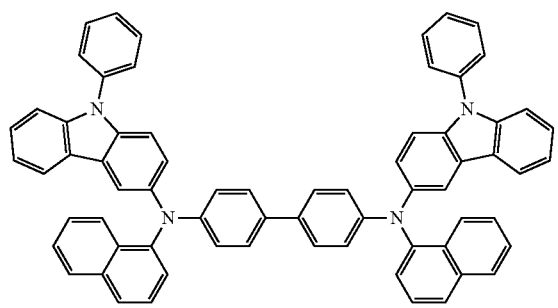
HT33
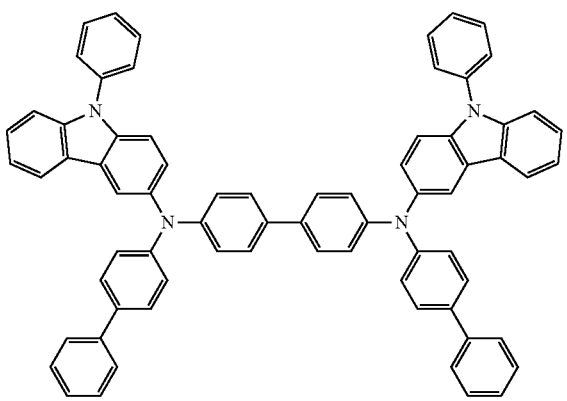

-continued
HT34
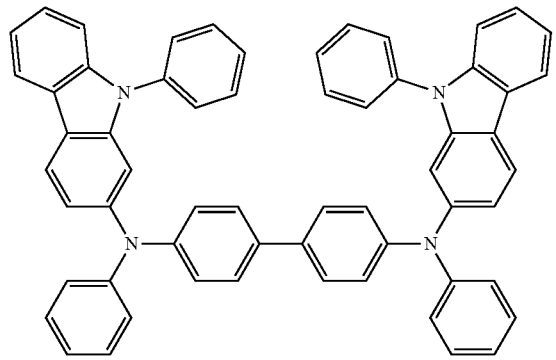
HT35
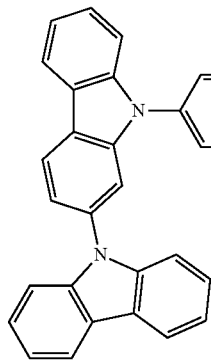
HT36
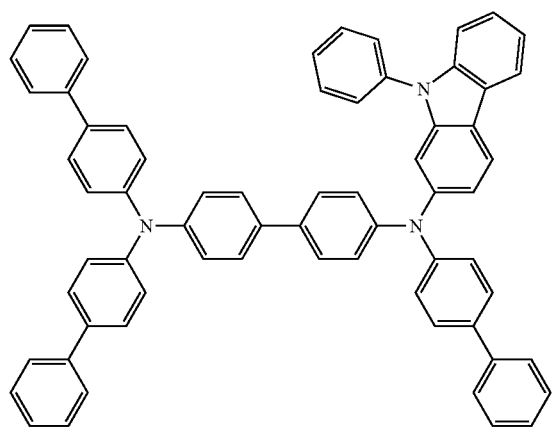
HT37
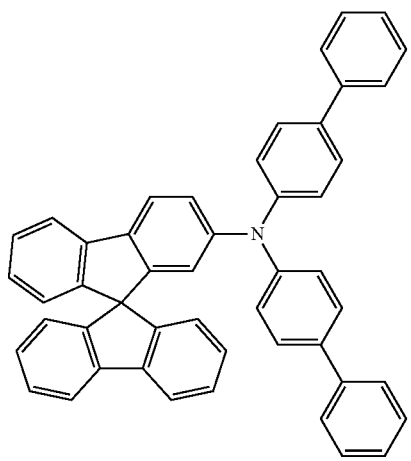
HT38
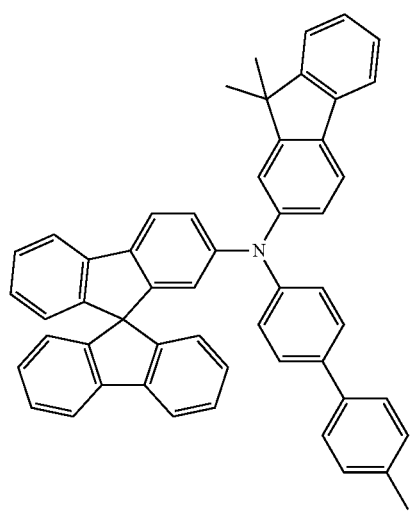
HT39
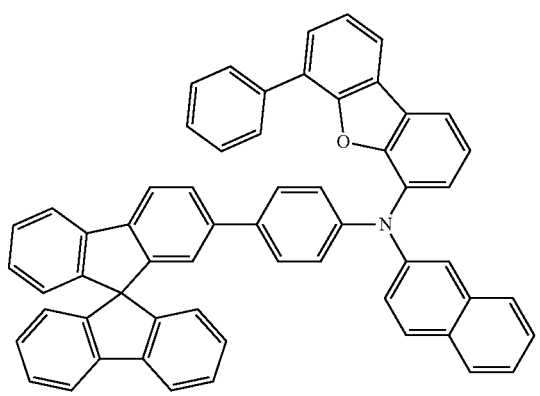

-continued
HT40
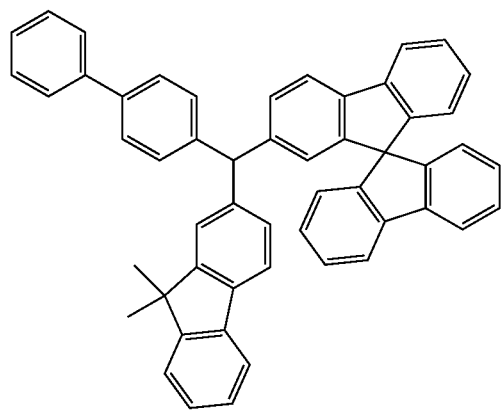
HT41
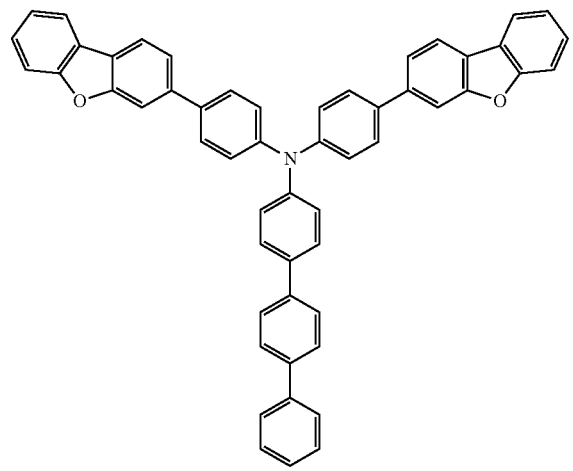
HT42
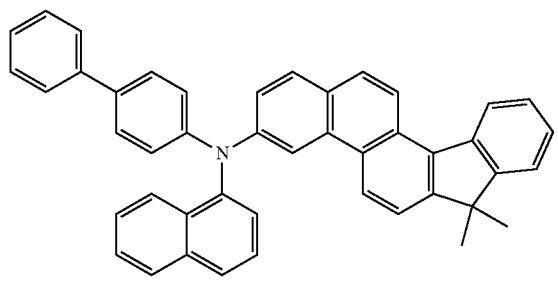
HT43
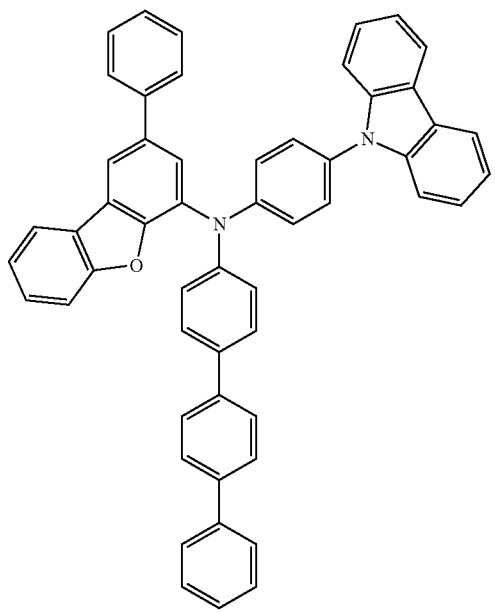
HT44
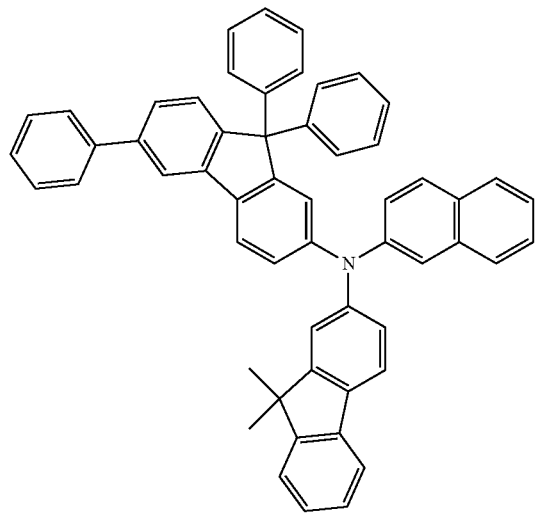
HT45
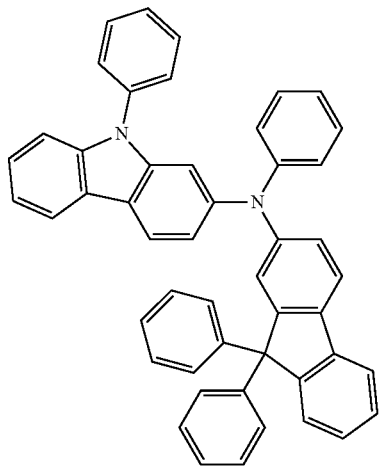

-continued
HT46
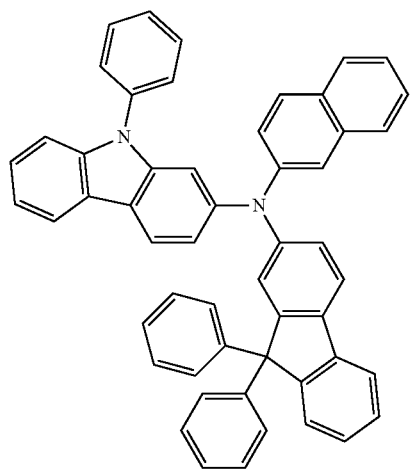
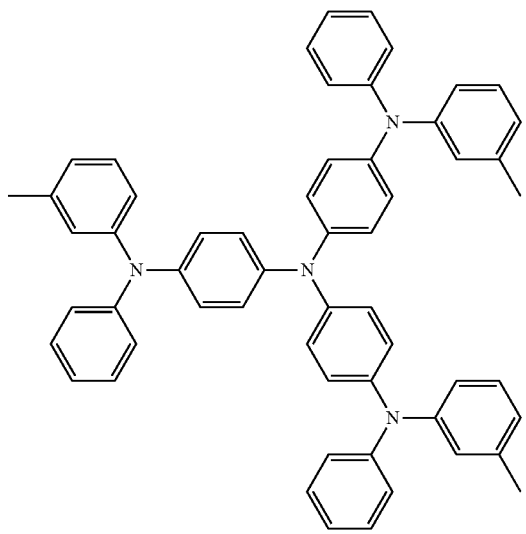
m-MTDATA
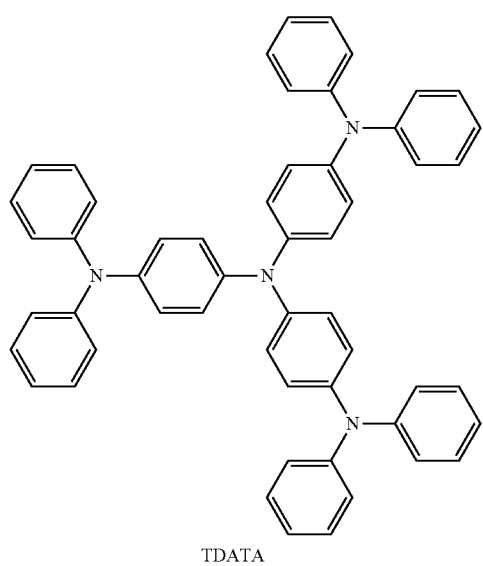
TDATA
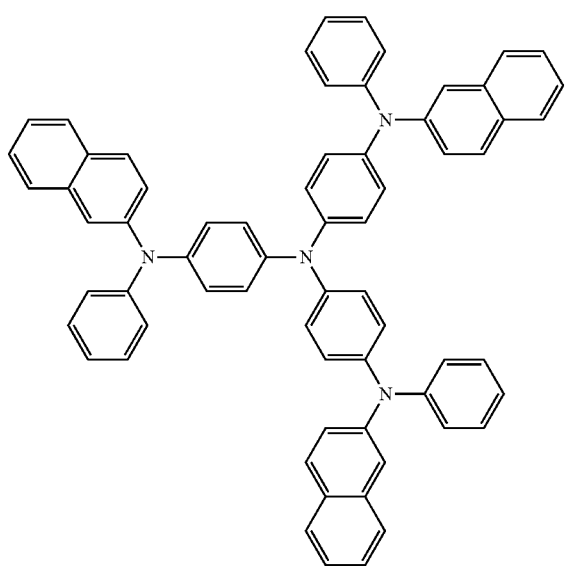
2-TNATA
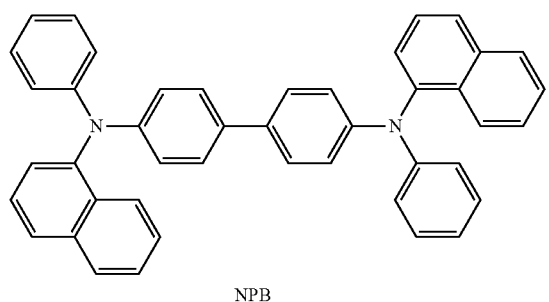
NPB
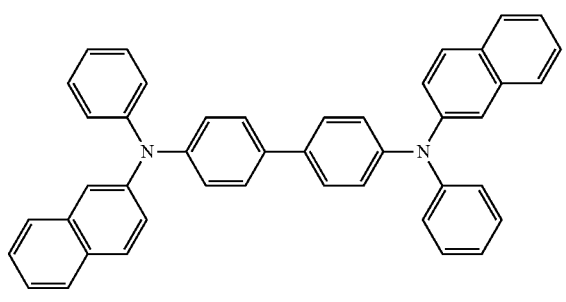
β-NPB

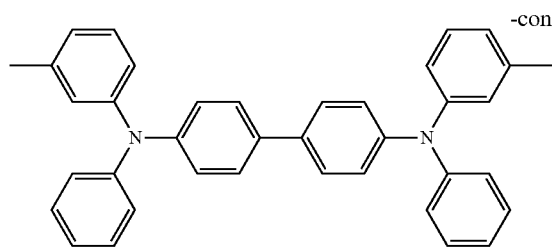
TBD

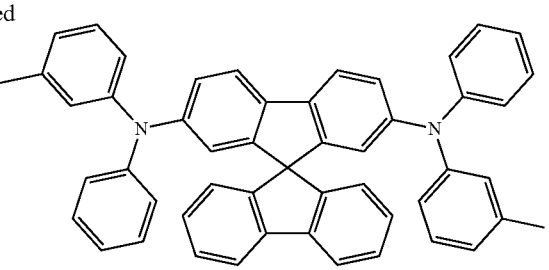
Spiro-TPD

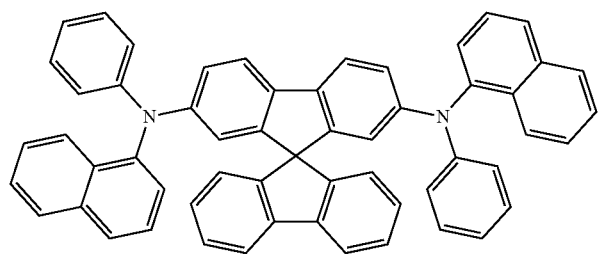
Spiro-NPB

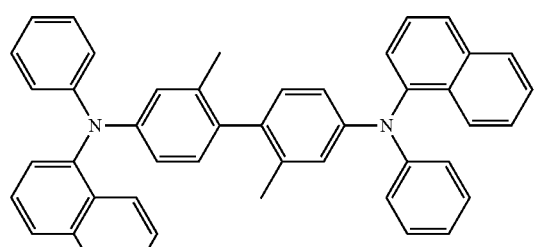
methylated-NPB

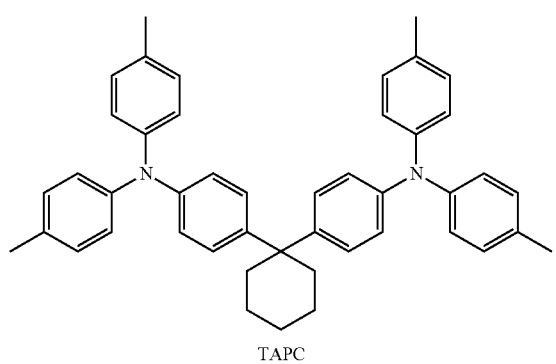
TAPC

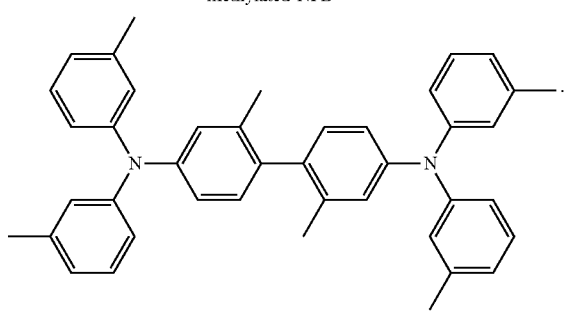
HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase luminescence efficiency by compensating for an optical resonance distance according to the wavelength of light emitted by an emission layer, and the electron-blocking layer may block or reduce the leakage of electrons from an emission layer to a hole transport region. Materials that may be included in the hole transport region may be included in the emission auxiliary layer and the electron-blocking layer.

p-Dopant

The hole transport region may further include, in addition to these materials, a charge-generation material for the improvement of conductive properties (e.g., electrically conductive properties). The charge-generation material may be uniformly or non-uniformly dispersed in the hole transport region (for example, in the form of a single layer consisting of a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or any combination thereof.

Examples of the quinone derivative include TCNQ, F4-TCNQ, etc.

Examples of the cyano group-containing compound include HAT-CN, and a compound represented by Formula 221 below.

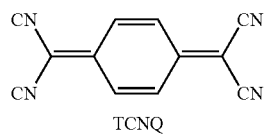
TCNQ

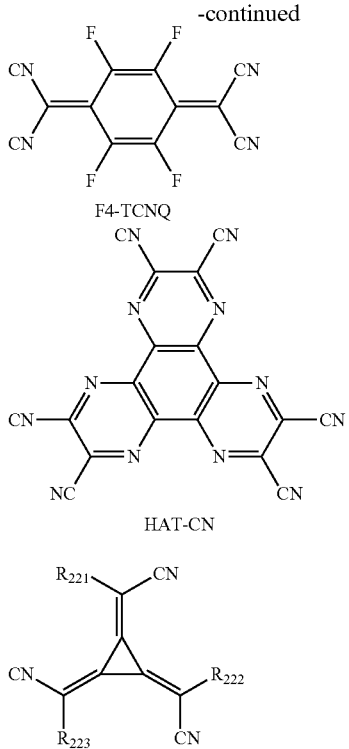

F4-TCNQ

HAT-CN

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal include an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid include silicon (Si), antimony (Sb), and tellurium (Te).

Examples of the non-metal include oxygen (O) and halogen (for example, F, Cl, Br, I, etc.).

Examples of the compound including element EL1 and element EL2 include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide include alkali metal halide, alkaline earth metal halide, transition metal halide, post-transition metal halide, and lanthanide metal halide.

Examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeIt$, etc.), ruthenium halide (for example, $RuF_2$, $RuCl_2$, $RuBr_2$, $Rule$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $Cole$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and the like.

An example of the metalloid halide is antimony halide (for example, $SbCl_5$, etc.).

Examples of the metal telluride include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact (e.g., physically contact) each other or are separated from each other to emit white light. In one or more embodiments, the emission layer may include two or more materials of a red light-emitting material, a green light-emitting material, and a blue light-emitting material, in which the two or more materials are mixed together with each other in a single layer to emit white light.

In an embodiment, the emission layer may further include a host, an auxiliary dopant, a sensitizer, delayed fluorescence material, or any combination thereof, in addition to the first emitter as described in the present specification.

When the emission layer further includes a host in addition to the first emitter, the amount of the first emitter is about 0.01 to about 15 parts by weight based on 100 parts by weight of the host.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

The host in the emission layer may include an electron-transporting compound described herein (for example, refer to the compounds represented by Formula 2-1 and/or 2-2), a hole-transporting compound described herein (for example, refer to a compound represented by one selected from Formulae 3-1 to 3-5), or a combination thereof.

In one or more embodiments, the host may include an alkali earth metal complex, a post-transition metal complex, or any combination thereof. For example, the host may include a Be complex (for example, Compound H55), an Mg complex, a Zn complex, or any combination thereof.

In one or more embodiments, the host may include one of Compounds H1 to H130, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

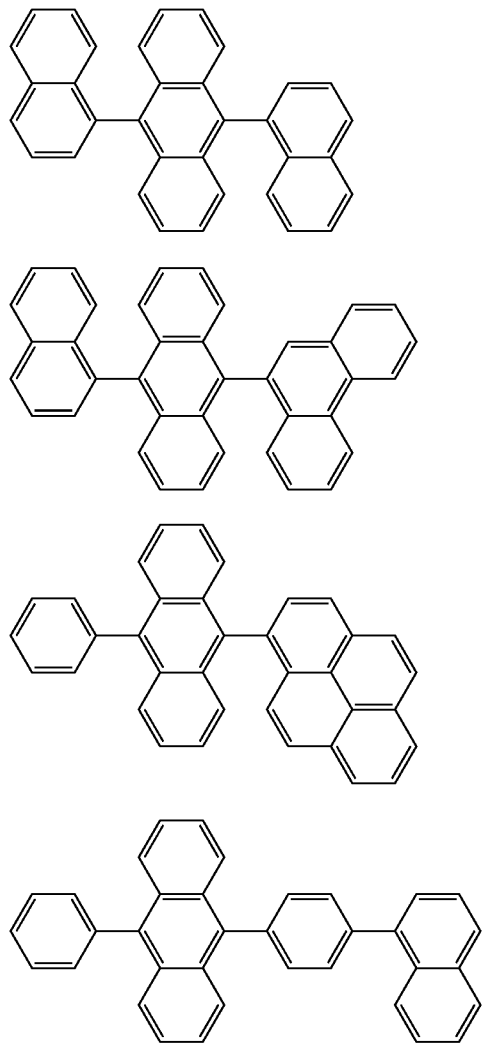
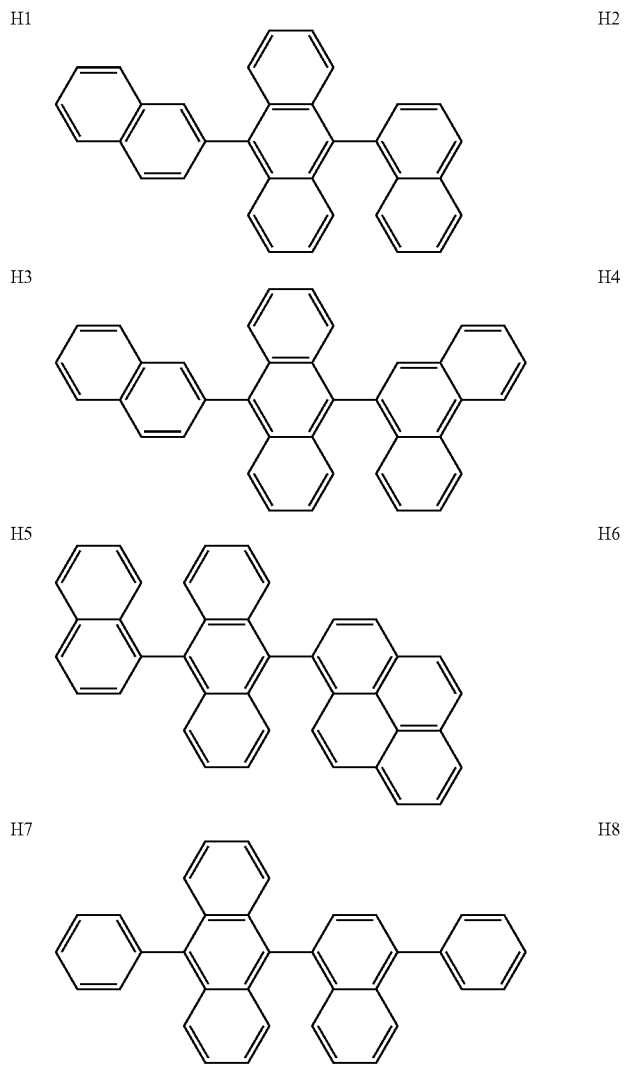

-continued
H9
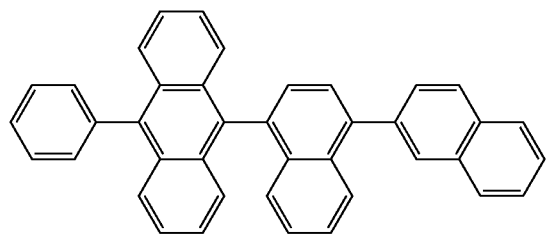
H10
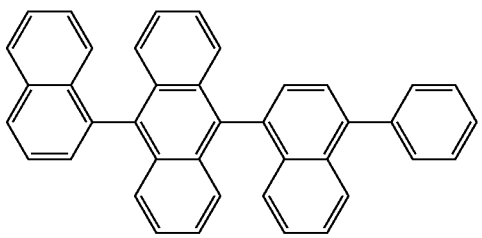
H11
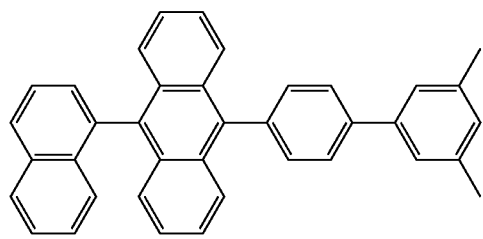
H12
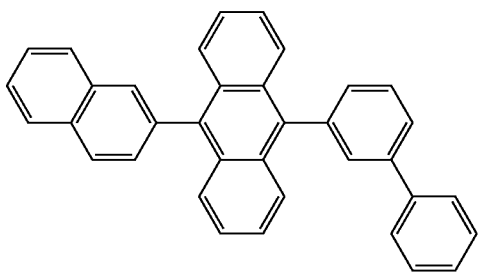
H13
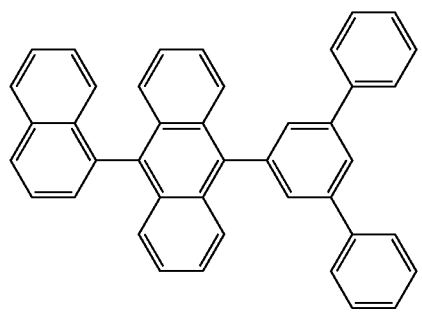
H14
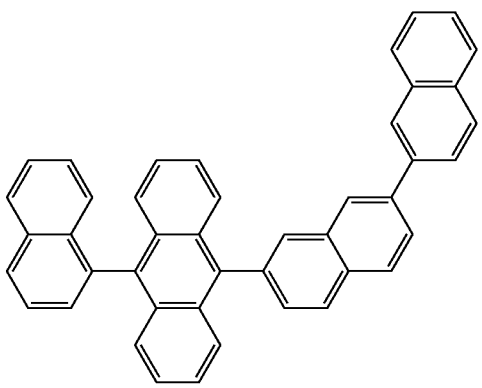
H15
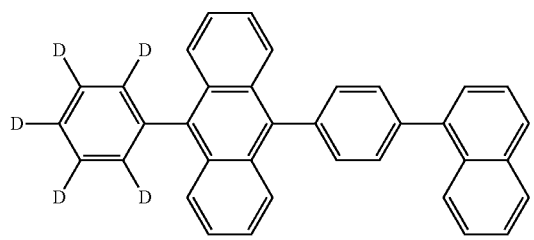
H16
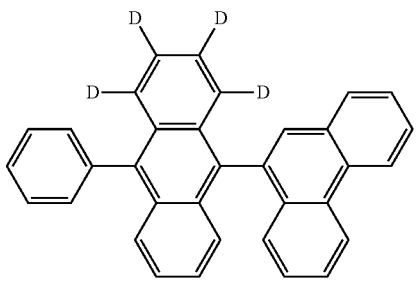
H17
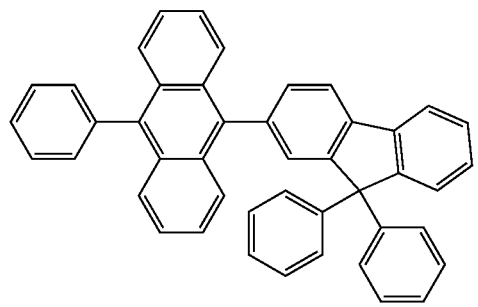
H18
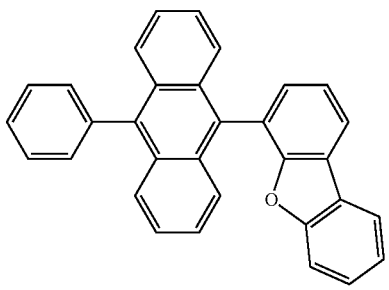

-continued
H19
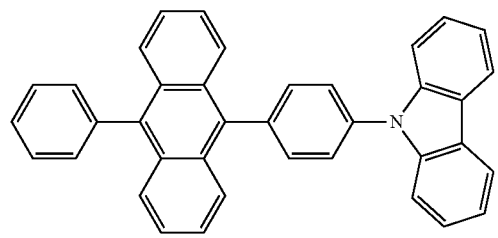
H20
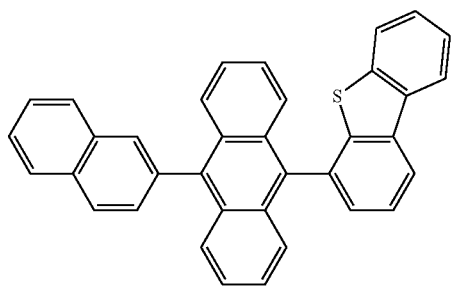
H21
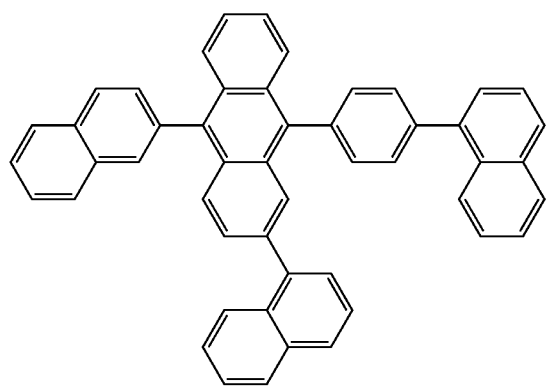
H22
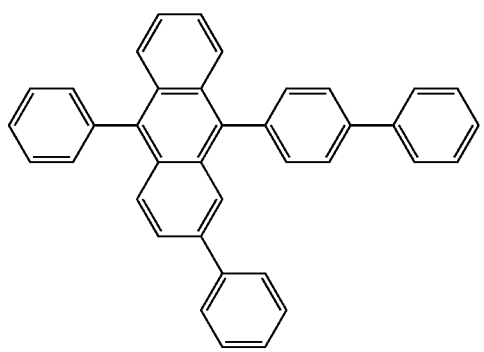
H23
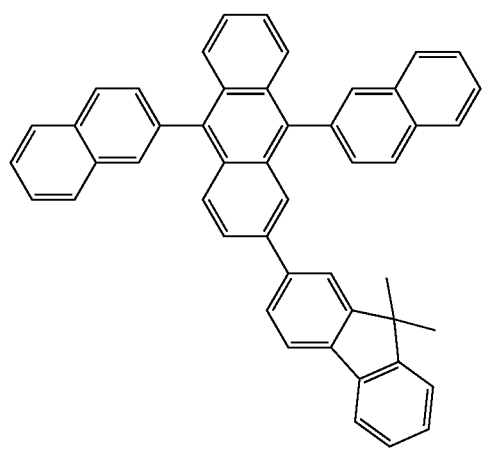
H24
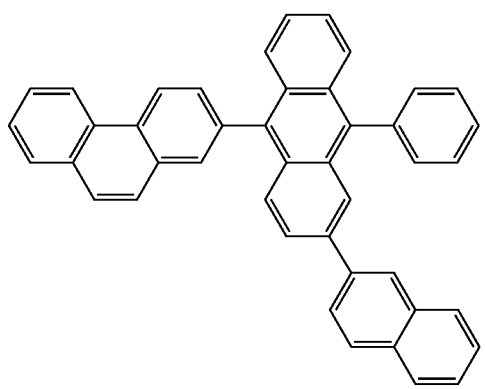

-continued
H25
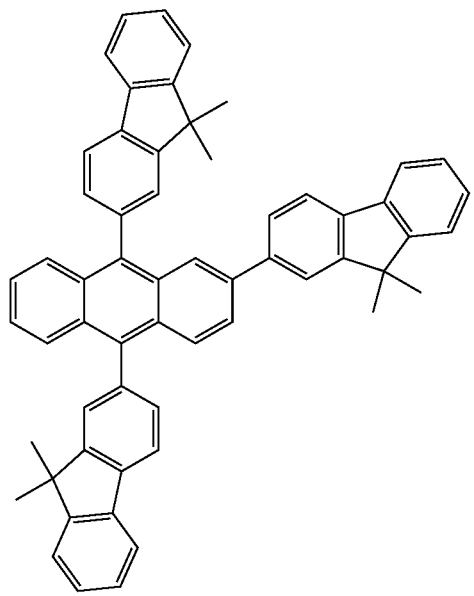
H26
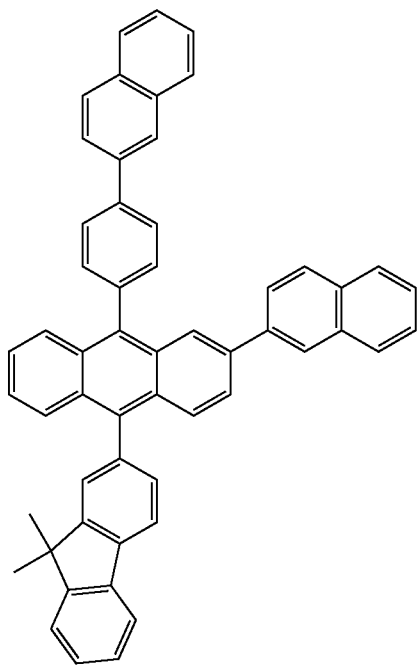
H27
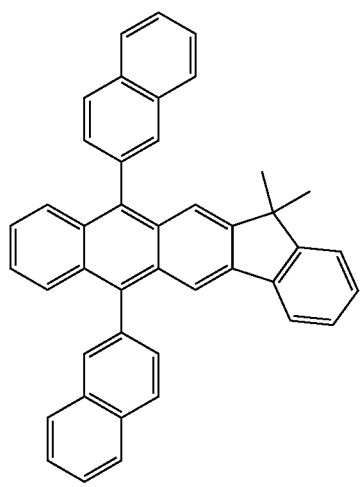
H28
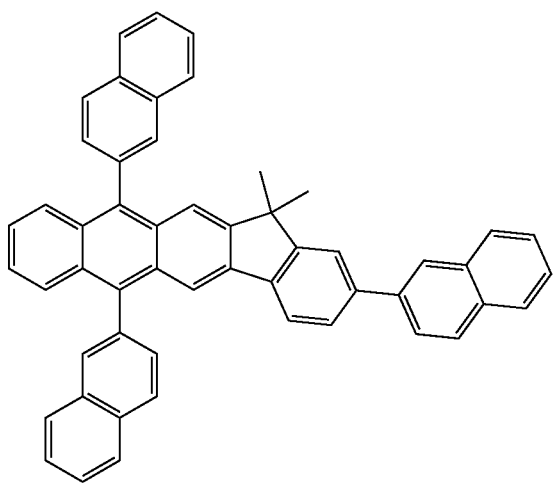
H29
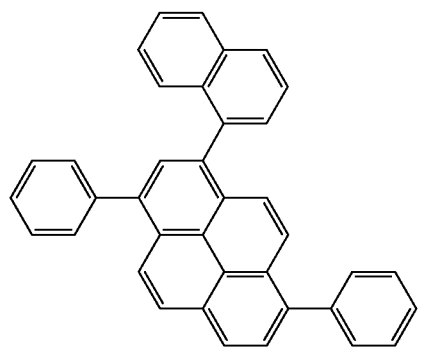
H30
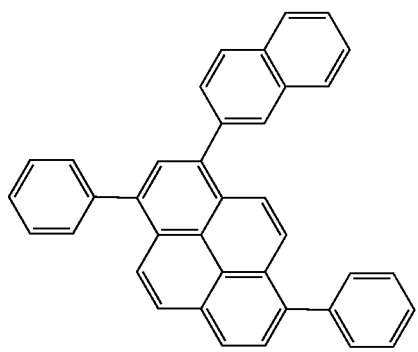

-continued
H31
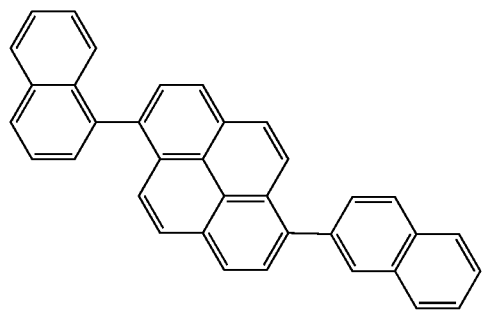
H32
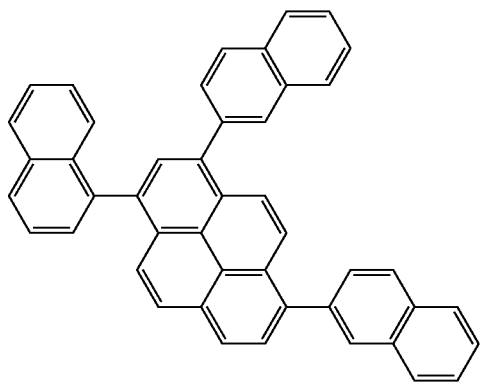
H33
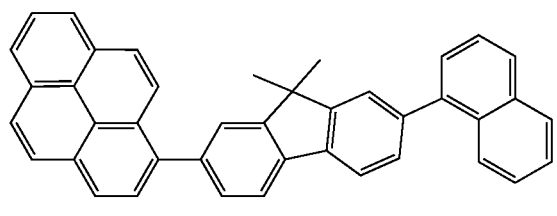
H34
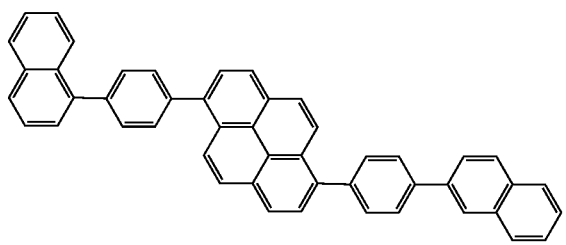
H35
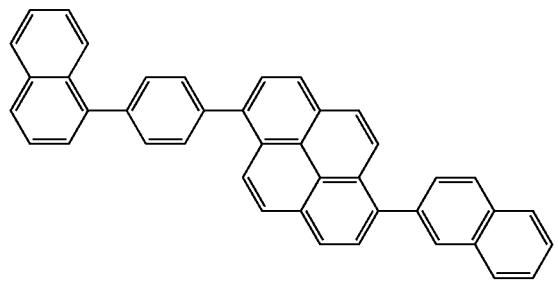
H36
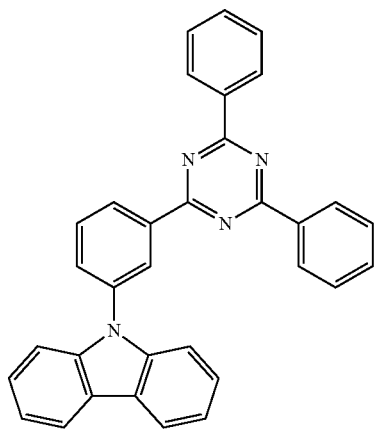
H37
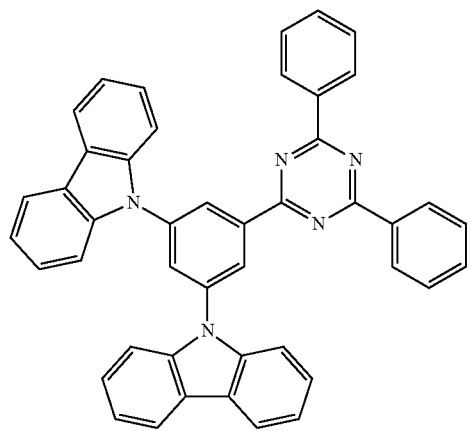
H38
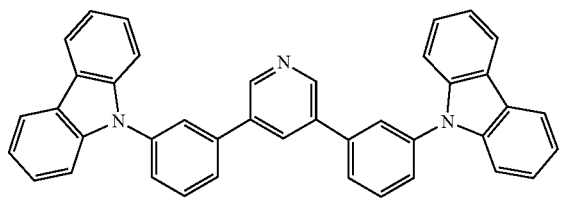

-continued
H39
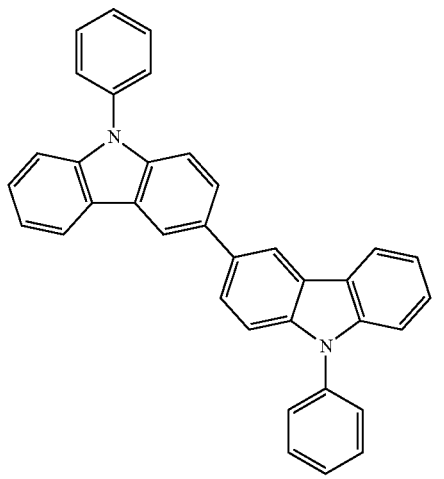
H40
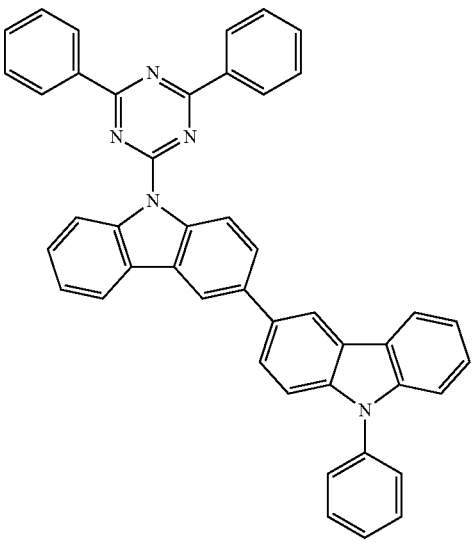
H41
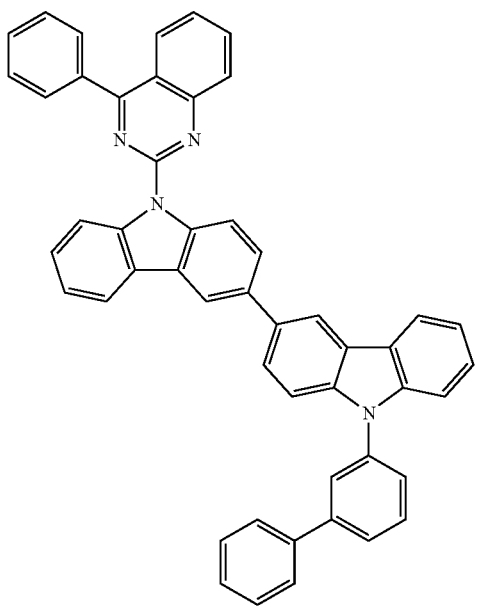
H42
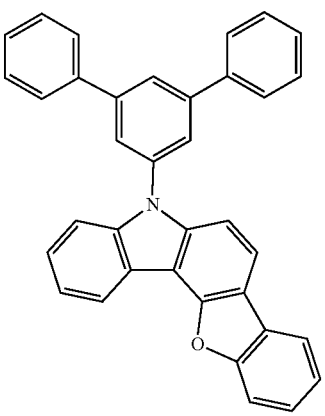
H43
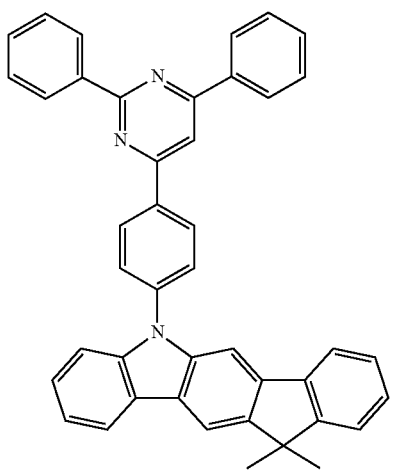
H44
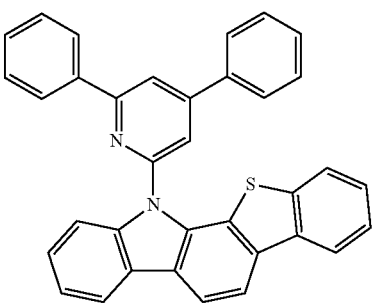

-continued
H45
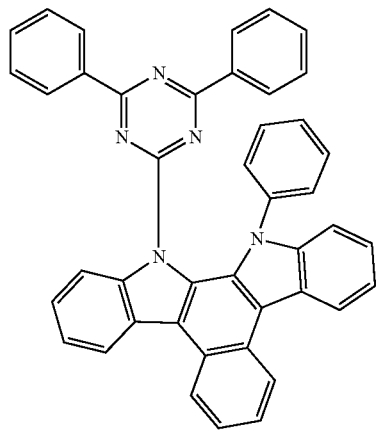
H46
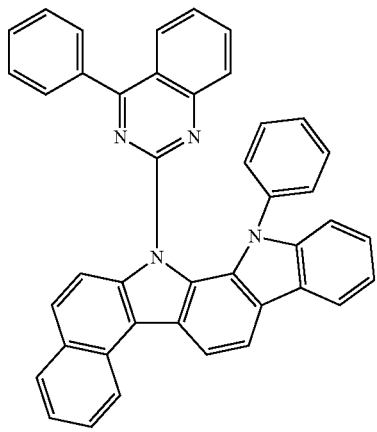
H47
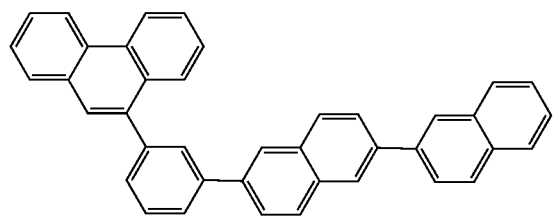
H48
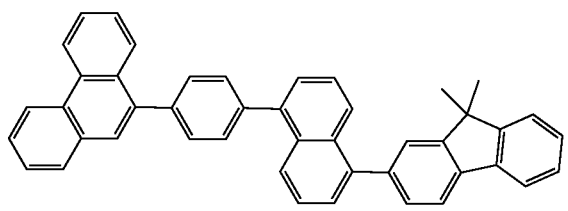
H49
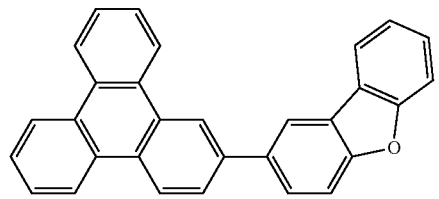
H50
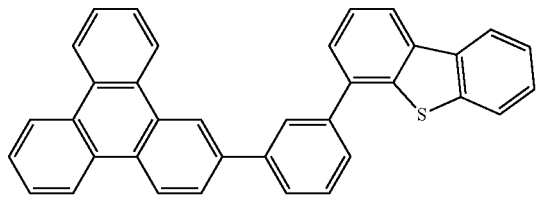
H51
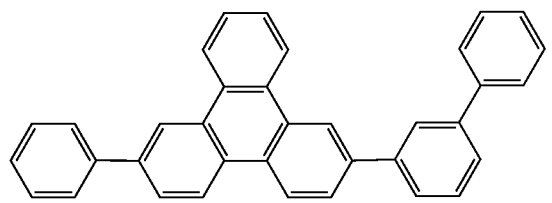
H52
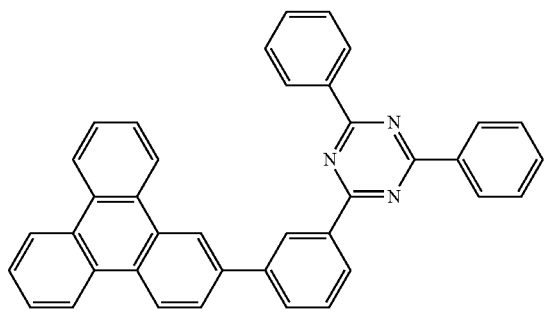
H53
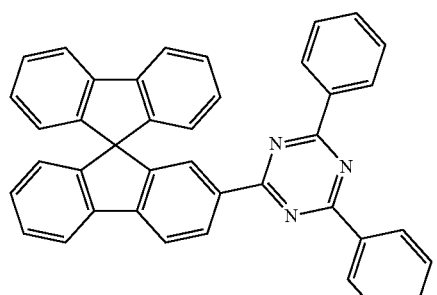
H54
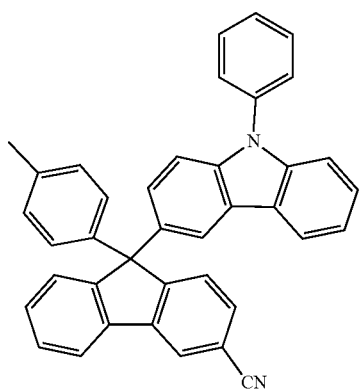

-continued
H55
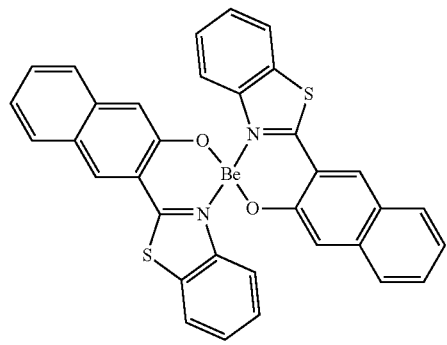
H56
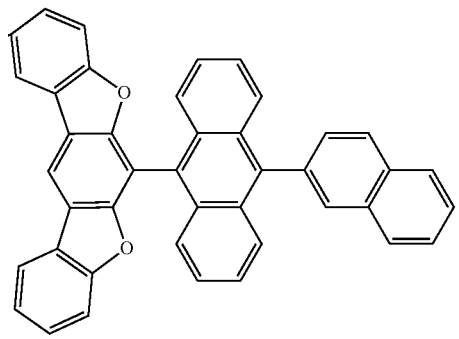
H57
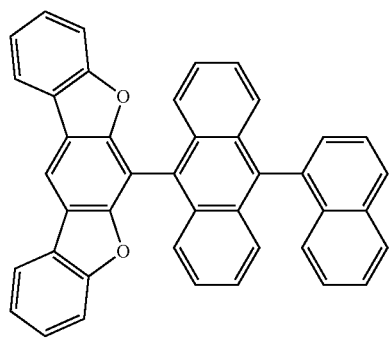
H58
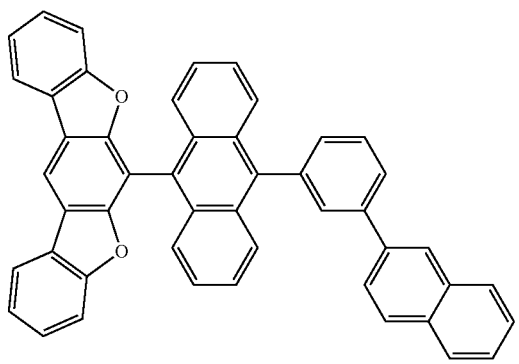
H59
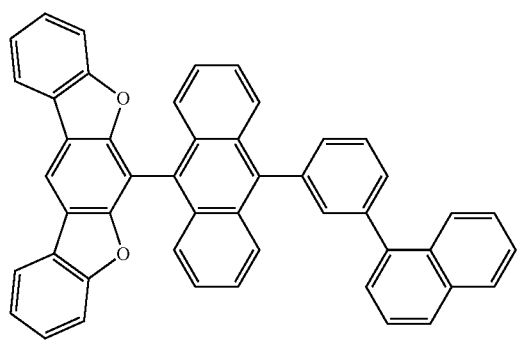
H60
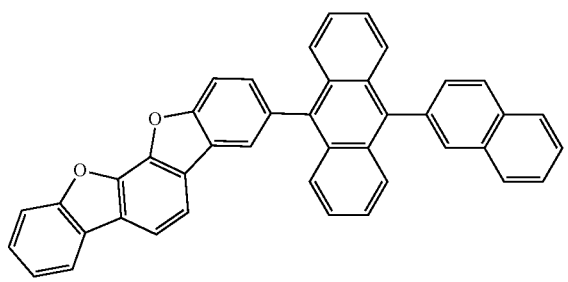
H61
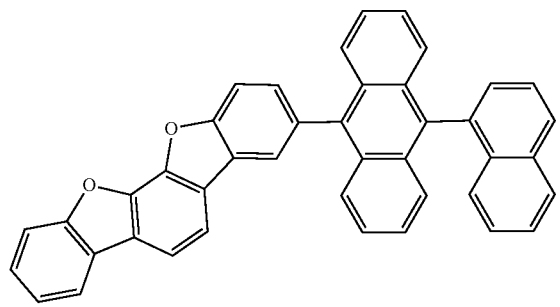
H62
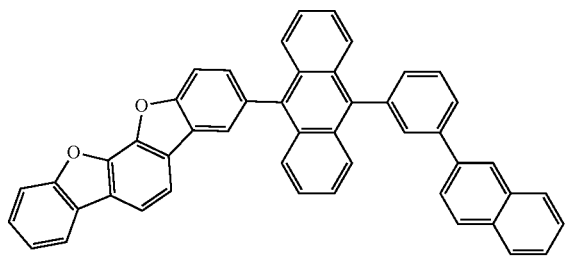

-continued
H63
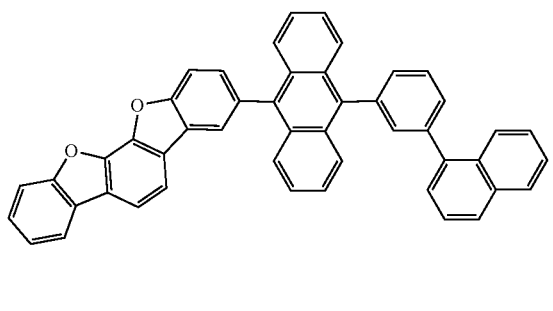
H64
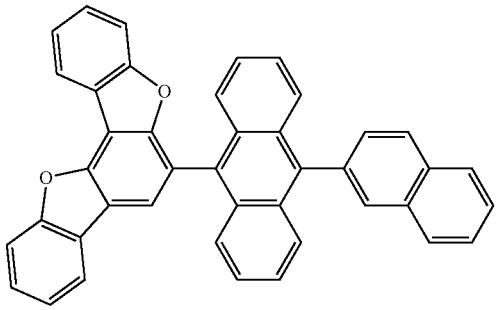
H65
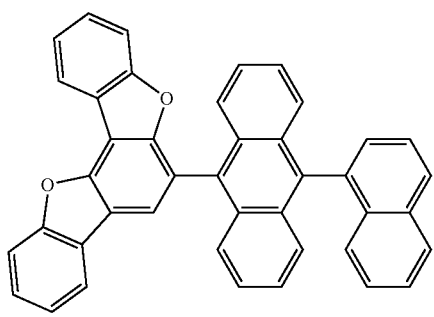
H66
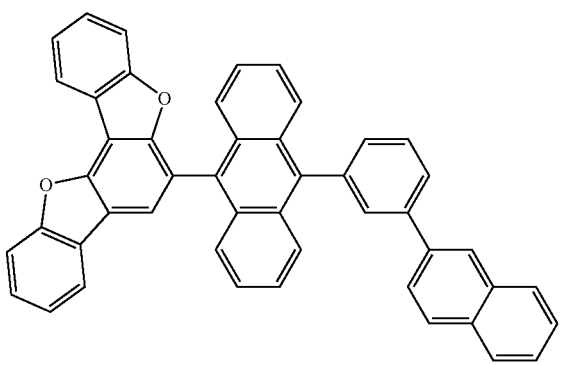
H67
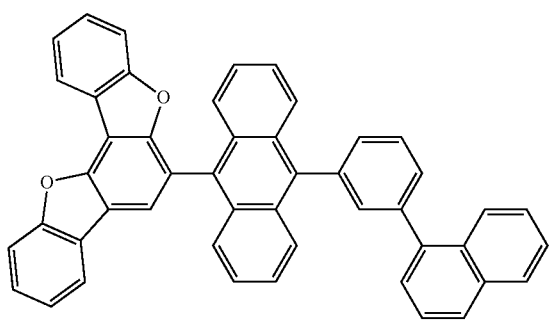
H68
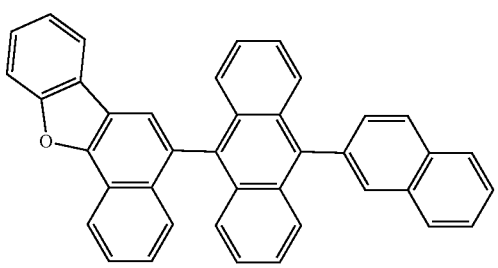
H69
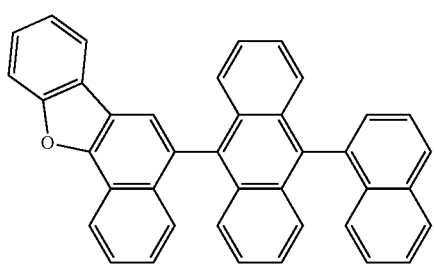
H70
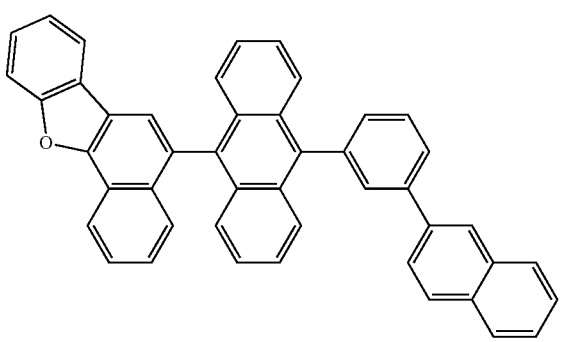

-continued
H71
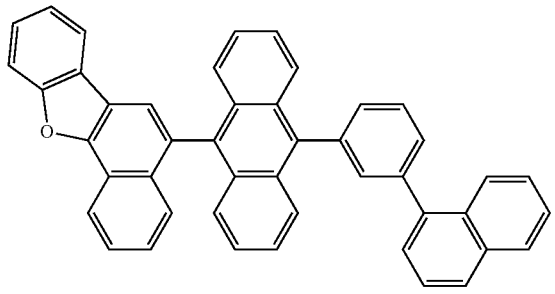
H72
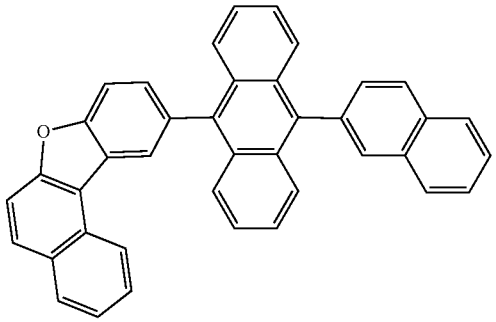
H73
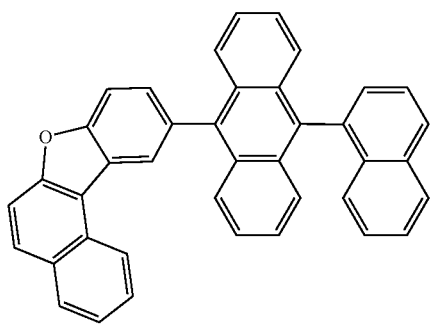
H74
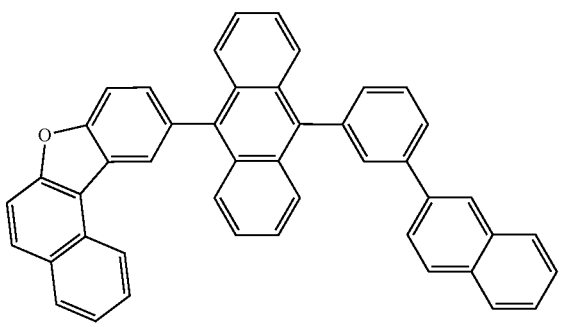
H75
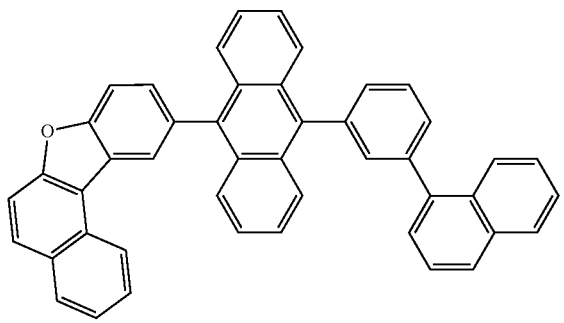
H76
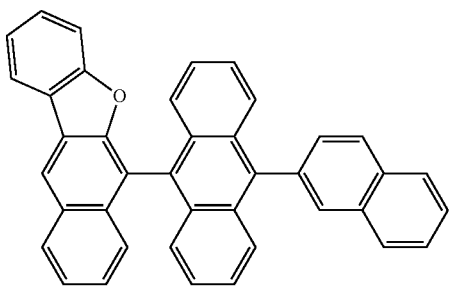
H77
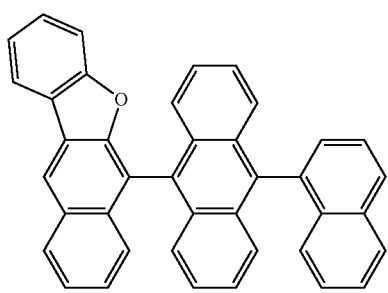
H78
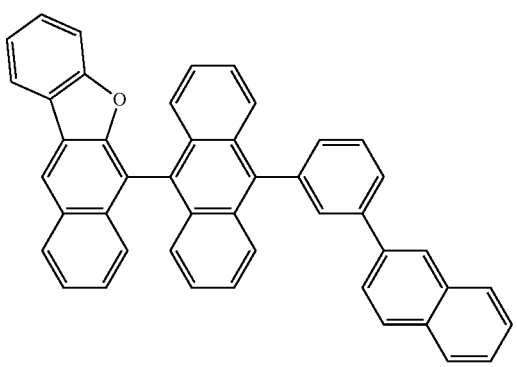

-continued
H79
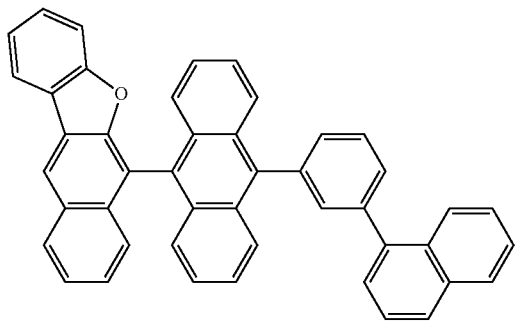
H80
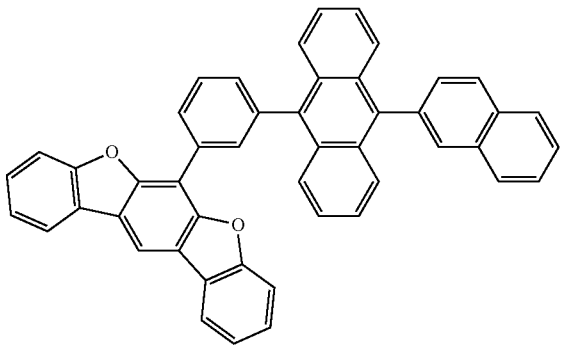
H81
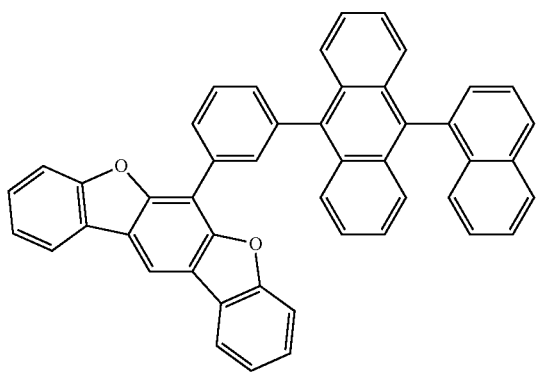
H82
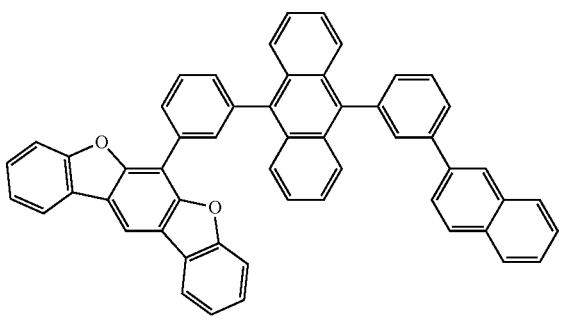
H83
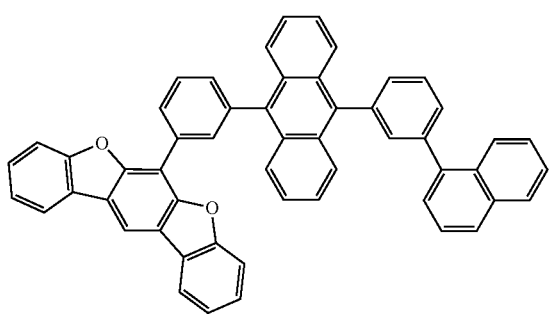
H84
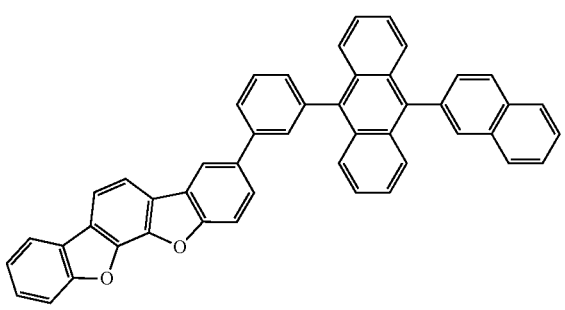
H85
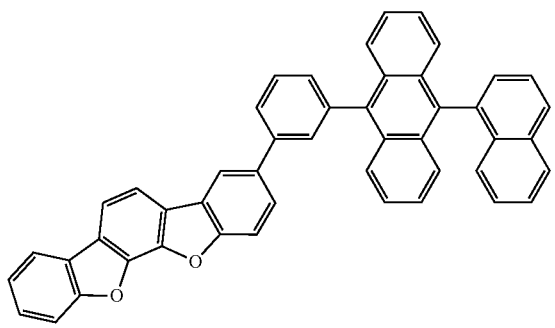
H86
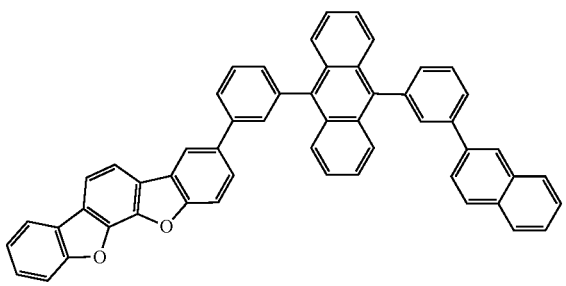

-continued
H87
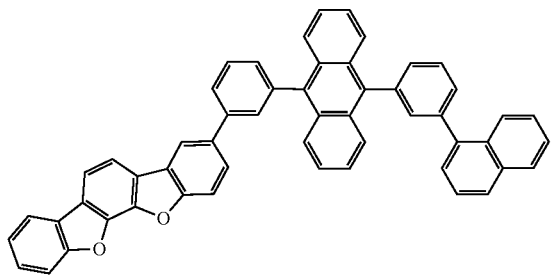
H88
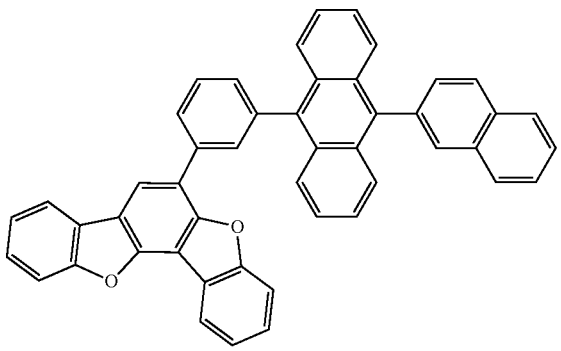
H89
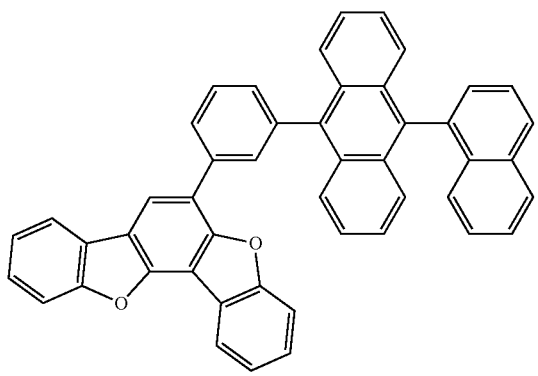
H90
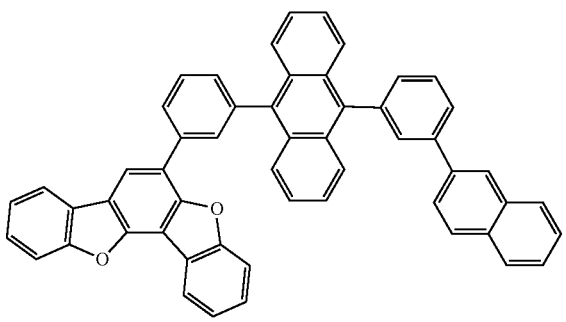
H91
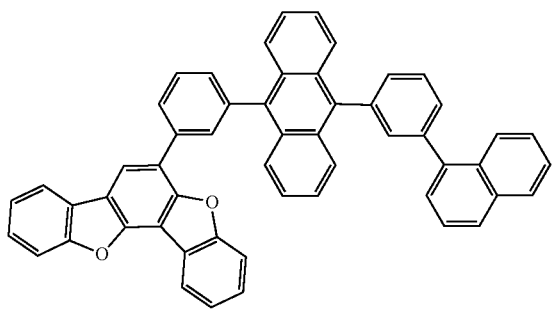
H92
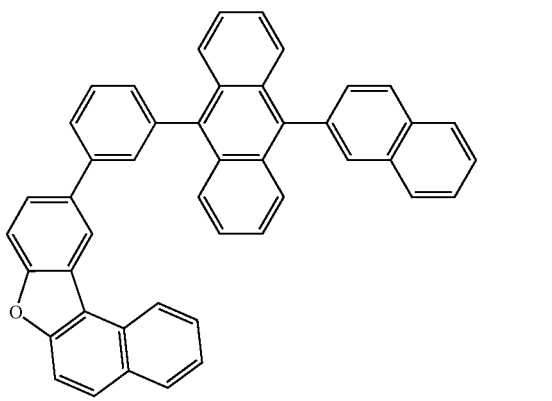
H93
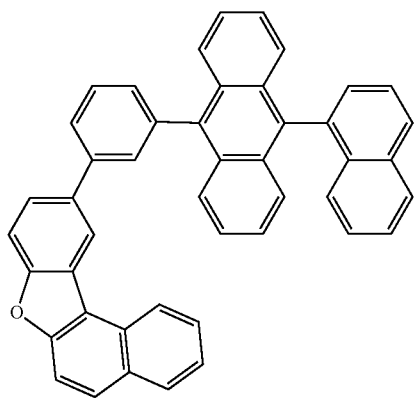
H94
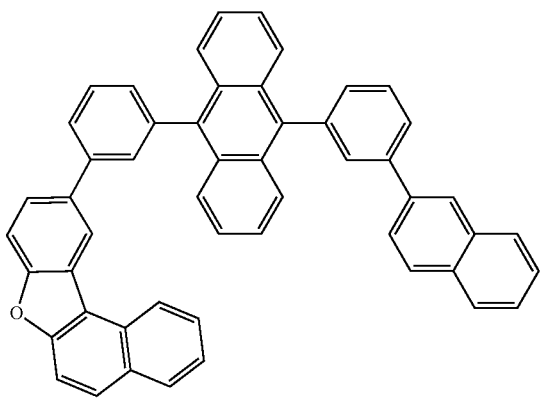

-continued
H95
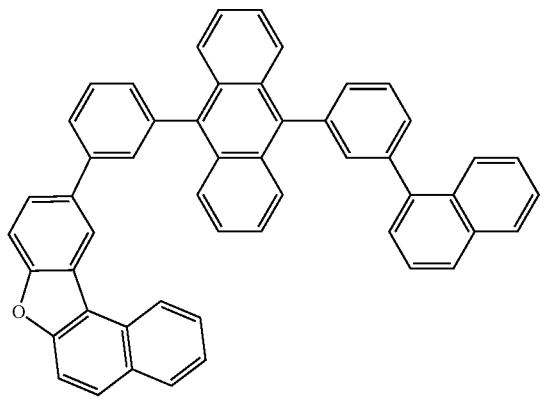
H96
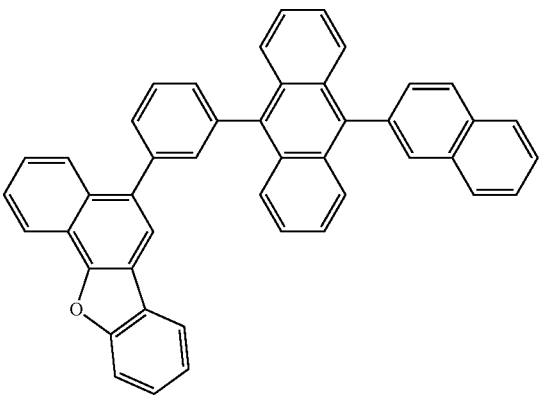
H97
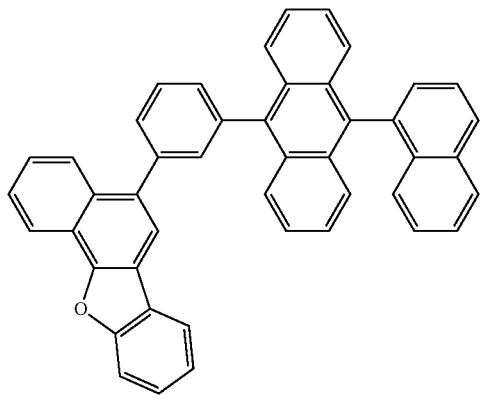
H98
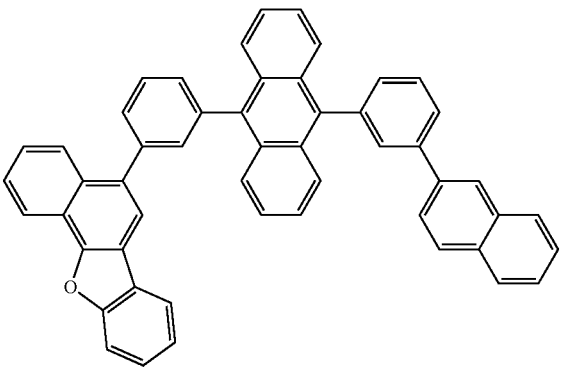
H99
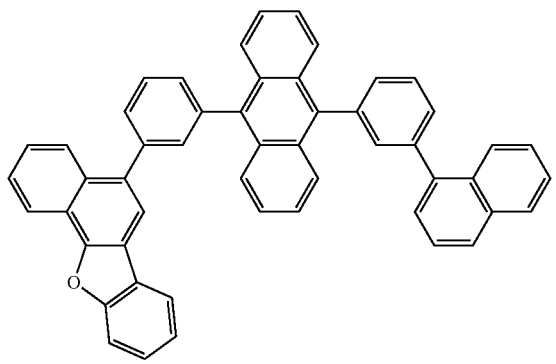
H100
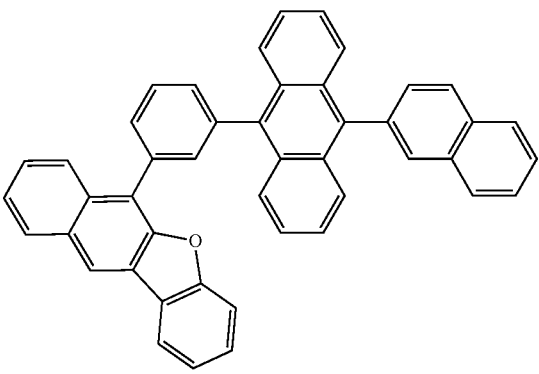
H101
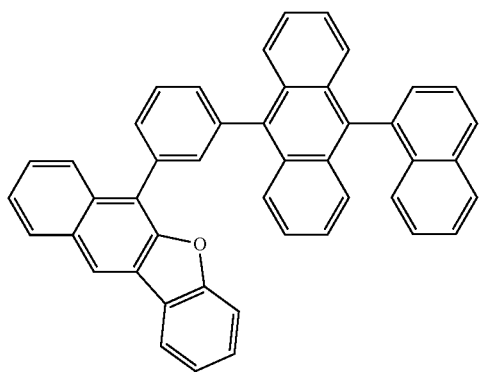
H102
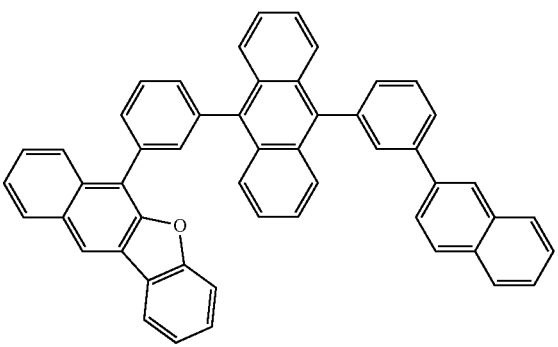

-continued
H103
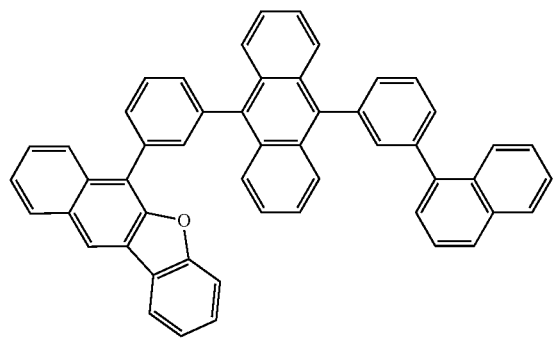
H104
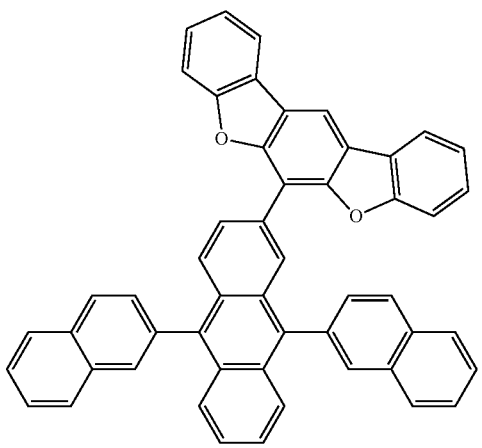
H105
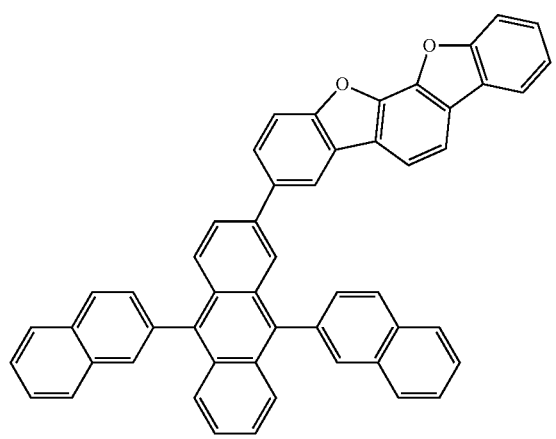
H106
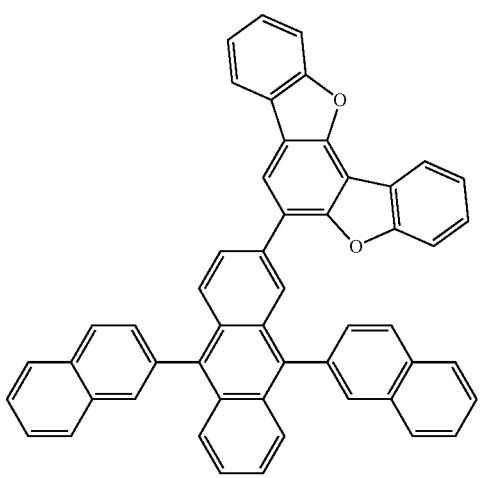
H107
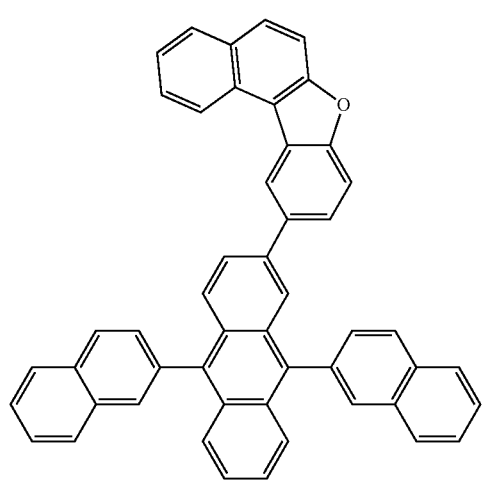
H108
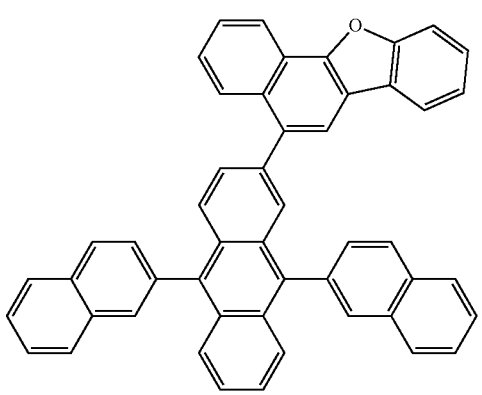

-continued
H109
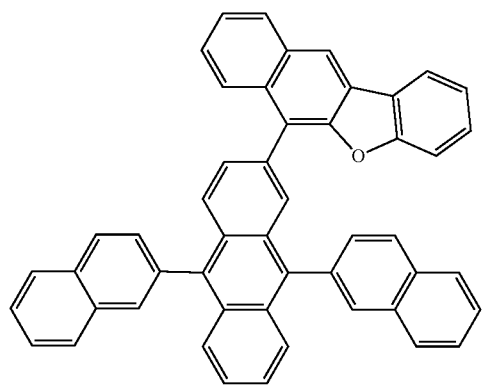
H110
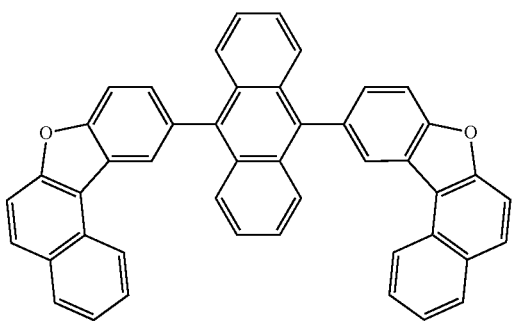
H111
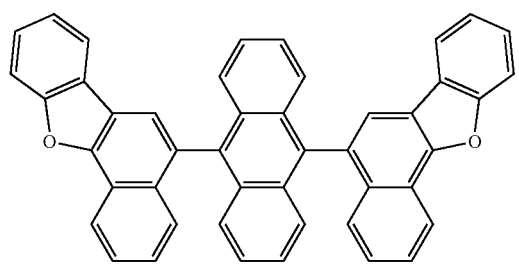
H112
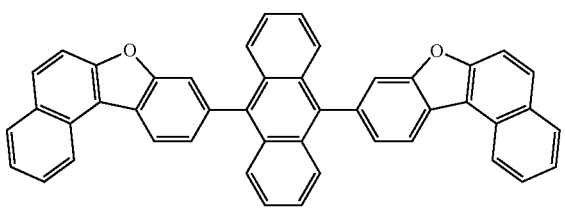
H113
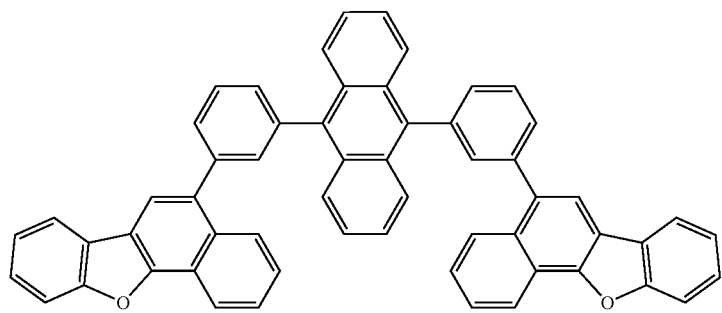
H114
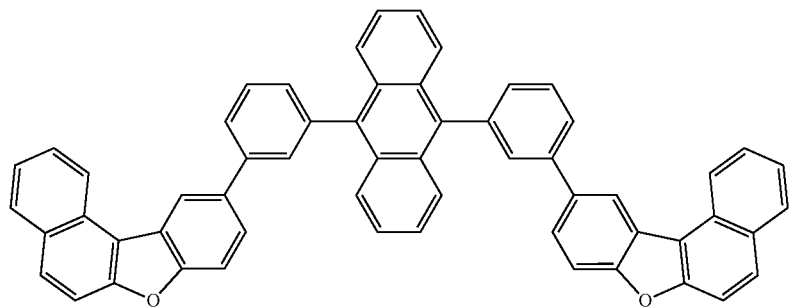

-continued
H115
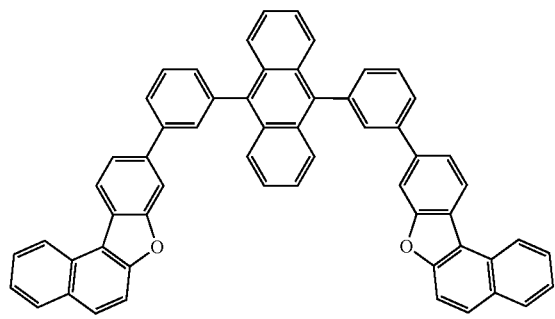
H116
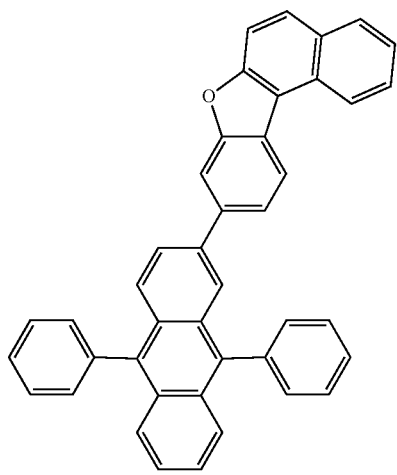
H117
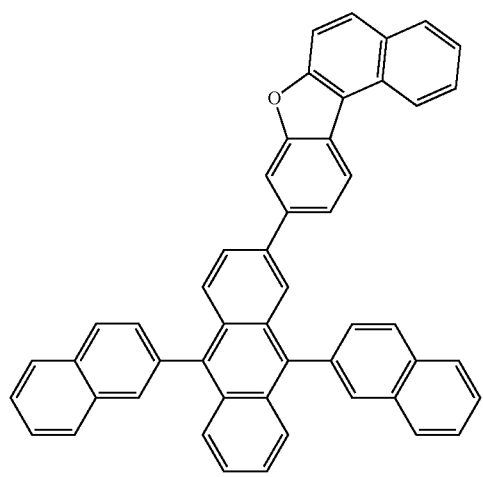
H118
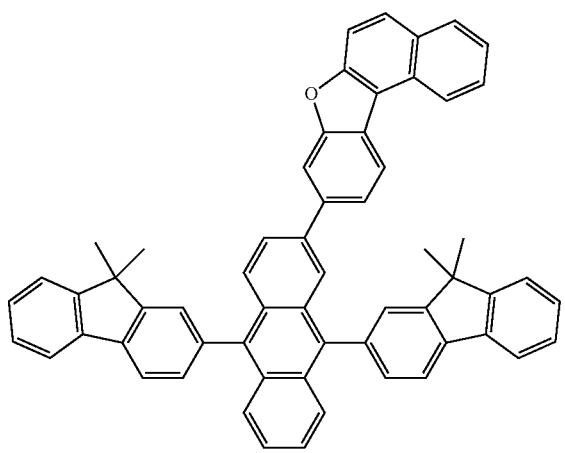
H119
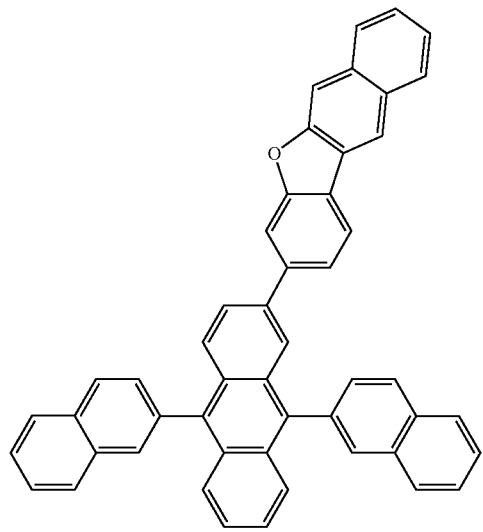
H120
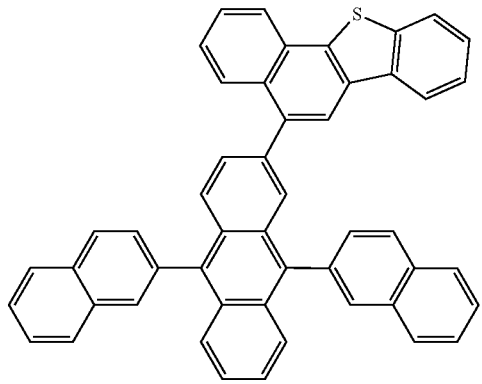

-continued
H121
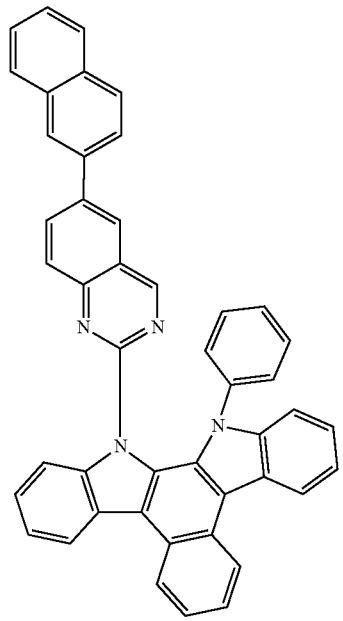
H122
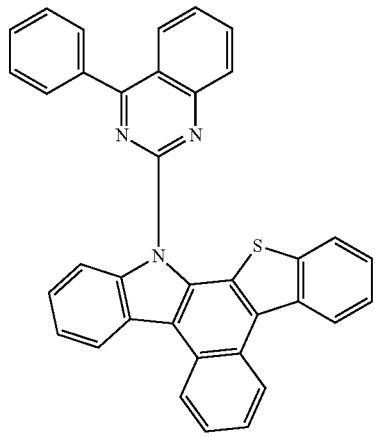
H123
H124
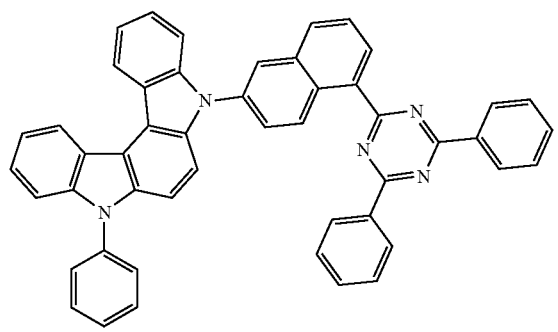
H125
H126
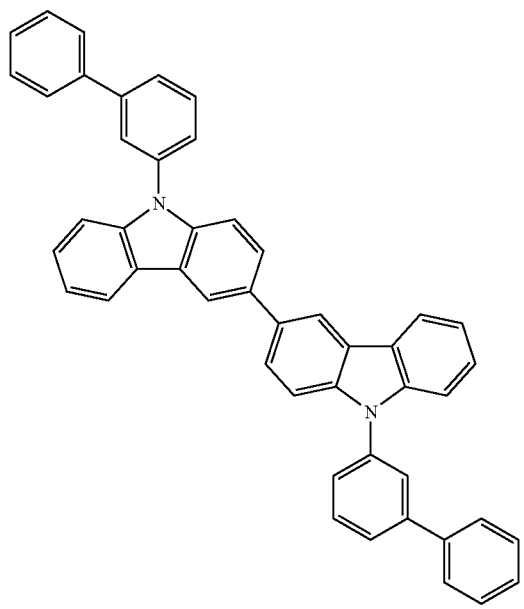
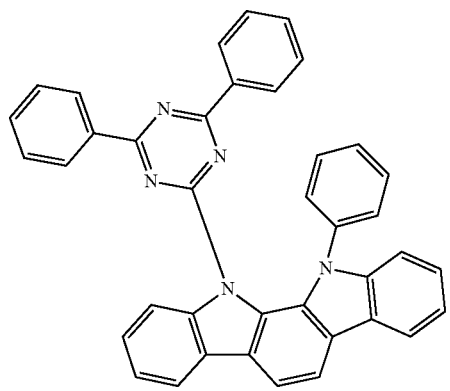

-continued

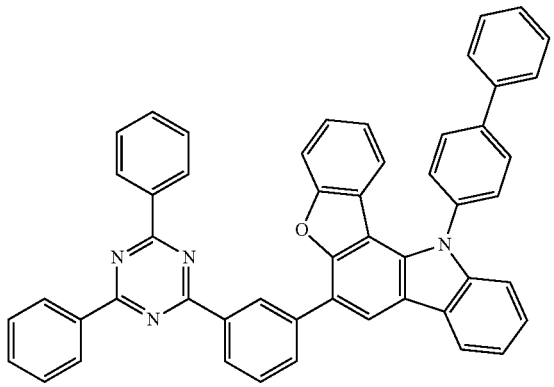
H127

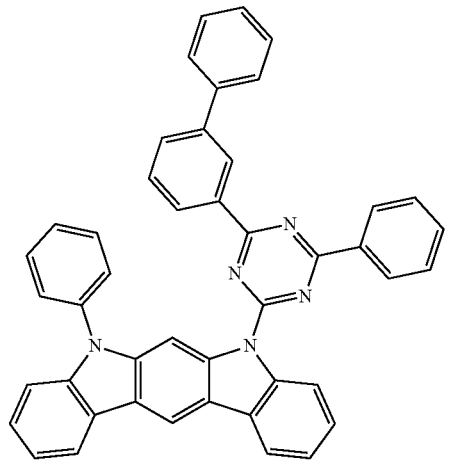
H128

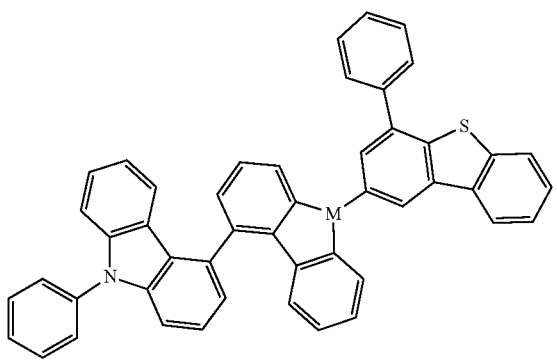
H129

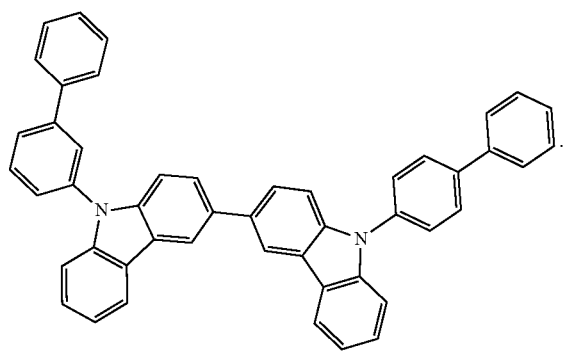
H130

In an embodiment, the host may include a silicon-containing compound, a phosphine oxide-containing compound, or any combination thereof.

The host may have various suitable modifications. For example, the host may include only one kind of compound, or may include two or more kinds of different compounds.

Phosphorescent Dopant

The emission layer may include, as a phosphorescent dopant, the first emitter as described herein.

In an embodiment, the emission layer may further include, in addition to the first emitter as described in the present specification, an organometallic compound represented by Formula 401:

$$M(L_{401})_{xc1}(L_{402})_{xc2} \quad \text{Formula 401}$$

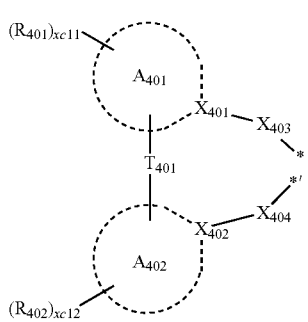

Formula 402 wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring A401 and ring A402 may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordination bond (which may also be referred to as a coordinate covalent bond or dative bond)), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q^1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described herein with respect to $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each be the same as described herein with respect to $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

Fluorescent Dopant

The emission layer may further include a fluorescent dopant in addition to the first emitter as described in the present specification.

The fluorescent dopant may include an arylamine compound, a styrylamine compound, a boron-containing compound, or any combination thereof.

For example, the fluorescent dopant may include a compound represented by Formula 501:

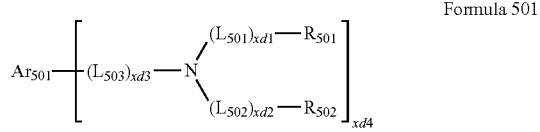

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, the fluorescent dopant may include: one of Compounds FD1 to FD36; DPVBi; DPAVBi; or any combination thereof:

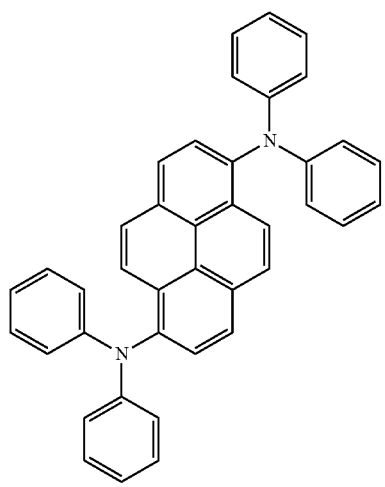

FD1

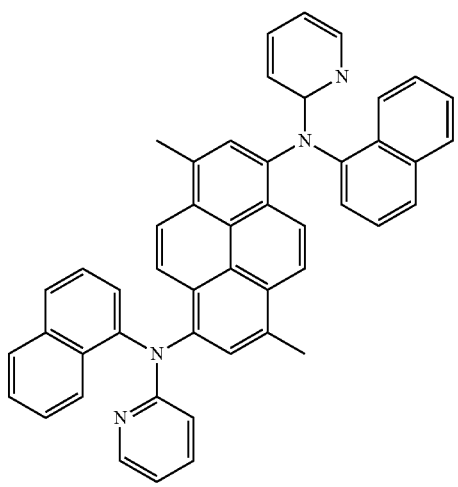

FD2

-continued
FD3
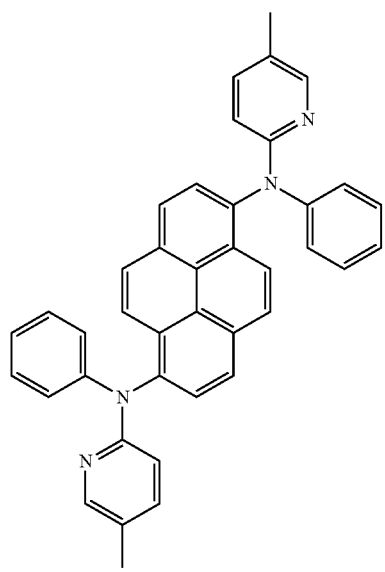
FD4
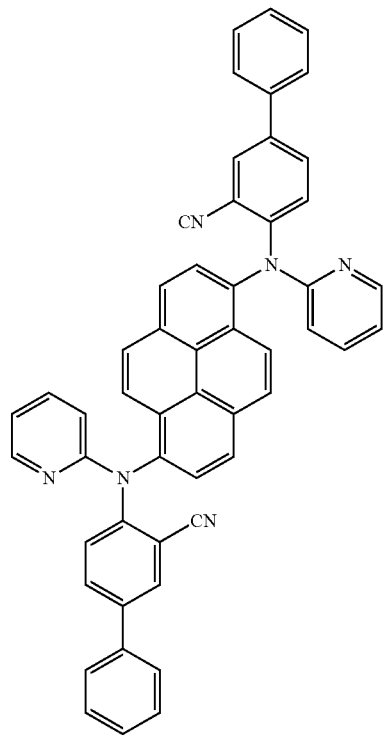
FD5
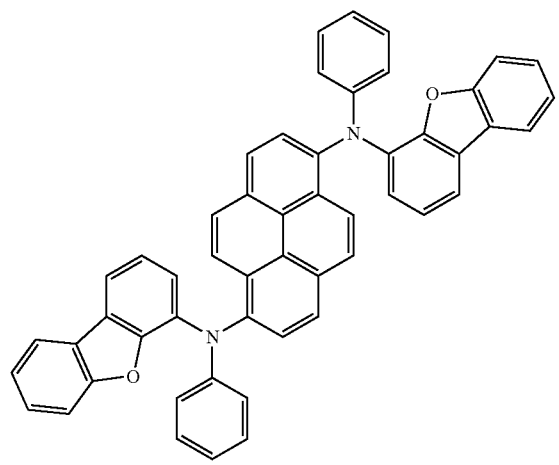
FD6
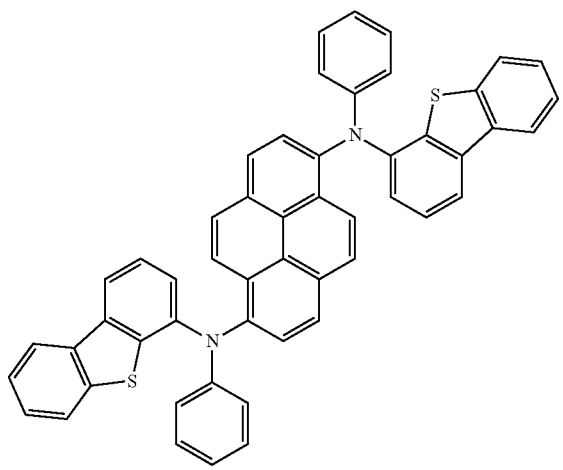

-continued
FD7
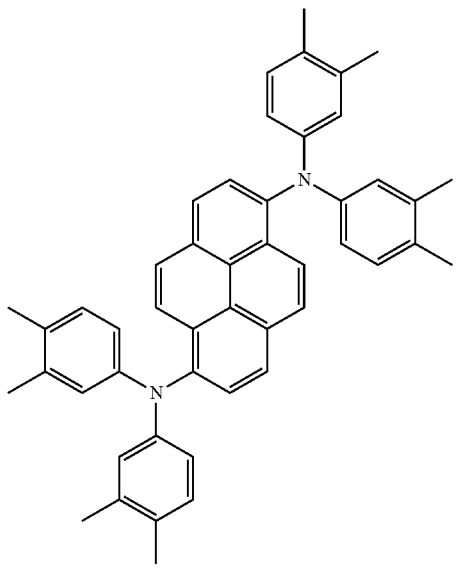
FD8
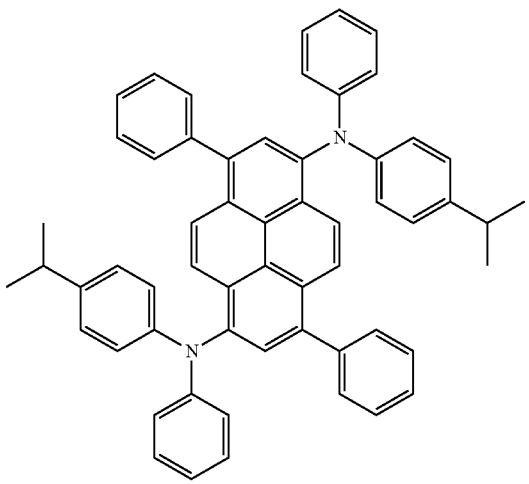
FD9
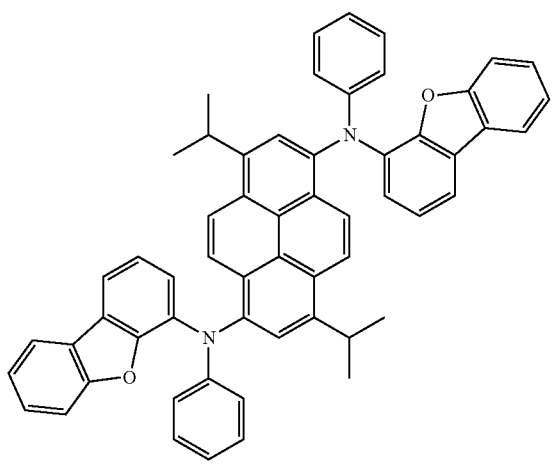
FD10
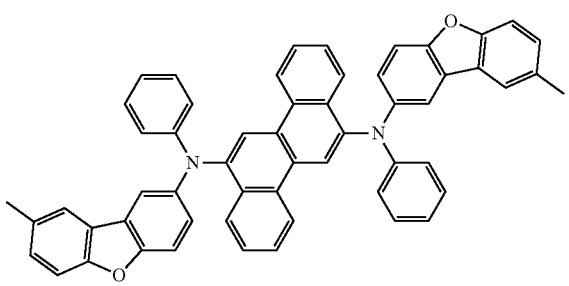
FD11
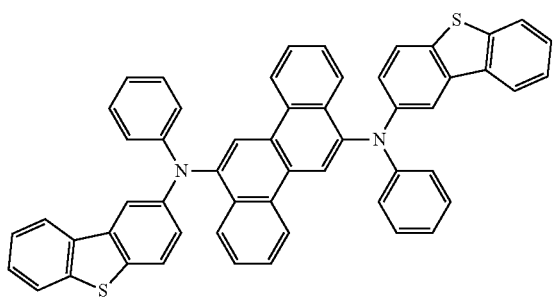
FD12
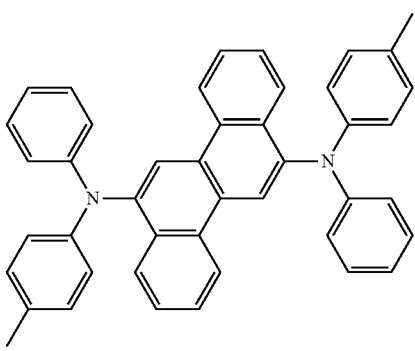

-continued
FD13
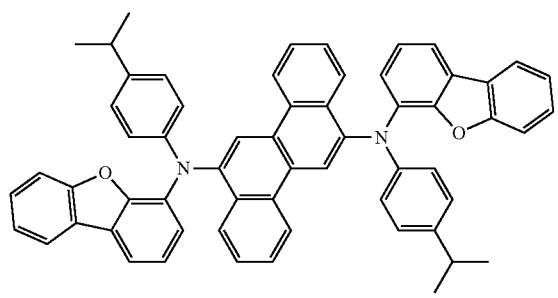
FD14
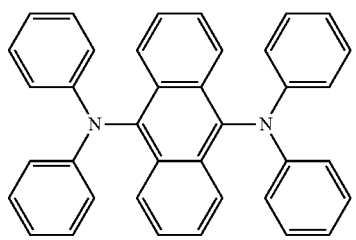
FD15
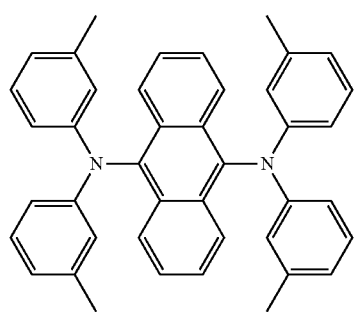
FD16
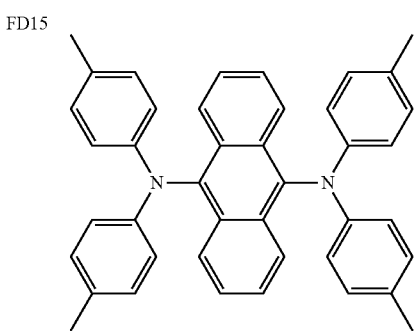
FD17
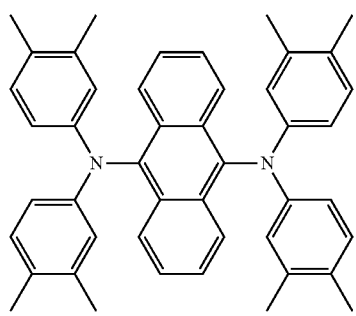
FD18
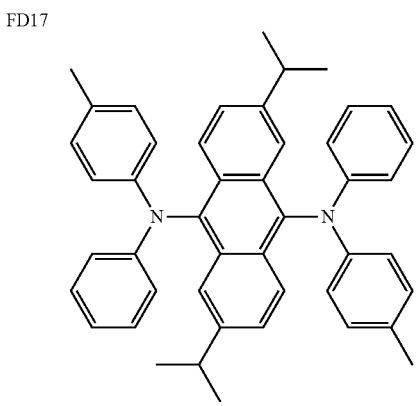
FD19
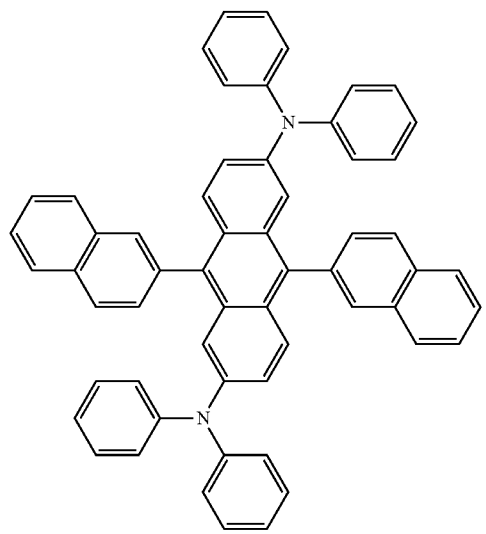
FD20
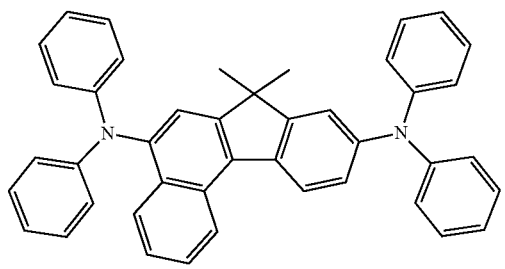

-continued
FD21
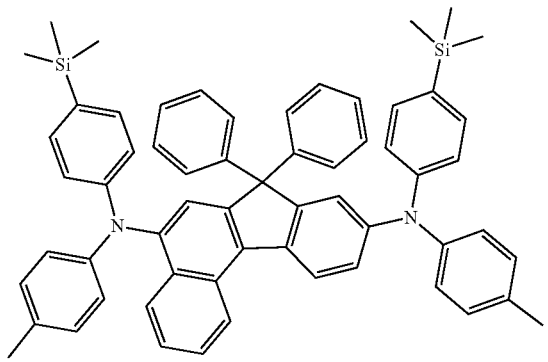
FD22
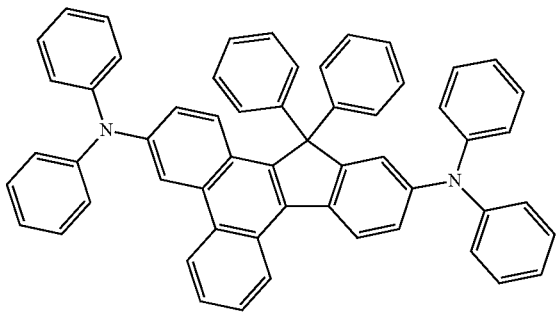
FD23
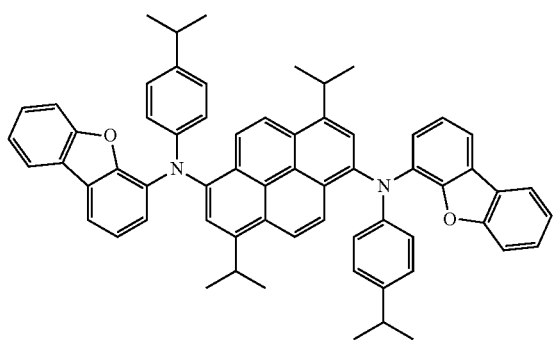
FD24
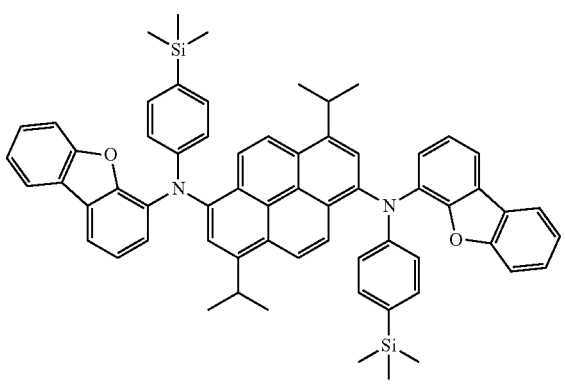
FD25
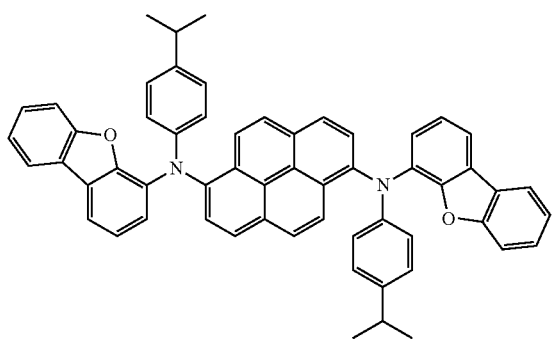
FD26
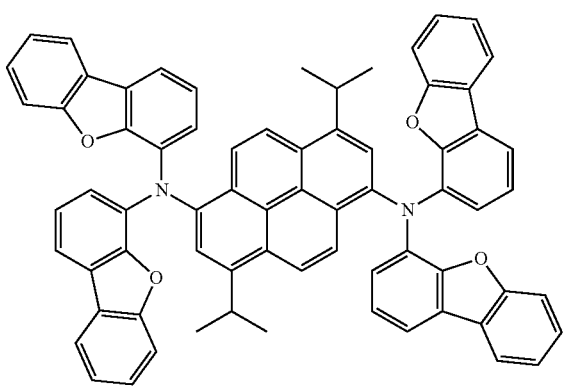
FD27
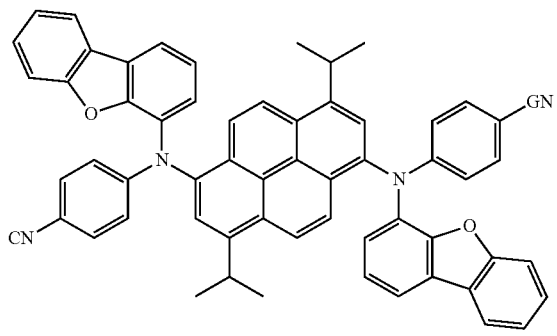
FD28
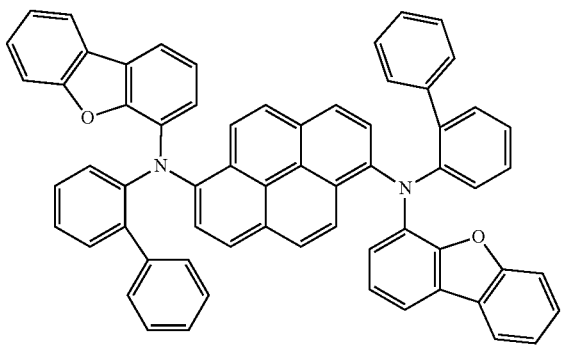

-continued
FD29
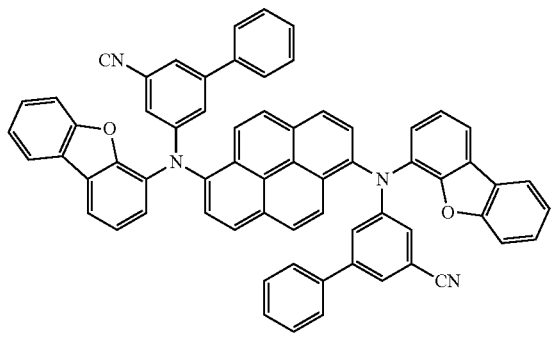
FD30
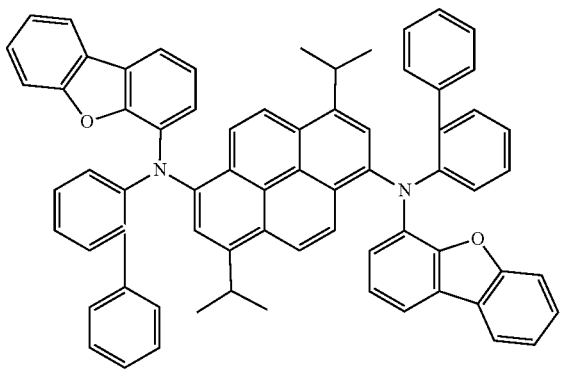
FD31
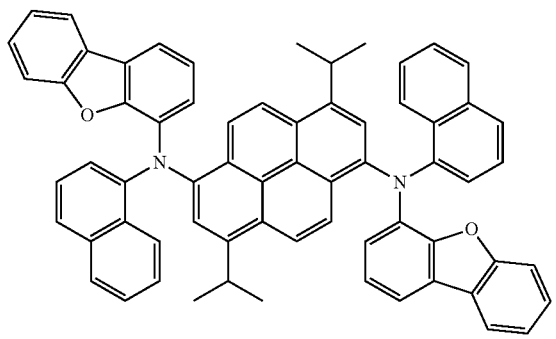
FD32
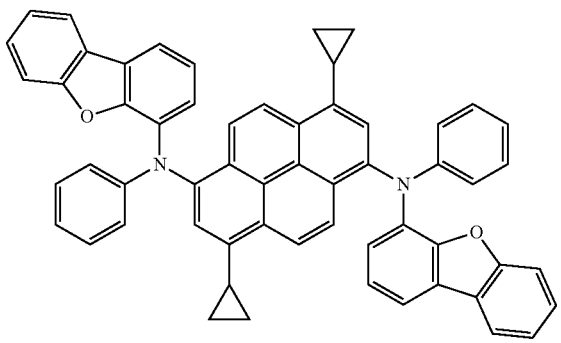
FD33
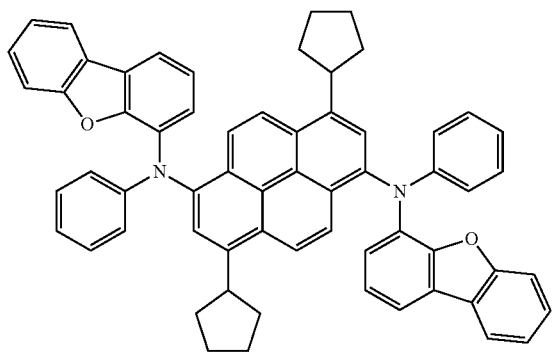
FD34
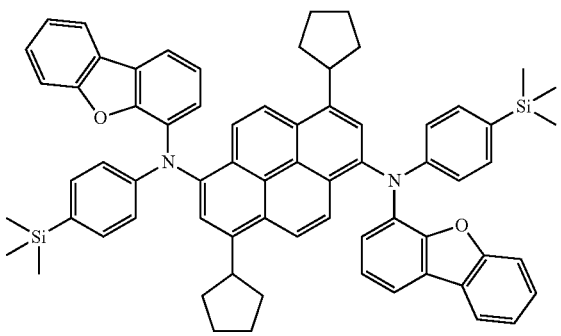
FD35
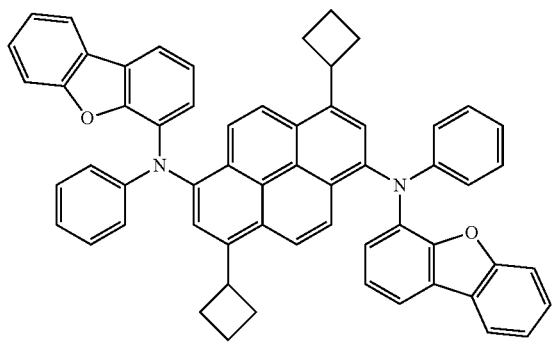
FD36
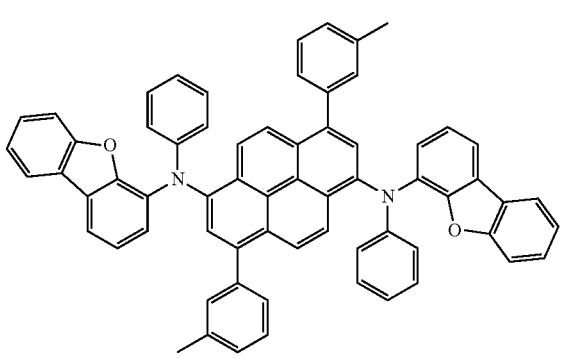

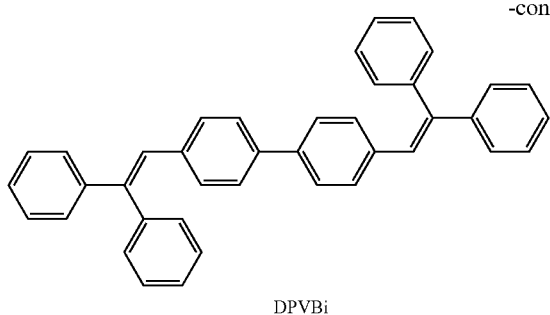

DPVBi

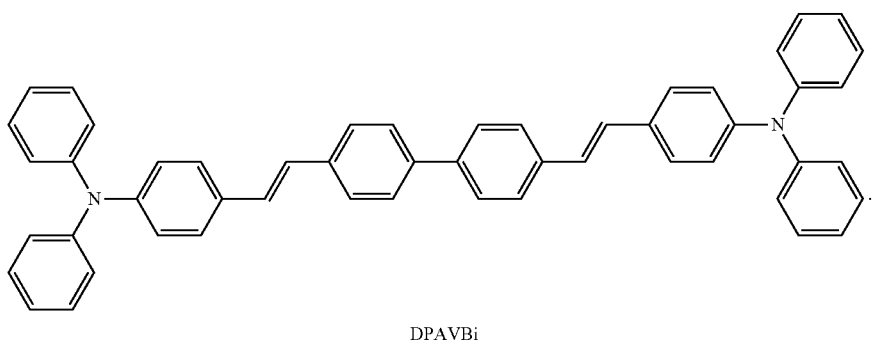

DPAVBi

Delayed Fluorescence Material

The emission layer may further include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type (or kind) of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include i) a material including at least one electron donor (for example, a n electron-rich $C_3$-$C_{60}$ cyclic group, such as a carbazole group) and at least one electron acceptor (for example, a sulfoxide group, a cyano group, or a n electron-deficient nitrogen-containing $C_1$-$C_{60}$ cyclic group), and ii) a material including a $C_8$-$C_{60}$ polycyclic group in which two or more cyclic groups are condensed together while sharing boron (B).

Examples of the delayed fluorescence material may include at least one selected from the following compounds DF1 to DF9:

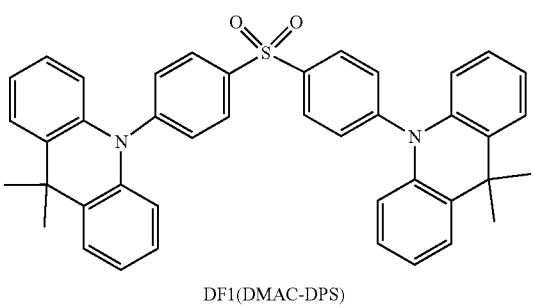

DF1(DMAC-DPS)

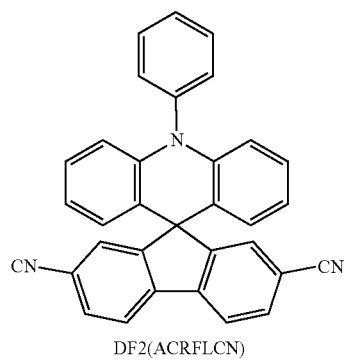

DF2(ACRFLCN)

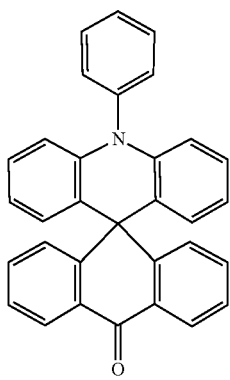

DF3(ACRSA)

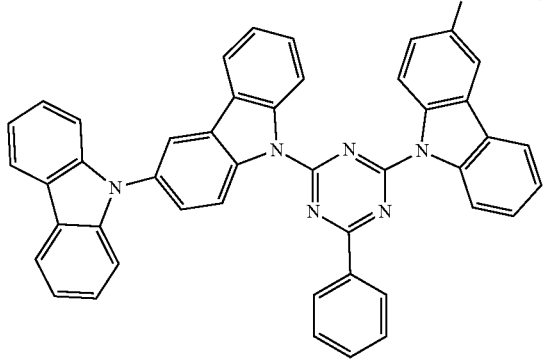

DF4(CC2TA)

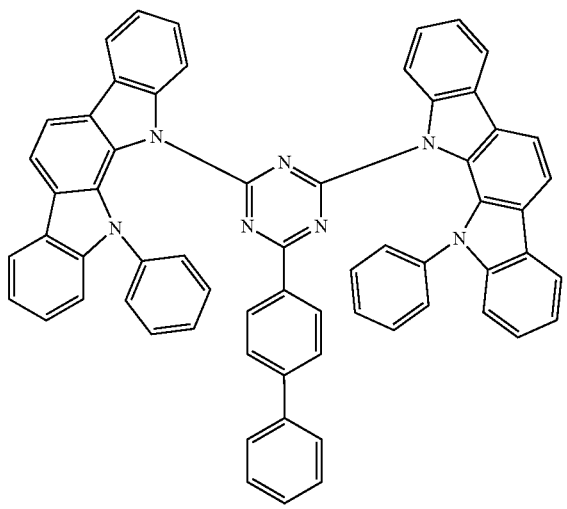

DF5(PIC-TRZ)

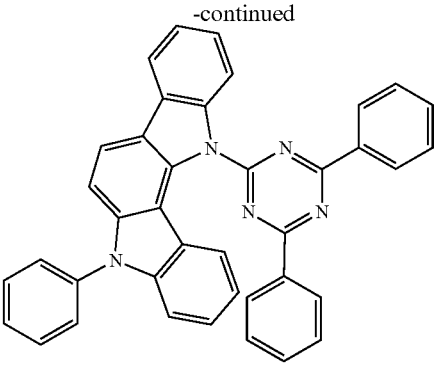

DF6(PIC-TRZ2)

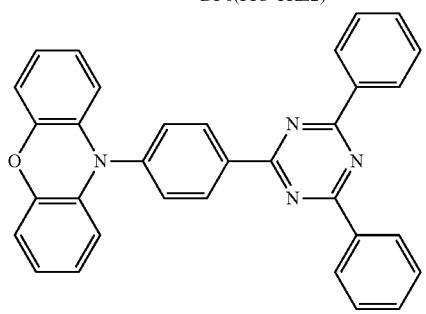

DF7(PXZ-TRZ)

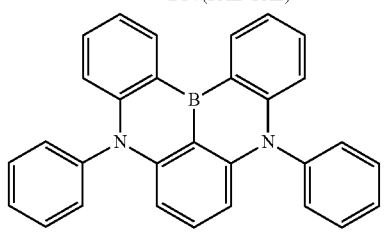

DF8(DABNA-1)

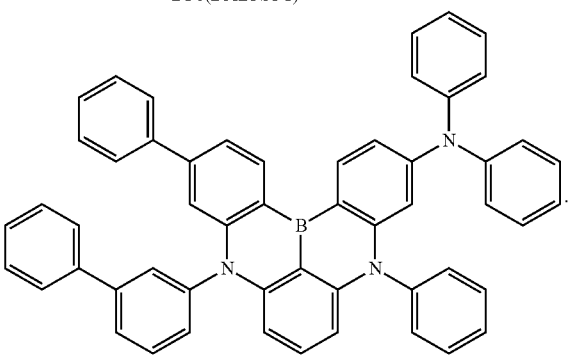

DF9(DABNA-2)

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole-blocking layer, an electron control layer, an electron transport layer, an electron injection layer, or any combination thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport region (for example, the buffer layer, the hole-blocking layer, the electron control layer, or the electron transport layer in the electron transport region) may include a metal-free compound including at least one n electron-deficient nitrogen-containing $C_1$-$C_{60}$ cyclic group.

For example, the electron transport region may include a compound represented by Formula 601 below:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{601})(Q_{602})(Q_{603})$, —C(=O)$(Q_{601})$, —S(=O)$_2$$(Q_{601})$, or —P(=O)$(Q_{601})(Q_{602})$, $Q_{601}$ to $Q_{603}$ may each be the same as described herein with respect to $Q^1$, xe21 may be 1, 2, 3, 4, or 5, at least one selected from $Ar_{601}$, $L_{601}$, and $R_{601}$ may each independently be a n electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$ (s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

Formula 601-1

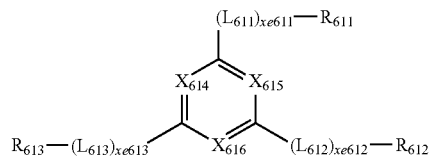

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET46, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

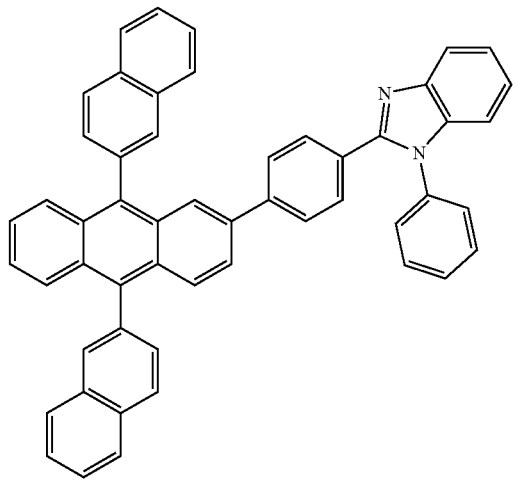

ET2

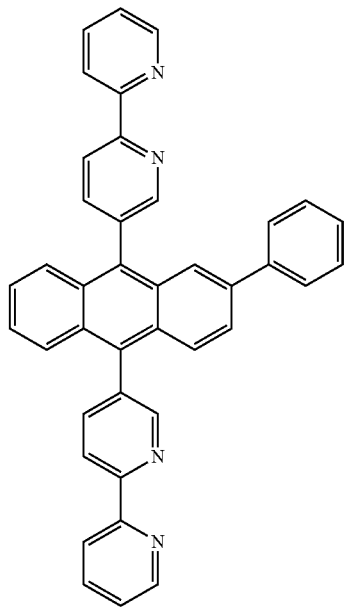

-continued
ET3
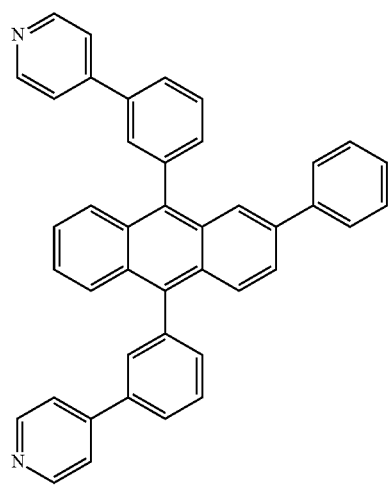
ET6
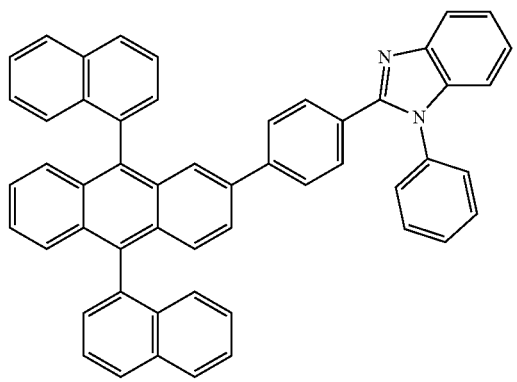
ET4
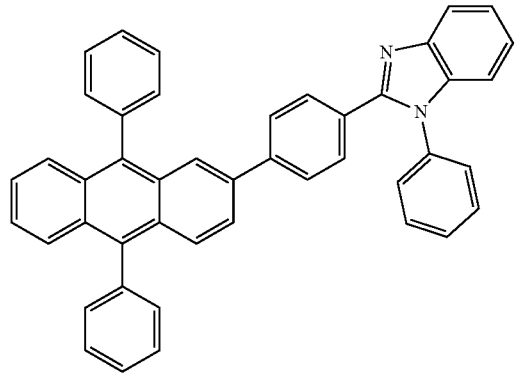
ET7
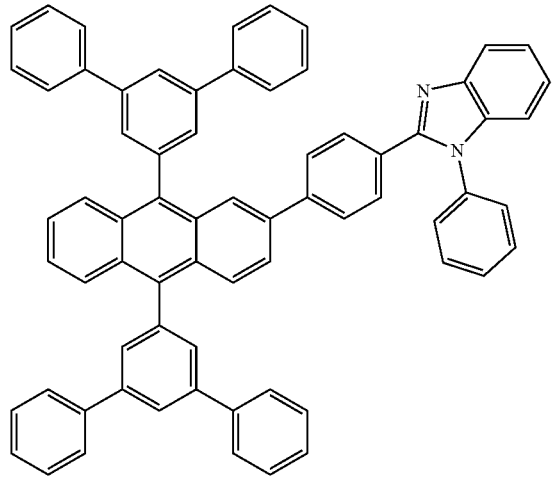
ET5
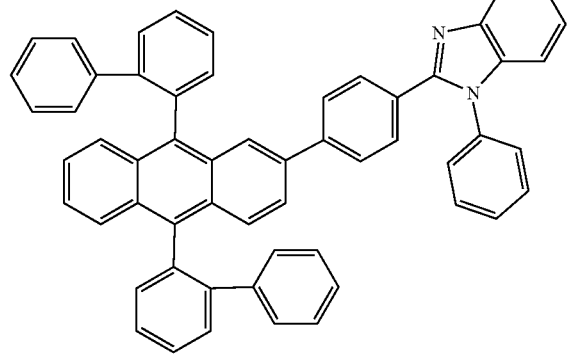
ET8
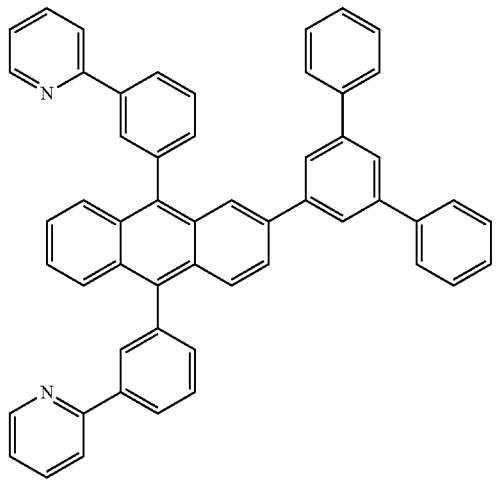

ET9
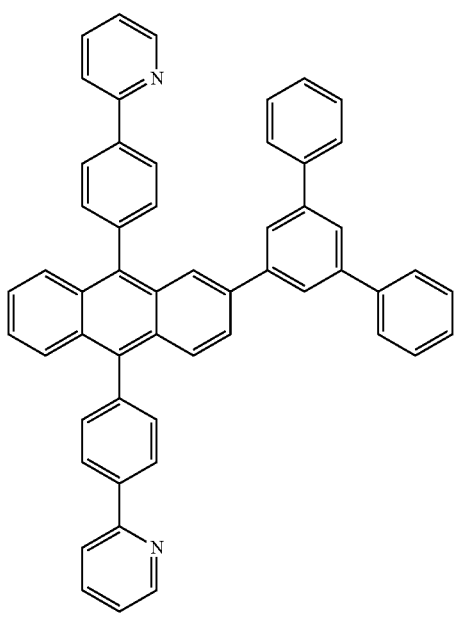
ET10
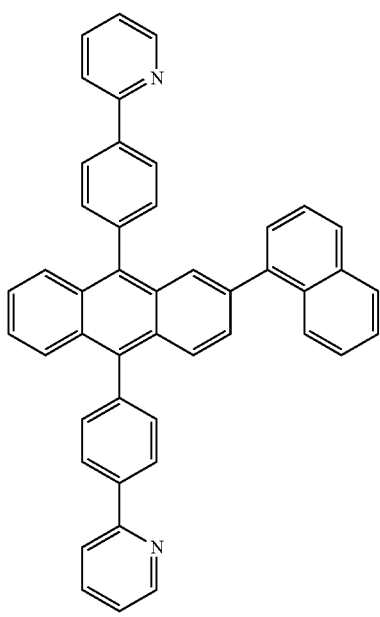
ET11
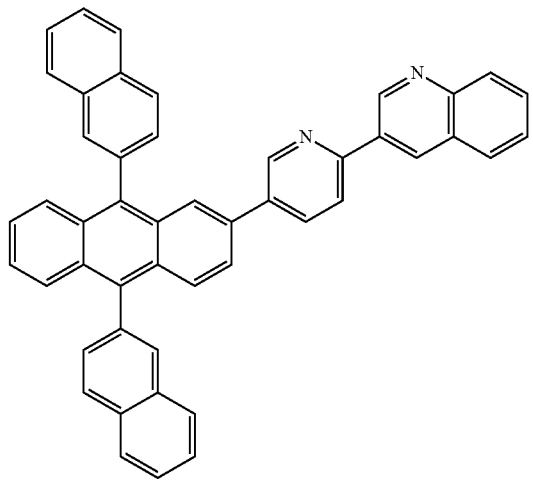
ET12
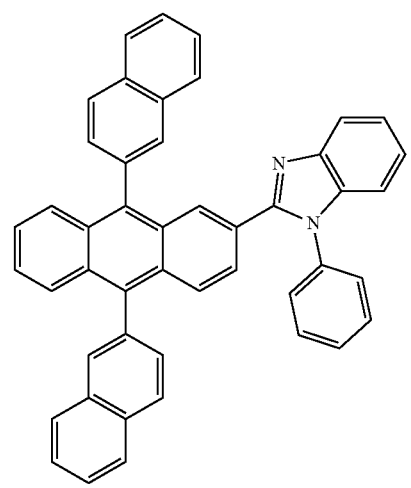
ET13
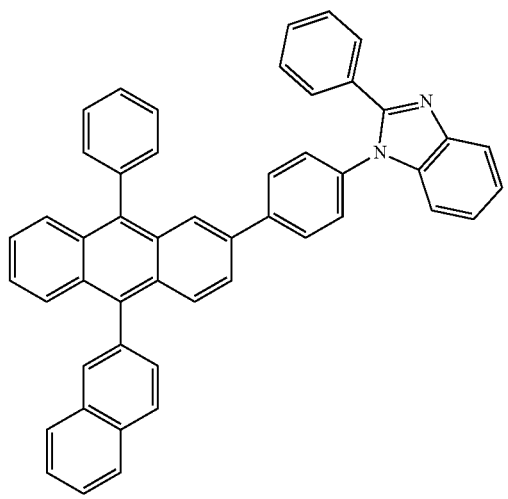

ET14
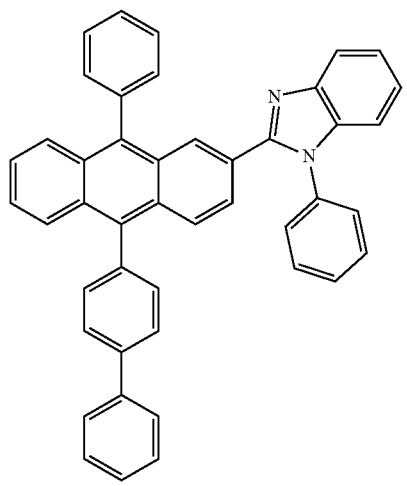
ET15
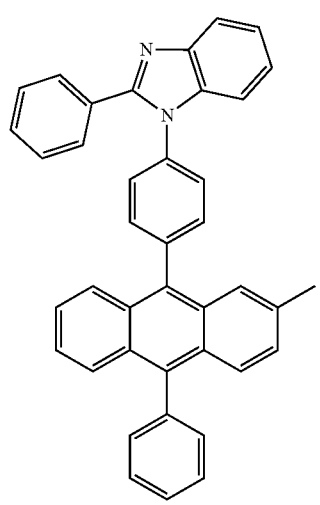
ET16
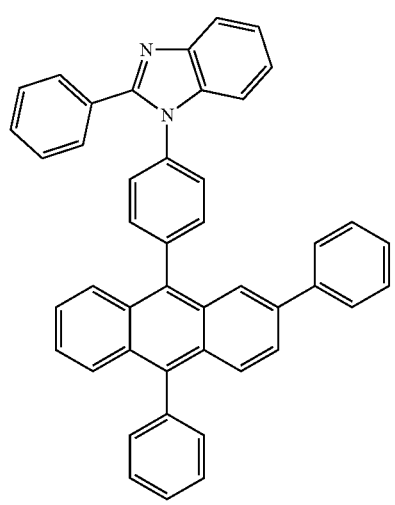
ET17
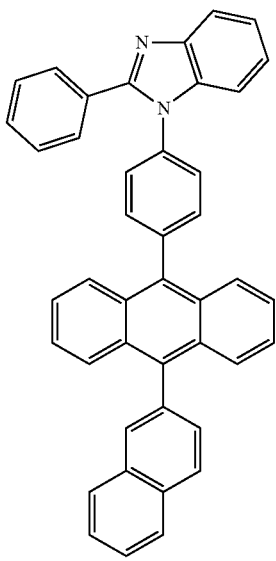
ET18
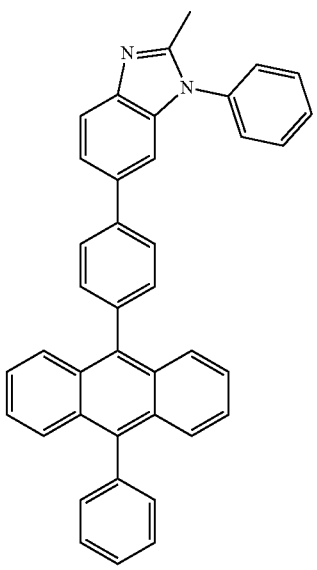
ET19

ET20
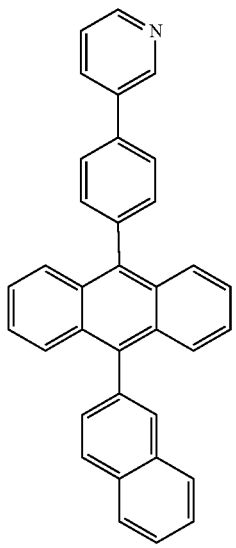
ET23
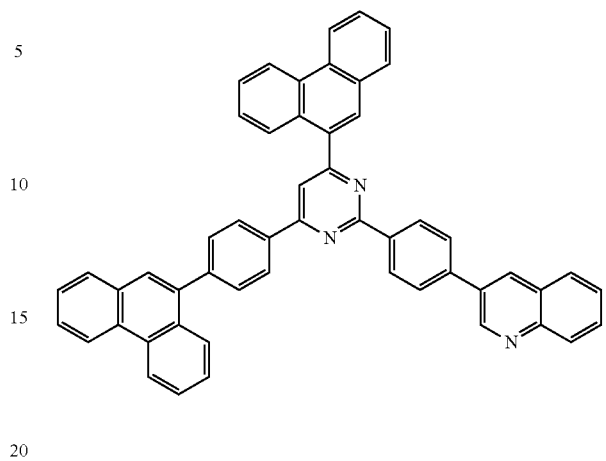
ET21
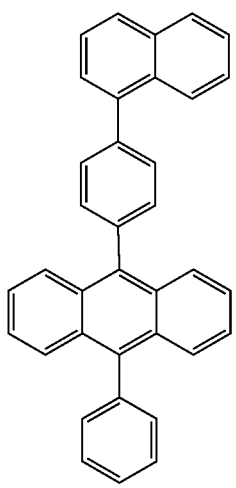
ET24
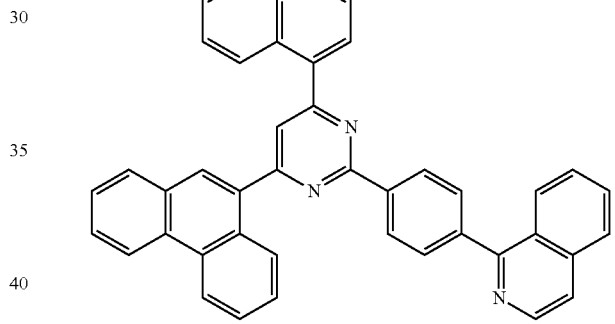
ET22
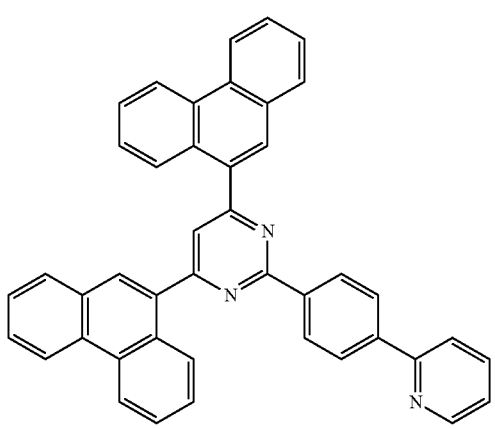
ET25
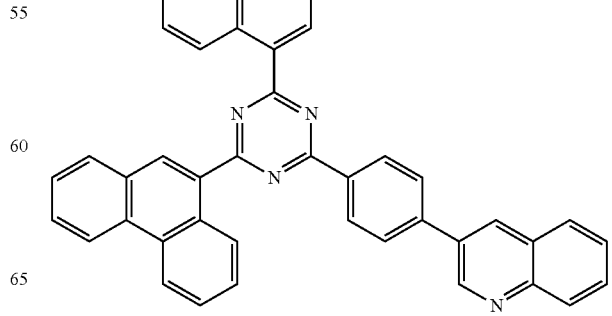

ET26
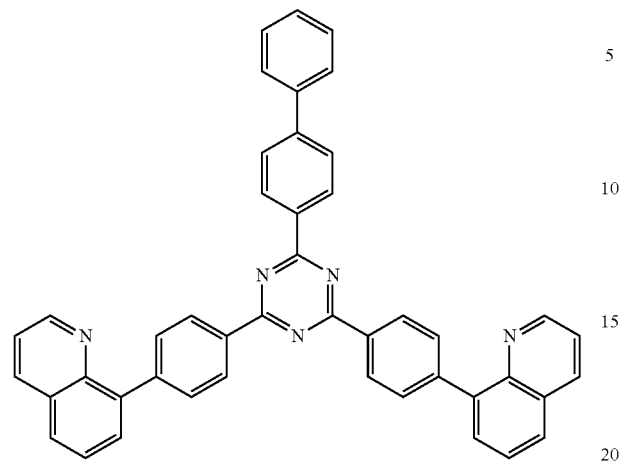
ET29
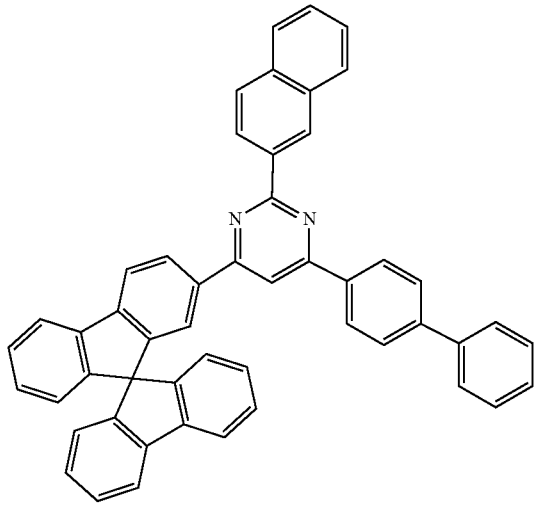
ET27
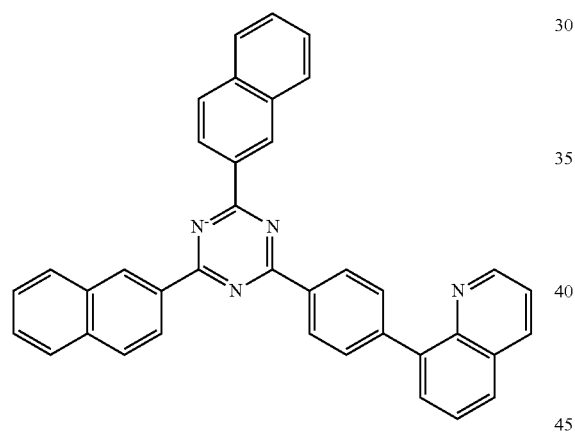
ET30
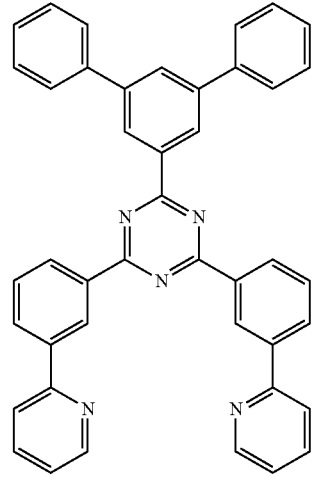
ET28
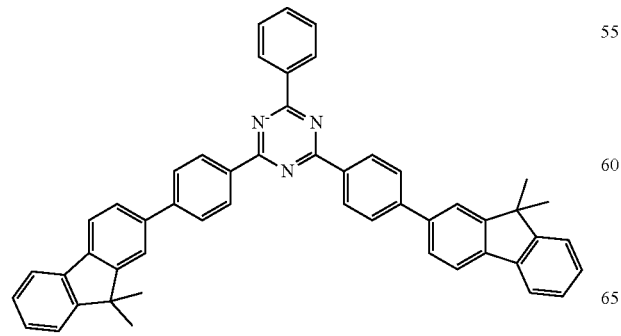
ET31
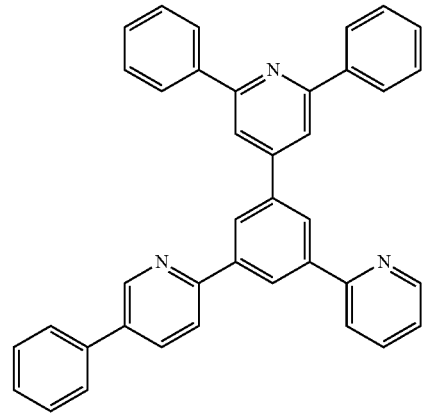

ET32
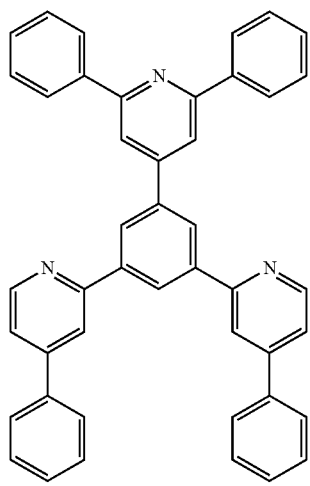
ET35
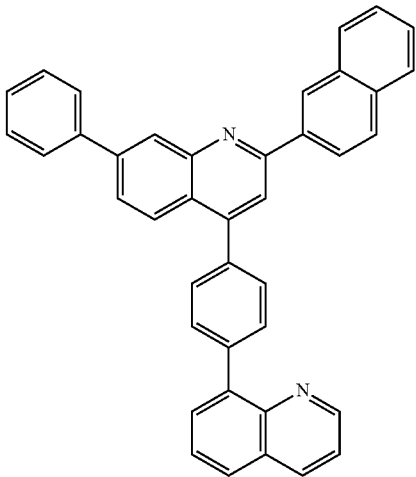
ET33
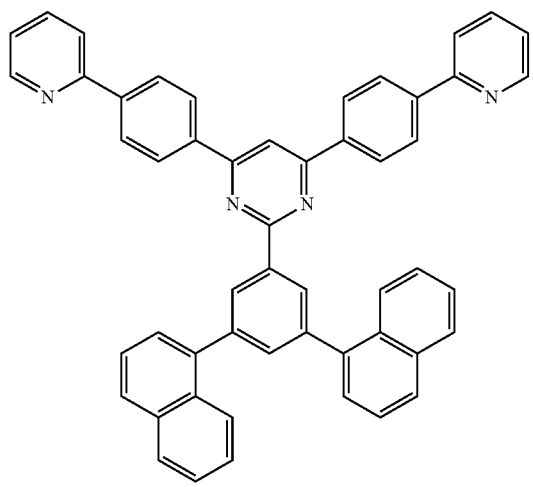
ET36
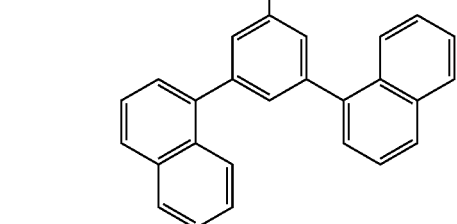
ET37
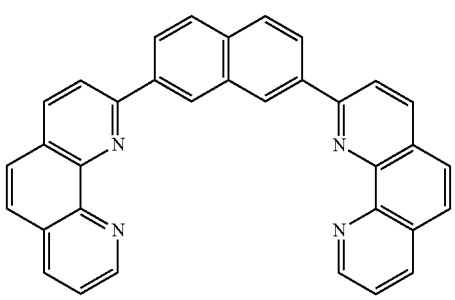
ET34
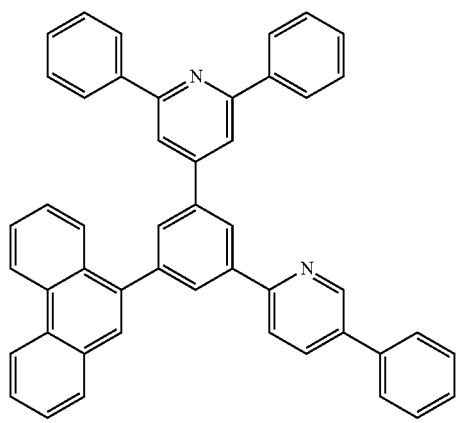
ET38
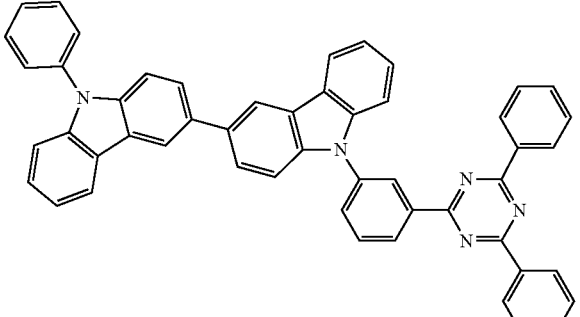

ET39
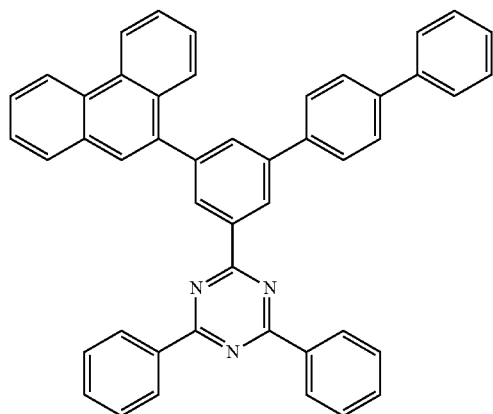
ET42
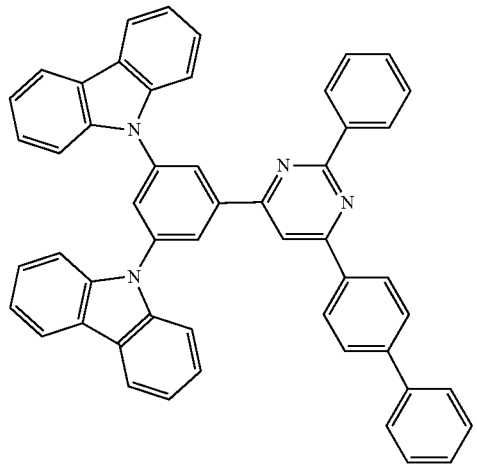
ET40
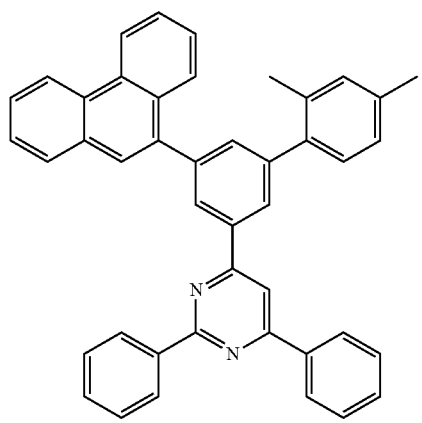
ET43
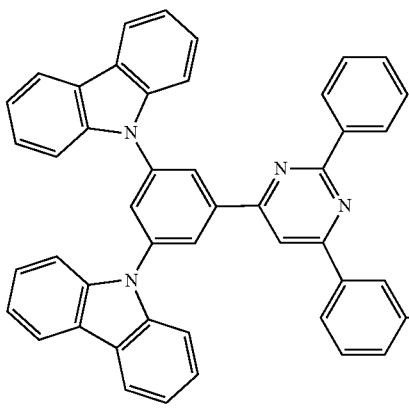
ET41
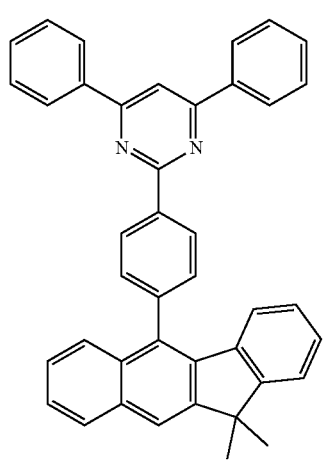
ET44
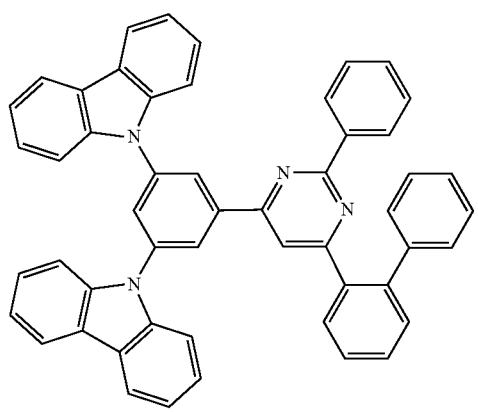
ET45
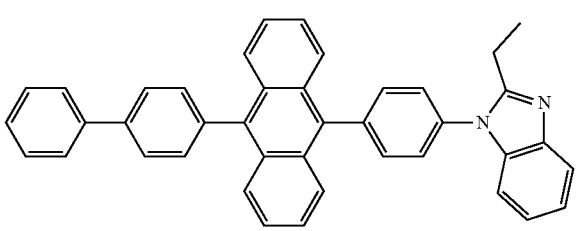

-continued

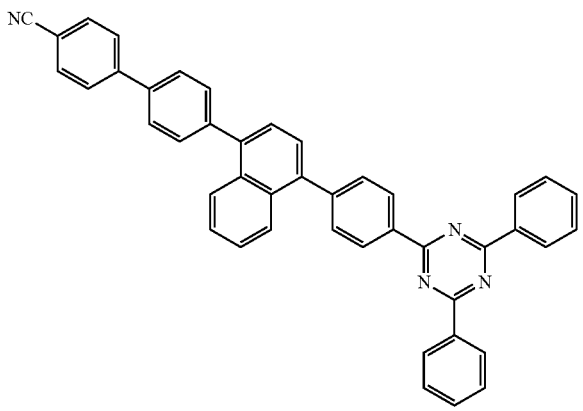
ET46

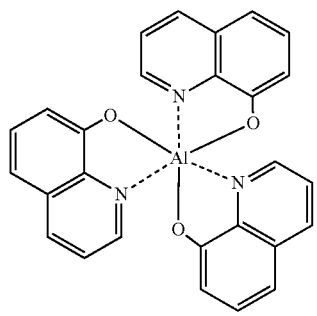
Alq₃

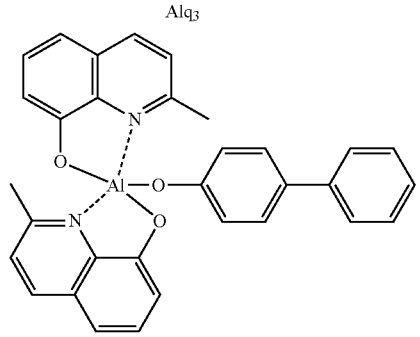
BAlq

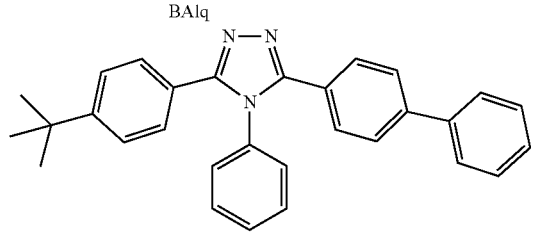
TAZ

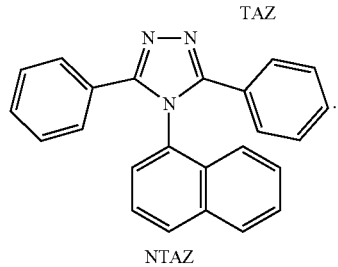
NTAZ

A thickness of the electron transport region may be from about 100 Å to about 5,000 Å, for example, about 160 Å to about 4,000 Å. When the electron transport region includes a buffer layer, a hole-blocking layer, an electron control layer, an electron transport layer, or any combination thereof, the thickness of the buffer layer, the hole-blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole-blocking layer, the electron control layer, the electron transport layer, and/or the electron transport layer are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or ET-D2:

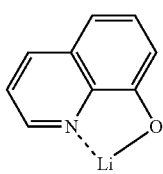
ET-D1

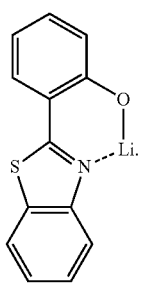
ET-D2

The electron transport region may include an electron injection layer that facilitates the injection of electrons from the second electrode 150. The electron injection layer may be in direct contact (e.g., physical contact) with the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof.

The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or any combination thereof.

The alkali metal-containing compound may include: alkali metal oxides, such as $Li_2O$, $Cs_2O$, and/or $K_2O$; alkali metal halides, such as LiF, NaF, CsF, KF, LiI, NaI, CsI, Kl, RbI; or any combination thereof. The alkaline earth metal-containing compound may include an alkaline earth metal compound, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one selected from metal ions of the alkali metal, the alkaline earth metal, and the rare earth metal and ii) as a ligand linked to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, suitable or satisfactory electron injection characteristics may be obtained without a substantial increase in driving voltage.

Second Electrode 150

The second electrode 150 may be on the interlayer 130 having a structure as described above. The second electrode 150 may be a cathode, which is an electron injection electrode, and as the material for the second electrode 150, a metal, an alloy, an electrically conductive compound, or any combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure consisting of a single layer, or a multi-layered structure including a plurality of layers.

Second Capping Layer 170

The second capping layer 170 contains an amine-containing compound as described in the present specification. The amine-containing compound is the same as described in the present specification.

Electronic Apparatus

The light-emitting device may be included in various suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be in at least one direction in which light emitted from the light-emitting device travels. For example, the light emitted from the light-emitting device may be blue light, green light, or white light. For more details on the light-emitting device, related description provided above may be referred to. In one or more embodiments, the color conversion layer may include a quantum dot.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (or the plurality of color conversion areas) may include a first area that may emit a first color light, a second area that may emit a second color light, and/or a third area that may emit a third color light, wherein the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. In some embodiments, the first area may include a red quantum dot, the second area may include a green quantum dot, and the third area may not include a quantum dot. For more details on the quantum dot, related descriptions provided herein may be referred to. The first area, the second area, and/or the third area may each further include a scatterer (e.g., a light scatterer).

For example, the light-emitting device may emit a first light, the first area may absorb the first light to emit a first-first color light, the second area may absorb the first light to emit a second-first color light, and the third area may absorb the first light to emit a third-first color light. In some embodiments, the first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one selected from the source electrode and the drain electrode may be electrically connected to any one selected from the first electrode and the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, that may emit a or the like.

The electronic apparatus may further include a sealing portion for sealing the light-emitting device. The sealing portion may be between the color filter and/or the color conversion layer and the light-emitting device. The sealing portion allows light from the light-emitting device to be extracted to the outside, and concurrently (e.g., simultaneously) prevents or reduces penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
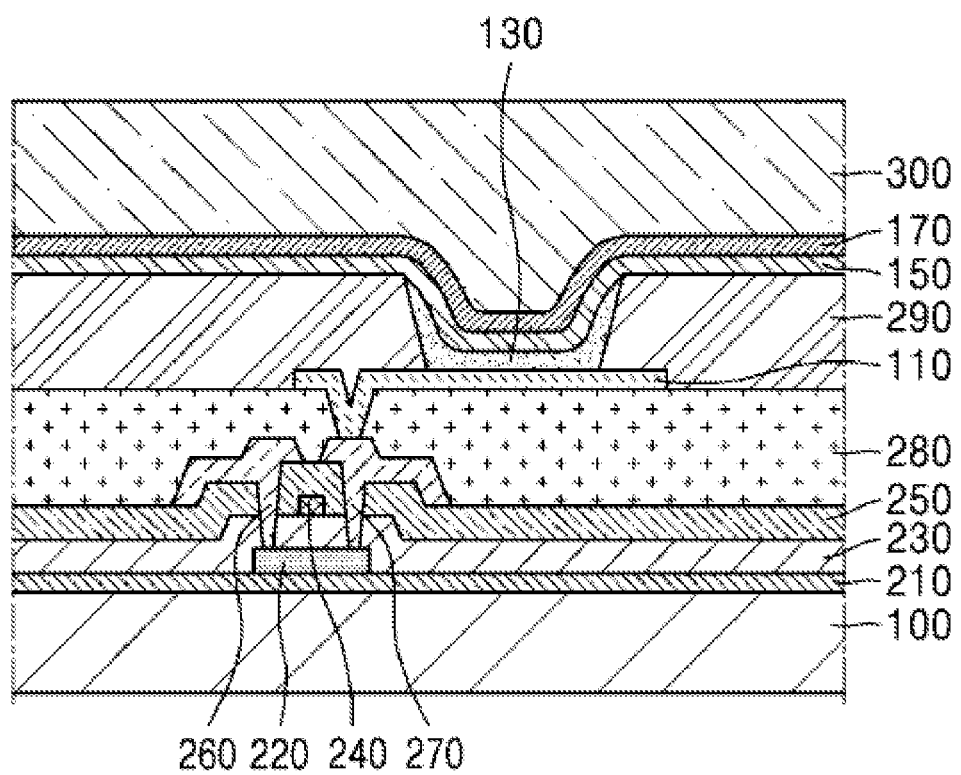
FIG. 2 shows a schematic view of an electronic apparatus according to an embodiment.
Figure 3:
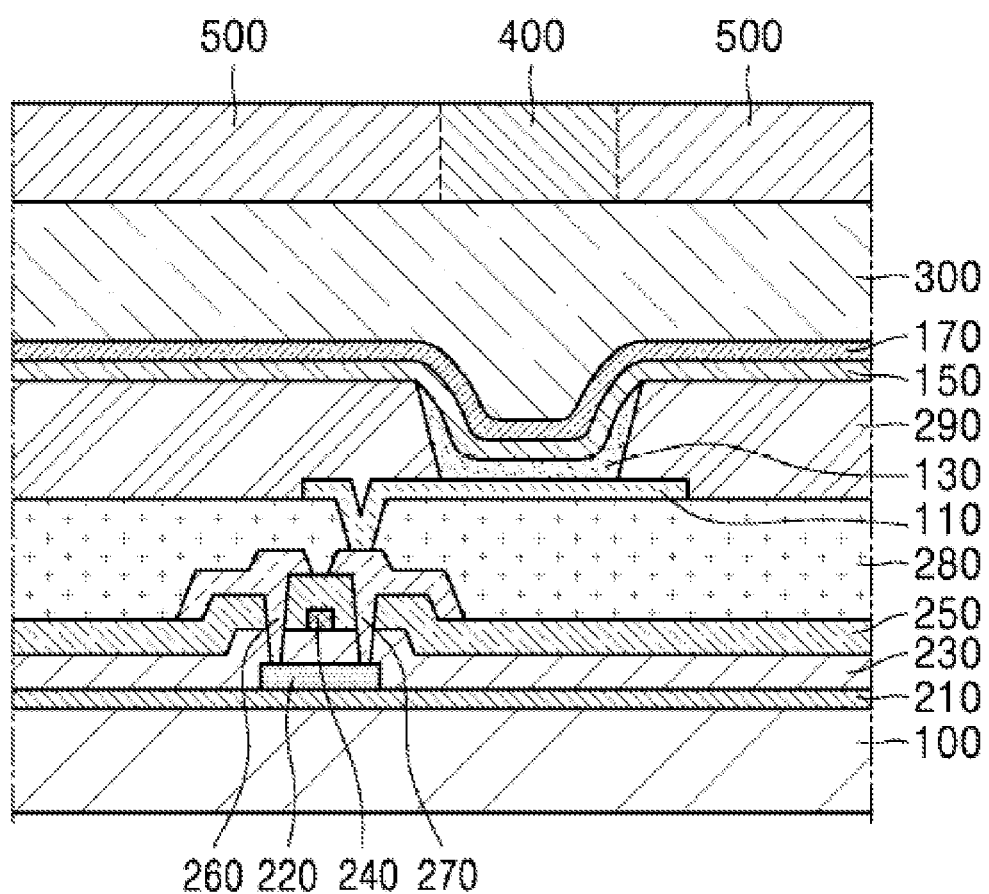
FIG. 3 shows a schematic view of an electronic apparatus according to an embodiment.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100 and may provide a flat surface on the substrate 100.

A TFT may be on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270, to insulate from one another.

The source electrode 260 and the drain electrode 270 may be on the interlayer insulating film 250. The interlayer insulating film 250 and the gate insulating film 230 may expose the source region and the drain region of the activation layer 220, and the source electrode 260 and the drain electrode 270 may be in contact (e.g., physical contact) with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be on the passivation layer 280. The passivation layer 280 may expose a portion of the drain electrode 270, not fully covering the drain electrode 270, and the first electrode 110 may be connected to the exposed portion of the drain electrode 270.

A pixel defining layer 290 including an insulating material may be on the first electrode 110. The pixel defining layer 290 may expose a certain region of the first electrode 110, and an interlayer 130 may be formed in the exposed region of the first electrode 110. The pixel defining layer 290 may be a polyimide and/or polyacrylic organic film. In some embodiments, at least some layers of the interlayer 130 may extend beyond the upper portion of the pixel defining layer 290 in the form of a common layer.

A second electrode 150 may be on the interlayer 130, and a second capping layer 170 may be additionally on the second electrode 150. The second capping layer 170 may cover the second electrode 150.

The encapsulation portion 300 may be on the second capping layer 170. The encapsulation portion 300 may be on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 3 shows a cross-sectional view showing a light-emitting apparatus according to an embodiment of the present disclosure.

The light-emitting apparatus of FIG. 3 is substantially the same as the light-emitting apparatus of FIG. 2, except that a light-shielding pattern 500 and a functional region 400 are additionally on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacturing Method

The layers included in the hole transport region, the emission layer, and the layers included in the electron transport region may be formed in a certain region by using various suitable methods such as vacuum deposition, spin coating, casting, Langmuir-Blodgett (LB) deposition, ink-jet printing, laser-printing, laser-induced thermal imaging, and/or the like.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

DEFINITION OF TERMS

The term "$C_3$-$C_{60}$ carbocyclic group," as used herein, refers to a cyclic group consisting of carbon only as a ring-forming atom and having three to sixty carbon atoms, and the term "$C_1$-$C_{60}$ heterocyclic group," as used herein, refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed together with each other. For example, the $C_1$-$C_{60}$ heterocyclic group has 3 to 61 ring-forming atoms.

The term "cyclic group," as used herein, may include the $C_3$-$C_{60}$ carbocyclic group, and the $C_1$-$C_{60}$ heterocyclic group.

The term "n electron-rich $C_3$-$C_{60}$ cyclic group," as used herein, refers to a cyclic group that has three to sixty carbon atoms and does not include *—N=*' as a ring-forming moiety, and the term "n electron-deficient nitrogen-containing $C_1$-$C_{60}$ cyclic group," as used herein, refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed together with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed together with each other, or iii) a condensed cyclic group in which at least one group T2 and at least one group T1 are condensed together with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed together with each other, iii) group T3, iv) a condensed cyclic group in which two or more groups T3 are condensed together with each other, or v) a condensed cyclic group in which at least one group T3 and at least one group T1 are condensed together with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed together with each other, iii) a condensed cyclic group in which at least one group T4 and at least one group T1 are condensed together with each other, iv) a condensed cyclic group in which at least one group T4 and at least one group T3 are condensed together with each other, or v) a condensed cyclic group in which at least one group T4, at least one group T1, and at least one group T3 are condensed together with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group," as used herein, refer to a group condensed to any cyclic group, a monovalent group, or a polyvalent group (for example, a divalent group, a trivalent group, a tetravalent group, etc.) according to the structure of a formula for which the corresponding term is used. For example, the "benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of the $C_2$-$C_{60}$ alkyl group, and examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group of 1 to 10 carbon atoms, further including, in addition to carbon atoms, at least one heteroatom, as ring-forming atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has three to ten carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system of 6 to 60 carbon atoms, and the term "$C_6$-$C_{60}$ arylene group," as used herein, refers to a divalent group having a carbocyclic aromatic system of 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed together with each other.

The term "$C_1$-$C_{60}$ heteroaryl group," as used herein, refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group," as used herein, refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed together with each other.

The term "monovalent non-aromatic condensed polycyclic group," as used herein, refers to a monovalent group (for example, having 8 to 60 carbon atoms) having two or more rings condensed to each other, only carbon atoms as ring-forming atoms, and no aromaticity in its entire molecular structure (e.g., is not aromatic when considered as a whole). Examples of the monovalent non-aromatic condensed polycyclic group include an indenyl group, a fluorenyl group, a spiro-bifluorenyl group, a benzofluorenyl group, an indenophenanthrenyl group, and an indeno anthracenyl group. The term "divalent non-aromatic condensed polycyclic group," as used herein, refers to a divalent group having substantially the same structure as the monovalent non-aromatic condensed polycyclic group described above.

The term "monovalent non-aromatic condensed heteropolycyclic group," as used herein, refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure (e.g., is not aromatic when considered as a whole). Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group described above.

The term "$C_6$-$C_{60}$ aryloxy group," as used herein, indicates —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "$C_7$-$C_{60}$ aryl alkyl group," as used herein, refers to -$A_{104}A_{106}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group," as used herein, refers to -$A_{106}A_{107}$ (where $A_{106}$ may be a $C_1$-$C_{60}$ alkylene group, and $A_{107}$ may be a $C_1$-$C_{60}$ heteroaryl group).

The term "$R_{10a}$," as used herein, refers to:
  deuterium, —F, —Cl, —Br, —I, a hydroxyl group, a cyano group, or a nitro group,
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof,
  a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
  —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ in the present specification may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom," as used herein, refers to any suitable atom other than a carbon atom. Examples of the heteroatom include O, S, N, P, Si, B, Ge, Se, and any combinations thereof.

The term "third-row transition metal," as used herein, includes hafnium (Hf), tantalum (Ta), tungsten (W), rhenium (Re), osmium (Os), iridium (Ir), platinum (Pt), gold (Au), and the like.

"Ph," as used herein, refers to a phenyl group, "Me," as used herein, refers to a methyl group, "Et," as used herein, refers to an ethyl group, "ter-Bu" or "But," as used herein, refers to a tert-butyl group, and "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula or moiety.

Hereinafter, a light-emitting device according to embodiments will be described in more detail with reference to Examples.

EXAMPLES

Evaluation Example 1

According to the method in Table 1, the HOMO energy level, LUMO energy level, band gap and triplet ($T_1$) energy of each of Compounds PD01, PD02, PD04, PD05, PD06, PD07, PD09, A01, A02, and A03 were evaluated. The results are shown in Table 2.

TABLE 1

| | |
|---|---|
| HOMO energy level evaluation method | By using cyclic voltammetry (CV) (electrolyte: 0.1M Bu$_4$NPF$_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By using cyclic voltammetry (CV) (electrolyte: 0.1M Bu$_4$NPF$_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |
| Band gap evaluation method | The absolute value of the difference between HOMO energy level and LUMO energy level was calculated |
| Triplet ($T_1$) energy | A mixture of 2-methyl-THF(2-MeTHF) and each compound (each compound was dissolved to a concentration of 10 μM in 3 mL of 2-MeTHF) was put into a quartz cell, which was then placed in a cryostat containing liquid nitrogen (77 K)(Oxford, DN). Then, the phosphorescent spectrum thereof was measured using a luminescence measuring instrument (PTI, Quanta Master 400), and then the triplet energy level was measured from the peak wavelength of the phosphorescent spectrum. |

TABLE 2
|  | HOMO (eV) | LUMO (eV) | Band gap (eV) | $T_1$ (eV) |
|---|---|---|---|---|
| BD01 | −4.98 | −2.48 | 2.50 | 2.38 |
| PD02 | −5.2 | −2.55 | 2.65 | 2.23 |
| PD04 | −4.84 | −2.35 | 2.45 | 2.340 |
| PD05 | −5.01 | −2.35 | 2.68 | 2.38 |
| PD06 | −4.85 | −2.35 | 2.052 | 2.320 |
| PD07 | −4.86 | −2.34 | 2.52 | 2.32 |
| PD09 | −4.80 | −2.31 | 2.49 | 2.29 |
| A01 | −4.93 | −1.97 | 2.96 | 2.34 |
| A02 | −4.84 | −1.94 | 2.90 | 2.31 |
| A03 | −5.21 | −2.41 | 2.80 | 2.11 |
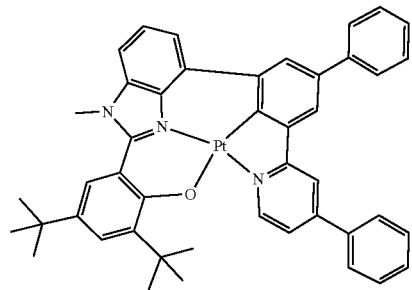
PD01
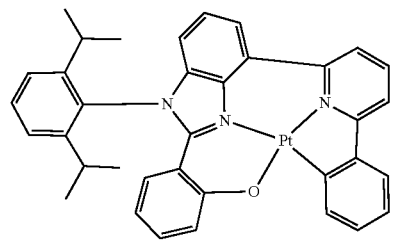
PD02
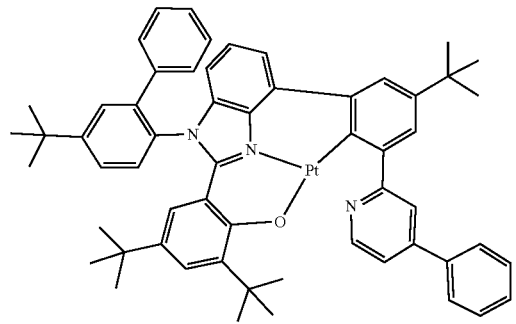
PD04
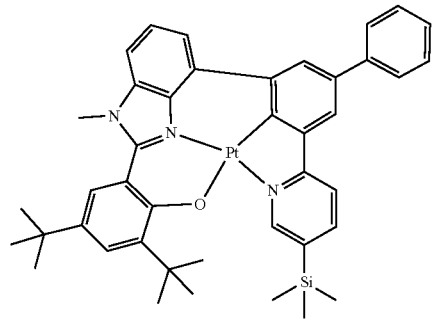
PD05

TABLE 2-continued
| HOMO (eV) | LUMO (eV) | Band gap (eV) | T$_1$ (eV) |
|---|---|---|---|
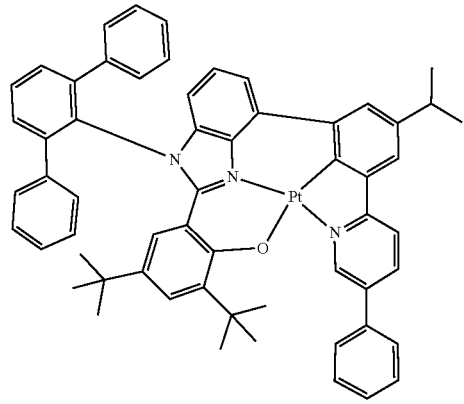
PD06
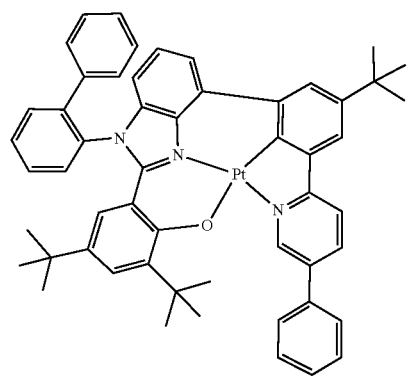
PD07
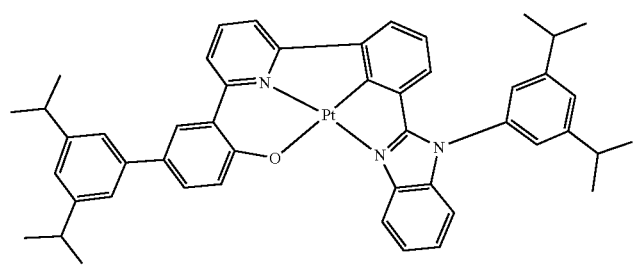
PD09
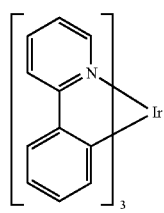
A01

TABLE 2-continued

| HOMO (eV) | LUMO (eV) | Band gap (eV) | $T_1$ (eV) |
|---|---|---|---|

[structure of A02: Ir complex with two phenylpyridine ligands and one phenyl-CD3-substituted pyridine-phenyl ligand with methyl substituent]

A02

[structure of A03: Ir complex with two phenylisoquinoline ligands and one acetylacetonate ligand]

A03

Evaluation Example 2

PMMA in $CH_2Cl_2$ solution and Compound PD01 (4 wt % to PMMA) were mixed together, and then, the resultant obtained therefrom was coated on a quartz substrate using a spin coater, and then heat treated in an oven at 80° C., followed by cooling to room temperature to manufacture a film PD01 having a thickness of 40 nm. Films PD02, PD04, PD05, PD06, PD07, PD09, A01, A02, and A03 were prepared in substantially the same manner as used to prepare film PD01, except that Compounds PD02, PD04, PD05, PD06, PD07, PD09, A01, A02, and A03 were each used instead of Compound PD01.

The emission spectrum of each of films PD01, PD02, PD04, PD05, PD06, PD07, PD09, A01, A02, and A03 were measured by using a Quantaurus-QY Absolute PL quantum yield spectrometer of Hamamatsu Inc. (equipped with a xenon light source, a monochromator, a photonic multichannel analyzer, and an integrating sphere, and using PLQY measurement software (Hamamatsu Photonics, Ltd., Shizuoka, Japan)). During measurement, the excitation wavelength was scanned from 320 nm to 380 nm at 10 nm intervals, and the spectrum measured at the excitation wavelength of 340 nm was used to obtain the maximum emission wavelength (emission peak wavelength) and FWHM of the compound included in each film. Results thereof are summarized in Table 3.

TABLE 3

| Film No. | Compound included in film (4 wt % in PMMA) | Maximum emission wavelength (nm) | FWHM (nm) |
|---|---|---|---|
| PD01 | PD01 | 526 | 32 |
| PD02 | PD02 | 543 | 25 |
| PD04 | PD04 | 527 | 53 |

TABLE 3-continued

| Film No. | Compound included in film (4 wt % in PMMA) | Maximum emission wavelength (nm) | FWHM (nm) |
|---|---|---|---|
| PD05 | PD05 | 525 | 59 |
| PD06 | PD06 | 535 | 60 |
| PD07 | PD07 | 528 | 53 |
| PD09 | PD09 | 533 | 50 |
| A01 | A01 | 516 | 62 |
| A02 | A02 | 517 | 66 |
| A03 | A03 | 633 | 46 |

From Table 3, it can be seen that Compounds PD01, PD02, PD04, PD05, PD06, PD07, and PD09 emit green light having a relatively small FWHM compared to Compounds A01 to A03.

Evaluation Example 3

Compound CP01 was deposited on a glass substrate to prepare film CP01 having a thickness of 60 nm. Then, for the film CP01, the refractive index of Compound CP01 with respect to light having a wavelength of 530 nm was measured according to the Cauchy Film Model by using an Ellipsometer M-2000 (JA Woollam) at a temperature of 25° C. and in 50% relative humidity. Results thereof are shown in Table 4. This experiment was performed on each of Compounds CP02, CP03, CP04, CP06, CP09, CP10, CP11, B01, and B02, and results thereof are shown in Table 4.

TABLE 4
| Film no. | Compound included in film | Refractive index for light having a wavelength of 530 nm |
| --- | --- | --- |
| CP01 | CP01 | 1.997 |
| CP04 | CP04 | 1.951 |
| CP06 | CP06 | 2.009 |
| CP09 | CP09 | 1.951 |
| CP10 | CP10 | 1.974 |
| CP11 | CP11 | 1.951 |
| B01 | B01 | 1.757 |
| B02 | B02 | 1.844 |
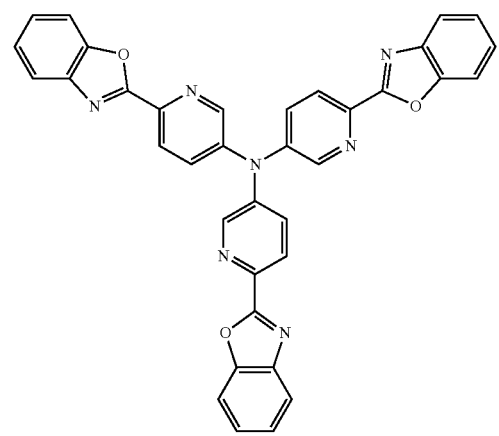
CP01
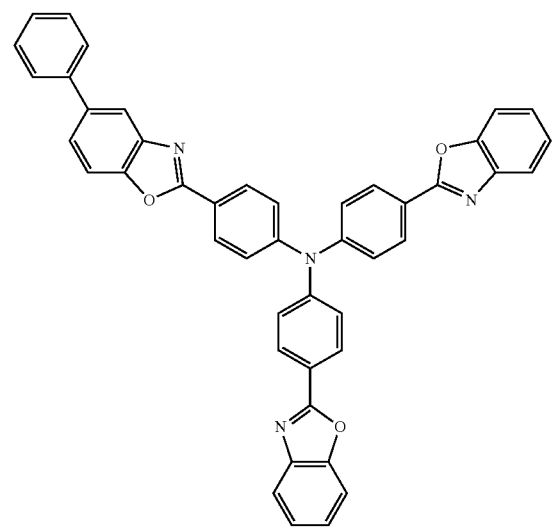
CP04

TABLE 4-continued
| Film no. | Compound included in film | Refractive index for light having a wavelength of 530 nm |
|---|---|---|
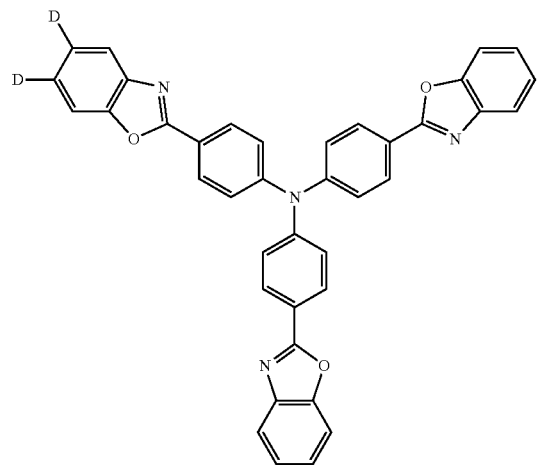
CP06
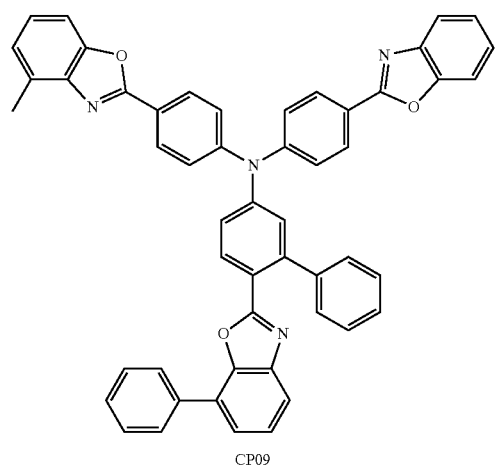
CP09
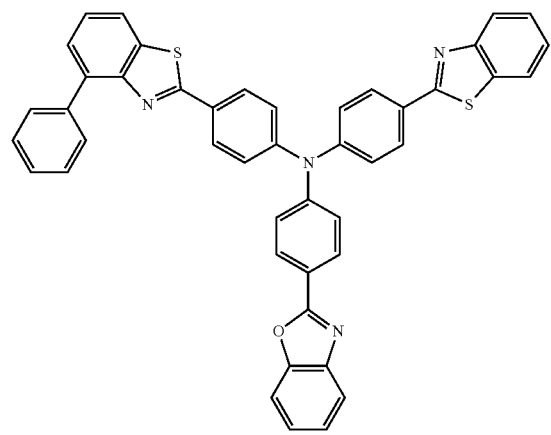
CP10

TABLE 4-continued

| Film no. | Compound included in film | Refractive index for light having a wavelength of 530 nm |
|---|---|---|

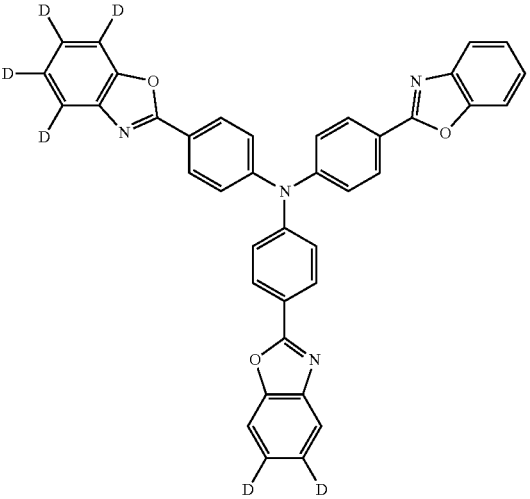
CP11

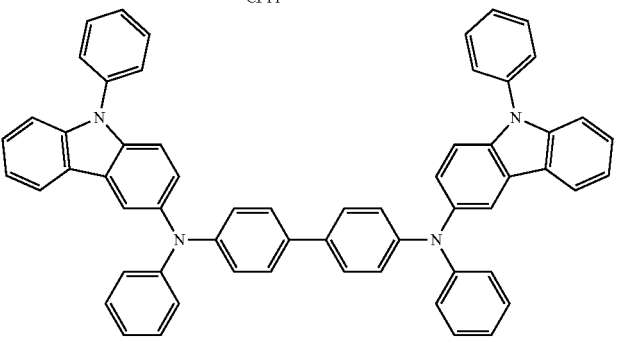
B01

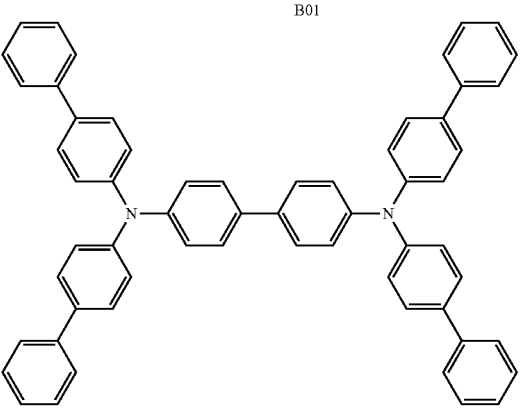
B02

Example 1

A glass substrate (available from Corning Co., Ltd) on which an ITO anode (15 Ohms per square centimeter ($\Omega/cm^2$)) having a thickness of 1,200 Å was formed was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

HT3 was vacuum-deposited on the ITO anode to form a hole transport layer having a thickness of 600 Å, and HT40 was vacuum-deposited on the hole transport layer to form an emission auxiliary layer having a thickness of 250 Å.

Compound H125, Compound H126, and Compound PD01 (first emitter) were vacuum-deposited on the emission auxiliary layer at the weight ratio of 45:45:10 to form an emission layer having a thickness of 300 Å.

Compound ET37 was vacuum-deposited on the emission layer to form a buffer layer having a thickness of 50 Å, and ET46 and LiQ were vacuum-deposited on the buffer layer at the weight ratio of 5:5 to form an electron transport layer having a thickness of 310 Å. Subsequently, Yb was vacuum-deposited on the electron transport layer to form an electron injection layer having a thickness of 15 Å, and then, Ag and Mg were vacuum-deposited thereon to form a cathode having a thickness of 100 Å.

Subsequently, Compound CP04 was vacuum-deposited on the cathode to form a capping layer having a thickness of 700 Å to complete the manufacturing of an organic light-emitting device.

HT3

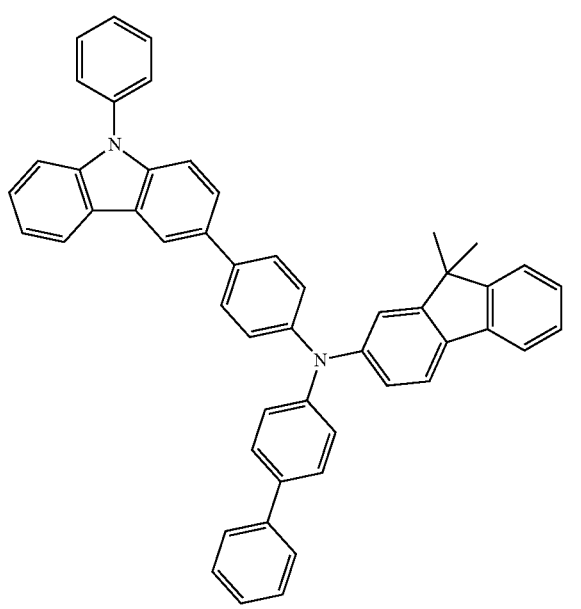

H125

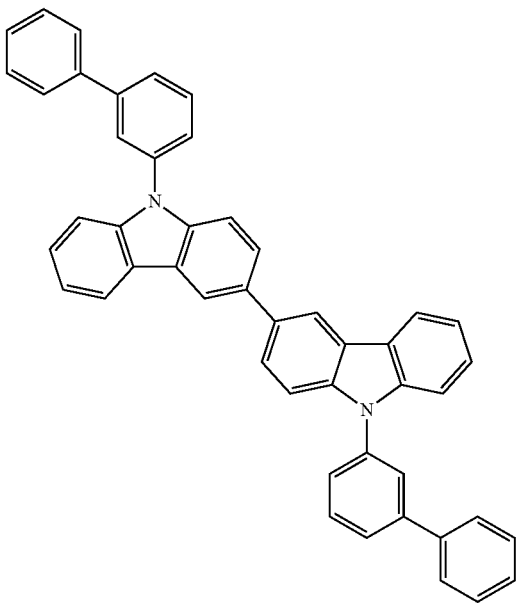

H126

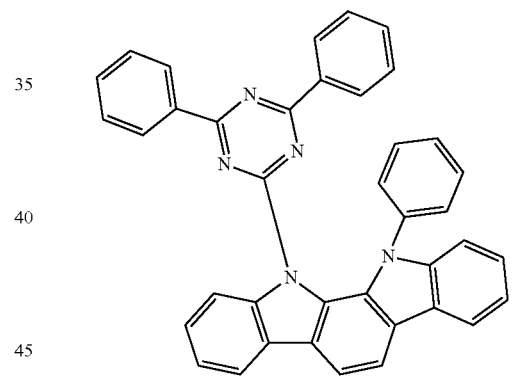

HT40

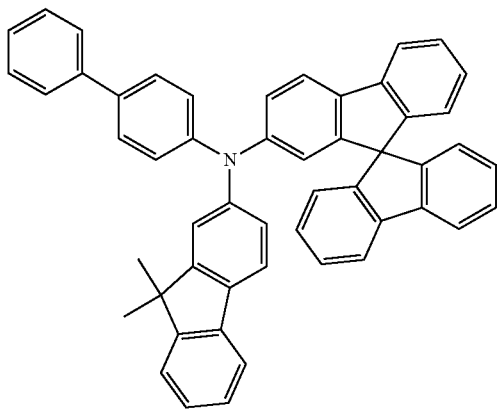

ET37

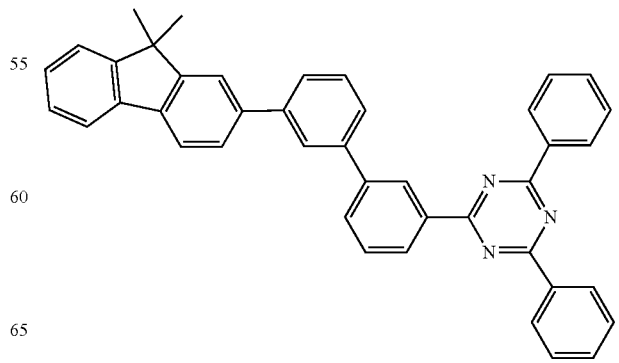

-continued

ET46

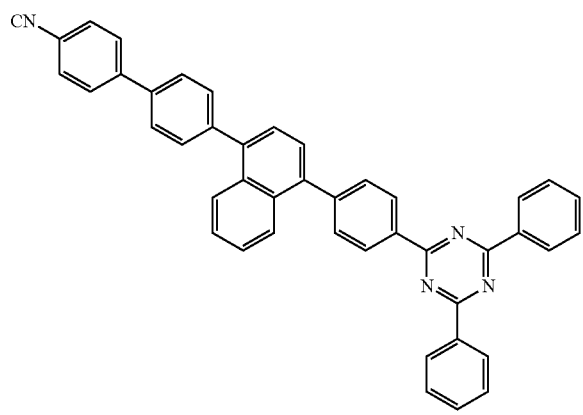

Examples 2 to 8 and Comparative Examples 1 to 6, 8, 9, 11, 12, 14, 15, and 17 to 20

Organic light-emitting devices were manufactured in substantially the same manner as in Example 1, except that each of the compounds shown in Table 5 was used as a material for forming the first emitter in the emission layer or a material for forming the capping layer.

Comparative Examples 7, 10, 13, and 16

Organic light-emitting devices were manufactured in substantially the same manner as in Example 1, except that each of the compound shown in Table 5 was used as a material for forming the first emitter in the emission layer, and the capping layer was not formed.

Evaluation Example 4

The color purity (CIEx and CIEy coordinates) at 400 cd/m$^2$, frontal (0°) luminescence efficiency (cd/A), and lateral (45°) luminescence efficiency (cd/A) of the organic light-emitting devices manufactured according to Examples 1 to 8 and Comparative Examples 1 and 20 were evaluated by using a luminance meter (Minolta Cs-1000A). Results thereof are shown in Tables 6 to 9. Meanwhile, the RCR values calculated with reference to Table 4 are also summarized in Table 5.

TABLE 5

| | First emitter | Material for capping layer | Refractive index of material for capping layer with respect to light having a wavelength of 530 nm | CIEx | CIEy | RCR value |
|---|---|---|---|---|---|---|
| Example 1 | PD01 | CP04 | 1.951 | 0.246 | 0.722 | 37.01 |
| Example 2 | PD01 | CP06 | 2.009 | 0.246 | 0.723 | 35.99 |
| Example 3 | PD05 | CP04 | 1.951 | 0.240 | 0.721 | 36.96 |
| Example 4 | PD05 | CP06 | 2.009 | 0.249 | 0.716 | 35.64 |
| Example 5 | PD07 | CP04 | 1.951 | 0.243 | 0.723 | 37.06 |
| Example 6 | PD07 | CP06 | 2.009 | 0.249 | 0.717 | 35.69 |
| Example 7 | PD09 | CP04 | 1.951 | 0.248 | 0.723 | 37.06 |
| Example 8 | PD09 | CP06 | 2.009 | 0.244 | 0.721 | 35.89 |
| Comparative Example 1 | A01 | B01 | 1.757 | 0.249 | 0.711 | 40.47 |
| Comparative Example 2 | A02 | B01 | 1.757 | 0.245 | 0.707 | 40.24 |
| Comparative Example 3 | A01 | B02 | 1.844 | 0.249 | 0.713 | 38.67 |
| Comparative Example 4 | A02 | B02 | 1.844 | 0.249 | 0.708 | 38.39 |
| Comparative Example 5 | PD01 | B01 | 1.757 | 0.246 | 0.722 | 41.09 |
| Comparative Example 6 | PD01 | B02 | 1.844 | 0.246 | 0.723 | 39.21 |
| Comparative Example 7 | PD01 | — | — | 0.249 | 0.716 | — |
| Comparative Example 8 | PD05 | B01 | 1.757 | 0.240 | 0.721 | 41.04 |
| Comparative Example 9 | PD05 | B02 | 1.844 | 0.240 | 0.716 | 38.83 |
| Comparative Example 10 | PD05 | — | — | 0.245 | 0.707 | — |
| Comparative Example 11 | PD07 | B01 | 1.757 | 0.243 | 0.723 | 41.15 |
| Comparative Example 12 | PD07 | B02 | 1.844 | 0.243 | 0.717 | 38.88 |
| Comparative Example 13 | PD07 | — | — | 0.250 | 0.710 | — |
| Comparative Example 14 | PD09 | B01 | 1.757 | 0.248 | 0.723 | 41.15 |
| Comparative Example 15 | PD09 | B02 | 1.844 | 0.248 | 0.721 | 39.10 |
| Comparative Example 16 | PD09 | — | — | 0.250 | 0.715 | — |
| Comparative Example 17 | A01 | CP04 | 1.951 | 0.249 | 0.711 | 36.44 |
| Comparative Example 18 | A02 | CP04 | 1.951 | 0.245 | 0.707 | 36.24 |
| Comparative Example 19 | A01 | CP06 | 2.009 | 0.249 | 0.711 | 35.39 |
| Comparative Example 20 | A02 | CP06 | 2.009 | 0.245 | 0.708 | 35.24 |

TABLE 6

| | First emitter | Material for capping layer | Frontal (0°) luminescence efficiency (cd/A) | Lateral (45°) luminescence efficiency (cd/A) |
|---|---|---|---|---|
| Example 1 | PD01 | CP04 | 180.1 | 83.7 |
| Example 2 | PD01 | CP06 | 174.7 | 80.9 |
| Comparative Example 1 | A01 | B01 | 150.3 | 86.6 |
| Comparative Example 2 | A02 | B01 | 144.6 | 82.8 |
| Comparative Example 3 | A01 | B02 | 153.1 | 88.5 |
| Comparative Example 4 | A02 | B02 | 147.3 | 84.5 |
| Comparative Example 5 | PD01 | B01 | 151.6 | 75.8 |
| Comparative Example 6 | PD01 | B02 | 153.0 | 76.5 |
| Comparative Example 7 | PD01 | — | 147.7 | 77.0 |
| Comparative Example 17 | A01 | CP04 | 168.7 | 87.7 |
| Comparative Example 18 | A02 | CP04 | 164.2 | 83.7 |
| Comparative Example 19 | A01 | CP06 | 166.2 | 86.4 |

TABLE 6-continued

| | First emitter | Material for capping layer | Frontal (0°) luminescence efficiency (cd/A) | Lateral (45°) luminescence efficiency (cd/A) |
|---|---|---|---|---|
| Comparative Example 20 | A02 | CP06 | 162.4 | 82.8 |

TABLE 7

| | First emitter | Material for capping layer | Frontal (0°) luminescence efficiency (cd/A) | Lateral (45°) luminescence efficiency (cd/A) |
|---|---|---|---|---|
| Example 3 | PD05 | CP04 | 171.4 | 97.6 |
| Example 4 | PD05 | CP06 | 167.1 | 97.5 |
| Comparative Example 1 | A01 | B01 | 150.3 | 86.6 |
| Comparative Example 2 | A02 | B01 | 144.6 | 82.8 |
| Comparative Example 3 | A01 | B02 | 153.1 | 88.5 |
| Comparative Example 4 | A02 | B02 | 147.3 | 84.5 |
| Comparative Example 8 | PD05 | B01 | 144.7 | 88.2 |
| Comparative Example 9 | PD05 | B02 | 145.4 | 88.6 |
| Comparative Example 10 | PD05 | — | 144.8 | 92.1 |
| Comparative Example 17 | A01 | CP04 | 168.7 | 87.7 |
| Comparative Example 18 | A02 | CP04 | 164.2 | 83.7 |
| Comparative Example 19 | A01 | CP06 | 166.2 | 86.4 |
| Comparative Example 20 | A02 | CP06 | 162.4 | 82.8 |

TABLE 8

| | First emitter | Material for capping layer | Frontal (0°) luminescence efficiency (cd/A) | Lateral (45°) luminescence efficiency (cd/A) |
|---|---|---|---|---|
| Example 5 | PD07 | CP04 | 181.7 | 95.6 |
| Example 6 | PD07 | CP06 | 176.8 | 97.9 |
| Comparative Example 1 | A01 | B01 | 150.3 | 86.6 |
| Comparative Example 2 | A02 | B01 | 144.6 | 82.8 |
| Comparative Example 3 | A01 | B02 | 153.1 | 88.5 |
| Comparative Example 4 | A02 | B02 | 147.3 | 84.5 |
| Comparative Example 11 | PD07 | B01 | 154.4 | 88.0 |
| Comparative Example 12 | PD07 | B02 | 155.2 | 88.4 |
| Comparative Example 13 | PD07 | — | 152.1 | 92.1 |
| Comparative Example 17 | A01 | CP04 | 168.7 | 87.7 |
| Comparative Example 18 | A02 | CP04 | 164.2 | 83.7 |
| Comparative Example 19 | A01 | CP06 | 166.2 | 86.4 |
| Comparative Example 20 | A02 | CP06 | 162.4 | 82.8 |

TABLE 9

| | First emitter | Material for capping layer | Frontal (0°) luminescence efficiency (cd/A) | Lateral (45°) luminescence efficiency (cd/A) |
|---|---|---|---|---|
| Example 7 | PD09 | CP04 | 192.0 | 79.9 |
| Example 8 | PD09 | CP06 | 185.6 | 79.3 |
| Comparative Example 1 | A01 | B01 | 150.3 | 86.6 |
| Comparative Example 2 | A02 | B01 | 144.6 | 82.8 |
| Comparative Example 3 | A01 | B02 | 153.1 | 88.5 |
| Comparative Example 4 | A02 | B02 | 147.3 | 84.5 |
| Comparative Example 14 | PD09 | B01 | 161.1 | 75.7 |
| Comparative Example 15 | PD09 | B02 | 161.6 | 75.9 |
| Comparative Example 16 | PD09 | — | 153.4 | 73.8 |
| Comparative Example 17 | A01 | CP04 | 168.7 | 87.7 |
| Comparative Example 18 | A02 | CP04 | 164.2 | 83.7 |
| Comparative Example 19 | A01 | CP06 | 166.2 | 86.4 |
| Comparative Example 20 | A02 | CP06 | 162.4 | 82.8 |

TABLE 9-continued
| First emitter | Material for capping layer | Frontal (0°) luminescence efficiency (cd/A) | Lateral (45°) luminescence efficiency (cd/A) |
|---|---|---|---|
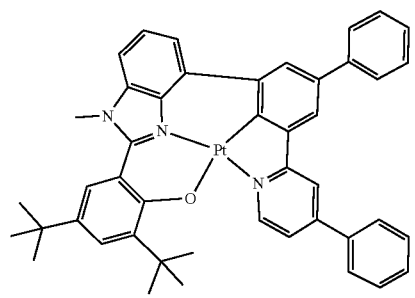
PD01
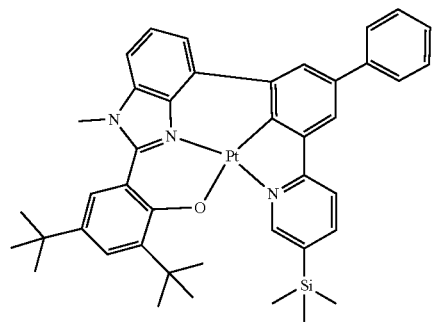
PD05
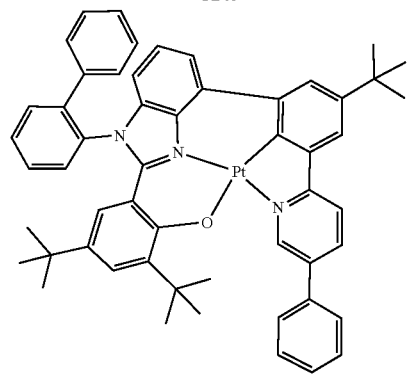
PD07
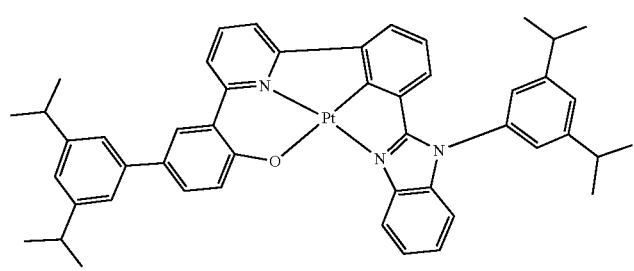
PD09

TABLE 9-continued
| First emitter | Material for capping layer | Frontal (0°) luminescence efficiency (cd/A) | Lateral (45°) luminescence efficiency (cd/A) |
|---|---|---|---|
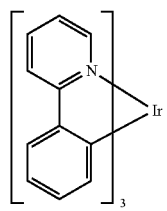
A01
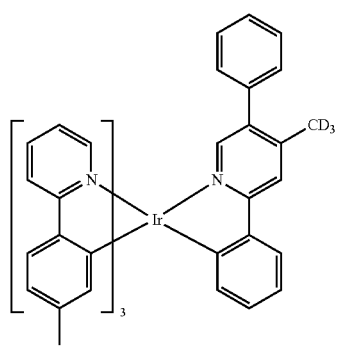
A02
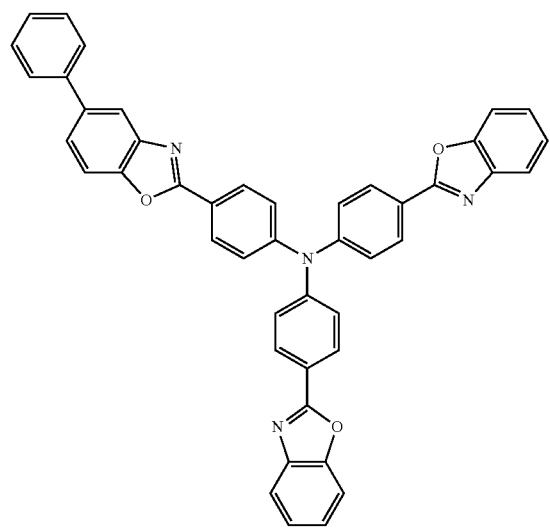
CP04

TABLE 9-continued

| First emitter | Material for capping layer | Frontal (0°) luminescence efficiency (cd/A) | Lateral (45°) luminescence efficiency (cd/A) |
|---|---|---|---|

CP06

B01

B02

1) From Tables 5 and 6, it can be seen that the organic light-emitting devices of Examples 1 and 2 including the first emitter including platinum (emitting green light having a maximum emission wavelength in a range of 520 nm to 550 nm) and having an RCR value of 38 or less, had an equivalent level of lateral luminescence efficiency and improved frontal luminescence efficiency, compared to the organic light-emitting devices of Comparative Examples 1 to 7 and 17 to 20, 2) from Tables 5 and 7, it can be seen that the organic light-emitting devices of Examples 3 and 4 including the first emitter including platinum (emitting green light having a maximum emission wavelength in a range of 520 nm to 550 nm) and having an RCR value of 38 or less, had an equivalent level of lateral luminescence efficiency and improved frontal luminescence efficiency, compared to the organic light-emitting devices of Comparative Examples 1 to 4, 8 to 10 and 17 to 20, 3) from Tables 5 and 8, it can be seen that the organic light-emitting devices of Examples 3 and 4 including the first emitter including platinum (emitting green light having a maximum emission wavelength in a range of 520 nm to 550 nm) and having an RCR value of 38 or less, had an equivalent level of lateral luminescence efficiency and improved frontal luminescence efficiency, compared to the organic light-emitting devices of Comparative Examples 1 to 4, 11 to 13, and 17 to 20, and 4) from Tables 5 and 9, it can be seen that the organic light-emitting devices of Examples 5 and 6 including the first emitter including platinum (emitting green light having a maximum emission wavelength in a range of 520 nm to 550 nm) and having an RCR value of 38 or less, had an equivalent level of lateral luminescence efficiency and improved frontal luminescence efficiency, compared to the organic light-emitting devices of Comparative Examples 1 to 4 and 14 to 20.

Because the light-emitting device of embodiments of the present disclosure has excellent frontal luminescence efficiency and lateral luminescence efficiency at the same time, a high-quality electronic apparatus can be manufactured using the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A light-emitting device comprising:
a first electrode;
a second electrode facing the first electrode;
an interlayer between the first electrode and the second electrode and comprising an emission layer; and
a capping layer,
wherein the emission layer comprises a first emitter,
the first emitter emits a first light having a first emission spectrum,
the capping layer is in a path along which the first light travels,
an emission peak wavelength of the first light is about 520 nm to about 550 nm,
the first emitter comprises platinum,
the capping layer comprises an amine-containing compound, and
a value of a ratio of CIEy to a reflective index (RCR value) of the first light extracted to the outside through the capping layer is 38 or less, and
the RCR value is calculated according to Equation 1:

$$CIEy/R(cap) \times 100 \quad \text{Equation 1}$$

wherein, in Equation 1,
CIEy is a y coordinate value of the CIE color coordinates of the first light extracted to the outside through the capping layer, and
R(cap) is the refractive index of the amine-containing compound with respect to a second light having a wavelength within ±20 nm of the emission peak wavelength of the first light.

2. The light-emitting device of claim 1, wherein an emission peak wavelength of the first light is from about 525 nm to about 545 nm.

3. The light-emitting device of claim 1, wherein a full width at half maximum of the first light is from about 15 nm to about 60 nm.

4. The light-emitting device of claim 1, wherein the first light is a green light.

5. The light-emitting device of claim 1, wherein:
the first emitter further comprises a first ligand bound to the platinum, and
the first emitter satisfies at least one selected from Condition A to Condition C:
Condition A
the first ligand is a tetradentate ligand, and the number of cyclometallated rings formed by the chemical bond between the platinum and the first ligand is three;
Condition B
the platinum is chemically bonded to a carbon, a nitrogen, and an oxygen of the first ligand; and
Condition C
the first ligand comprises an imidazole group, a benzimidazole group, a naphthoimidazole group, or any combination thereof.

6. The light-emitting device of claim 1, wherein the amine-containing compound comprised in the capping layer comprises a benzoxazole group, a benzothiazole group, a naphthooxazole group, a naphthothiazole group, or any combination thereof.

7. The light-emitting device of claim 1, wherein the RCR value of the first light extracted to the outside through the capping layer is from about 32.0 to about 38.0.

8. The light-emitting device of claim 1, wherein CIEy is from about 0.715 to about 0.740.

9. The light-emitting device of claim 1, wherein:
the second light has a wavelength of 530 nm.

10. The light-emitting device of claim 1, wherein:
R(cap) is from about 1.85 to about 2.5.

11. An electronic apparatus comprising the light-emitting device of claim 1.

12. The electronic apparatus of claim 11, wherein a color filter, a color conversion layer, a touch screen layer, a polarizing layer, or any combination thereof.

13. A consumer product, comprising the light-emitting device of claim 1.

14. The consumer product of claim 13, being one selected from a flat panel display, a curved display, a computer monitor, a medical monitor, a TV, a billboard, indoor or outdoor illuminations and/or a signal light, a head-up display, a fully or partially transparent display, a flexible display, a rollable display, a foldable display, a stretchable display, a laser printer, a phone, a cell phone, a tablet, a phablet, a personal digital assistant (PDA), a wearable device, laptop computers, digital cameras, camcorders, viewfinders, micro displays, 3D displays, virtual and/or augmented reality displays, vehicles, a video wall including multiple displays tiled together, a theater or stadium screen, a phototherapy device, and a signage.

15. A light-emitting device comprising:
a first electrode;
a second electrode facing the first electrode;
an interlayer between the first electrode and the second electrode and comprising an emission layer; and
a capping layer,
wherein the emission layer comprises a first emitter,
the first emitter emits first light having a first emission spectrum,
the capping layer is in a path along which the first light travels,
the first emitter comprises platinum and a first ligand bound to the platinum,
the first emitter satisfies at least one selected from Condition A to Condition C:

Condition A the first ligand is a tetradentate ligand, and the number of cyclometallated rings formed by the chemical bond between the platinum and the first ligand is three;

Condition B the platinum is chemically bonded to a carbon, a nitrogen, and an oxygen of the first ligand;

Condition C the first ligand comprises an imidazole group, a benzimidazole group, a naphthoimidazole group, or any combination thereof, wherein the capping layer comprises an amine-containing compound, and the amine-containing compound comprises a benzoxazole group, a benzothiazole group, a naphthooxazole group, a naphthothiazole group, or any combination thereof.

16. The light-emitting device of claim 15, wherein the first emitter satisfies all of Condition A to Condition C.

17. The light-emitting device of claim 15, wherein an emission peak wavelength of the first light is from about 520 nm to about 550 nm.

18. The light-emitting device of claim 15, wherein a full width at half maximum of the first light is about 15 nm to about 60 nm.

19. The light-emitting device of claim 15, wherein the first light is a green light.

20. The light-emitting device of claim 15, wherein:

a refractive index of the amine-containing compound with respect to a second light having a wavelength within ±20 nm of the emission peak wavelength of the first light is from about 1.85 to about 2.5.

* * * * *